United States Patent
Hidaka

(10) Patent No.: US 7,286,431 B2
(45) Date of Patent: Oct. 23, 2007

(54) MEMORY DEVICE CAPABLE OF PERFORMING HIGH SPEED READING WHILE REALIZING REDUNDANCY REPLACEMENT

(75) Inventor: Hideto Hidaka, Hyogo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

(21) Appl. No.: 11/526,753

(22) Filed: Sep. 26, 2006

(65) Prior Publication Data

US 2007/0014172 A1  Jan. 18, 2007

Related U.S. Application Data

(63) Continuation of application No. 11/099,499, filed on Apr. 6, 2005, now Pat. No. 7,126,845, which is a continuation of application No. 10/615,841, filed on Jul. 10, 2003, now Pat. No. 6,894,922.

(30) Foreign Application Priority Data

Sep. 12, 2002 (JP) ............................. 2002-266956
Jan. 17, 2003 (JP) ............................. 2003-009955

(51) Int. Cl.
*G11C 7/02* (2006.01)
(52) U.S. Cl. ................. 365/210; 365/158; 365/189.01; 365/200
(58) Field of Classification Search ................. 365/210, 365/158
See application file for complete search history.

(56) References Cited

U.S. PATENT DOCUMENTS 6,185,143 B1  2/2001  Perner et al.
6,246,616 B1  6/2001  Nagai et al.

(Continued)

FOREIGN PATENT DOCUMENTS

CN  1319846  10/2001

(Continued)

OTHER PUBLICATIONS

R. Scheuerlein et al. "A 10ns Read and Write Non-Volatile Memory Array Using a Magnetic Tunnel Junction and FET Switch in Each Cell", 2000 IEEE ISSCC Digest of Technical Papers, TA7.2, Feb. 2000, pp. 94-95, 128-129, 409-410.

(Continued)

*Primary Examiner*—Thong Q. Le
(74) *Attorney, Agent, or Firm*—Buchanan Ingersoll & Rooney PC

(57) ABSTRACT

When normal bit lines BL3 and /BL3 are selected, spare bit lines SBL2 and /SBL2 are simultaneously selected, so that column select gates are placed in such a manner that these bit line pairs are connected to respective different read data bus pairs. The column select gates are distributed in placement so as not to cause a great difference in load capacitance between read data buses. A redundancy determination result is reflected on read data by activation of control signals φ1 and φ2 given immediately prior to a sense amplifier. Note that two sense amplifier may be provided with control signals φ1 and φ2 so as to select the outputs of one sense amplifier. With such a configuration adopted, it is possible to provide a memory device capable of performing high speed reading while realizing a redundancy replacement.

6 Claims, 34 Drawing Sheets

U.S. PATENT DOCUMENTS

| | | |
|---|---|---|
| 6,577,530 B2 | 6/2003 | Muranaka et al. |
| 6,614,682 B2 | 9/2003 | Hirai |
| 6,650,583 B2 * | 11/2003 | Haraguchi et al. .......... 365/201 |
| 6,678,187 B2 | 1/2004 | Sugibayashi et al. |
| 6,724,651 B2 | 4/2004 | Hirai |
| 6,760,244 B2 | 7/2004 | Yamada |
| 6,822,897 B2 * | 11/2004 | Ishikawa .................... 365/171 |

FOREIGN PATENT DOCUMENTS

| | | |
|---|---|---|
| CN | 1349226 A | 5/2002 |
| CN | 1349226 A | 5/2005 |

OTHER PUBLICATIONS

M. Durlam et al., "Nonvolatile RAM based on Magnetic Tunnel Junction Elements", 2000 IEEE ISSCC Digest of Technical Papers, TA 7.3, pp. 96-97, 130-131, 410-411.

P.K. Naji et al., "A 256kb 3.0V 1T1MTJ Nonvolatile Magnetoresistive RAM", 2001 IEEE ISSCC Digest of Technical papers, TA7.6, Feb. 2001, pp. 94-95, 122-123, 404-405.

Chinese Office Action, with English-language translation, dated Jan. 12, 2007.

* cited by examiner

FIG.8

| SELECTED COLUMN | USED DATA BUS | SELECTED SPARE COLUMN | USED DATA BUS | SPARE/NORMAL |
|---|---|---|---|---|
| CSL01 CSL02 | RDB1, /RDB1 | SCSL0 | RDB2, /RDB2 | φ1:NORMAL SELECTION φ2:SPARE SELECTION |
| CSL11 CSL12 | RDB2, /RDB2 | SCSL1 | RDB1, /RDB1 | φ1:SPARE SELECTION φ2:NORMAL SELECTION |

FIG.14

| SELECTED COLUMN | USED DATA BUS | SELECTED SPARE COLUMN | USED DATA BUS | SPARE/NORMAL |
|---|---|---|---|---|
| CSL1 | RDB1,/RDB1 RDB2,/RDB2 | SCSL1 | RDB3,/RDB3 | φ1+φ2: NORMAL SELECTION φ3+φ2: SPARE SELECTION |
| CSL2 | RDB3,/RDB3 RDB4,/RDB4 | SCSL2 | RDB1,/RDB1 | φ3+φ4: NORMAL SELECTION φ1+φ4: SPARE SELECTION |

MEMORY DEVICE CAPABLE OF PERFORMING HIGH SPEED READING WHILE REALIZING REDUNDANCY REPLACEMENT

CROSS REFERENCE TO RELATED APPLICATIONS

This application is a continuation of application Ser. No. 11/099,499, filed on Apr. 6, 2005, now U.S. Pat. No. 7,126,845, which in turn is a continuation of application Ser. No. 10/615,841, filed on Jul. 10, 2003 now U.S. Pat. No. 6,894,922.

BACKGROUND OF THE INVENTION

1. Field of the Invention

The present invention relates to a memory device, and more particularly to a redundancy architecture capable of performing a high speed operation of a magnetic random access memory (MRAM).

2. Description of the Background Art

An MRAM (Magnetic Random Access Memory) device has received attention as a memory device capable of performing high speed non-volatile data storage. An MRAM device is a memory device using a plurality of thin film magnetic elements formed on a semiconductor integrated circuit to perform non-volatile data storage, and being capable of performing a random access to each of the thin film magnetic elements.

It is reported that, especially in recent years, performance of an MRAM device has dramatically progressed by using thin film magnetic elements utilizing a magnetic tunnel junction (MTJ) as memory cells.

As for MRAM devices including memory cells each having a magnetic tunnel junction, disclosures are found in the following literatures 1 to 3:

Literature 1: "A 10 ns Read and Write Non-Volatile Memory Array Using a Magnetic Tunnel Junction and FET Switch in each Cell" (USA) reported by Roy Scheuerlein and other 6 colleagues, 2000 IEEE ISSCC Digest of Technical Papers, TA7.2) pp. 128 to 129;

Literature 2: "Nonvolatile RAM based on Magnetic Tunnel Junction Elements" (USA) reported by M. Durlam and other 5 colleagues, 2000 IEEE ISSCC Digest of Technical Papers, TA7.3) pp. 130 to 131; and Literature 3: "A 256 kb 3.0V 1T1MTJ Nonvolatile Magnetoresistive RAM" (USA) reported by Peter K. Naji and other 4 colleagues, 2001 IEEE ISSCC Digest of Technical Papers, TA7. 6) pp. 122 to 123.

FIG. 36 is a schematic diagram showing a configuration of a memory cell having a conventional magnetic tunnel junction (hereinafter, simply referred to as "MTJ memory cell").

Referring to FIG. 36, an MTJ memory cell includes a tunneling magneto-resistance element TMR changing an electric resistance according to a storage data level, and an access element ATR for forming a path of a sensing current Is passing through tunneling magneto-resistance element TMR in data reading. Access element ATR is typically formed of a field effect transistor. In the following description, therefore, access element ATR is also referred to as an access transistor ATR. Access transistor ATR is coupled between tunneling magneto-resistance element TMR and a fixed potential (ground potential Vss).

Arranged to a MTJ memory cell are: a write word line WWL for instructing data writing; a read word line RWL for performing data reading; and a bit line BL which is data line for transmitting an electric signal corresponding to a data level of storage data in data reading and data writing. Note that write word line WWL is also referred to as a digit line DL.

FIG. 37 is a conceptual view for describing a data read operation from an MTJ memory cell.

Referring to FIG. 37, tunneling magneto-resistance element TMR includes a ferromagnetic material layer having a fixed prescribed magnetic direction (hereinafter, also simply referred to as "fixed magnetic layer") FL, and a ferromagnetic material layer to magnetized in a direction corresponding to a magnetic field applied externally hereinafter, also simply referred to as "free magnetic layer") VL. A tunneling barrier (a tunneling film) TB made of a dielectric film is provided between fixed magnetic layer FL and free magnetic layer VL. Free magnetic layer VL is magnetized either in the same direction as fixed magnetic layer FL or in the opposite direction thereto according to storage data to be written. A magnetic tunnel junction is formed from fixed magnetic layer FL, tunneling barrier TB and free magnetic layer VL.

In data reading, access transistor ATR becomes conductive in response to activation of read word line RWL. Thereby, a sensing current Is can be caused to flow from bit line BL into a current path leading to grounded node through tunneling magneto-resistance element TMR and access transistor ATR.

An electric resistance of tunneling magneto-resistance element TMR varies depending on the relative relation in magnetic direction, parallel or anti-parallel, of free magnetic layer VL with respect to fixed magnetic layer FL. To be concrete, an electric resistance of tunneling magneto-resistance element TMR is lower when a magnetic direction of fixed magnetic layer FL and a magnetic direction of free magnetic layer VL are parallel to each other than when being anti-parallel.

Therefore, if free magnetic layer VL is magnetized in a direction corresponding to storage data, a change in voltage generated across tunneling magneto-resistance element TMR caused by sensing current Is is different according to a storage data level. Accordingly, data can be read if a prescribed voltage is applied to a memory cell to detect a change in sensing current Is according to data stored in the memory cell with a current detection type sense amplifier in reading the memory cell data. Furthermore, for example, storage data of an MTJ memory cell can be read by detecting a voltage of bit line BL if sensing current Is is caused to flow in tunneling magneto-resistance element TMR after bit line BL is precharged at a prescribed potential.

FIG. 38 is a conceptual view describing a data write operation on a MTJ memory cell.

Referring to FIG. 38, in data writing, read word line RWL is deactivated, in response to which access transistor ATR becomes non-conductive. In this state, a data write current for magnetizing free magnetic layer VL in a direction corresponding to write data is caused to flow through write word line WWL and bit line BL. A magnetic direction of free magnetic layer VL is determined by a magnetic field H (BL) generated by the data write current flowing through bit line BL.

FIG. 39 is a conceptual graph describing a relationship between a data write current in data writing into an MTJ memory cell and a magnetic direction of a tunneling magneto-resistance element.

Referring to FIG. 39, the abscissa H (EA) shows a magnetic field applied in the direction of the easy axis (EA) in free magnetic layer VL in tunneling magneto-resistance element TMR. On the other hand, the ordinate H (HA) shows a magnetic field acting in the direction of the hard axis in free magnetic layer VL. Magnetic fields H (EA) and H (HA) correspond to respective magnetic fields generated by currents flowing bit line BL and write word line WWL, respectively.

In an MTJ memory cell, a magnetic direction fixed in fixed magnetic layer FL is along the easy axis of free magnetic layer VL and free magnetic layer VL is magnetized along the easy axis direction in parallel or anti-parallel to the fixed magnetic direction according to a level of storage data ("1" or "0"). In the following description of this specification, electrical resistance values of tunneling magneto-resistance element TMR corresponding to the respective two kinds of magnetic directions of free magnetic layer VL are indicated as R1 and R0 (where R1>R0). An MTJ memory cell can store 1 bit data ("1" or "0") correspondingly to such respective magnetic directions of free magnetic layer VL.

A magnetic direction of free magnetic layer VL can be newly rewritten only when the sum of applied magnetic fields H (EH) and H (HA) reaches a point in the outside region of an asteroid characteristic curve shown in the figure. That is, in a case where an applied data write magnetic field is of a strength corresponding to a point in the inside region of the asteroid characteristic curve, no change occurs in a magnetic direction of free magnetic layer VL.

As shown in the asteroid characteristic curve, by applying a magnetic field in a hard axis direction to free magnetic layer VL, reduction can be realized in threshold strength of a magnetic field along the easy axis direction necessary for changing a magnetic direction.

In a case where an operating point in data writing is designed as shown in the example of FIG. 39, the design is performed so that a data write magnetic field in the easy axis direction in an MTJ memory cell is $H_{WR}$ in strength. That is, a value of a data write current caused to flow through bit line BL or write word line WWL is designed so as to obtain data write magnetic field $H_{WR}$. In general, data write magnetic field $H_{WR}$ is indicated by the sum of a switching magnetic field $H_{SW}$ necessary for change-over of a magnetic direction and a margin $\Delta H$. That is, $H_{WR}=H_{SW}+\Delta H$.

It is necessary to cause a data write current equal to or more than a prescribed level to flow through write word line WWL and bit line BL both in order to rewrite storage data in an MTJ memory cell, that is a magnetic direction of tunneling magneto-resistance element TMR. By doing so, free magnetic layer VL in tunneling magneto-resistance element TMR is magnetized in parallel or anti-parallel to a magnetic direction of fixed magnetic layer FL according to a direction of a data write magnetic field along the easy axis (EA). A magnetic direction written at a time in tunneling magneto-resistance element TMR, that is storage data in an MTJ memory cell, is held in a non-volatile fashion during a period till new data writing is performed.

An electric resistance of tunneling magneto-resistance element TMR, in such a way, is changed by an applied data write magnetic field according to a rewritable magnetic direction. Non-volatile data storage can be performed by relating two-way magnetic directions of free magnetic layer VL in tunneling magneto-resistance element TMR to respective levels of stored data ("1" and "0").

MRAM enables a higher speed access as compared with a non-volatile memory such as a flash memory. Its possibility of a high speed access entails a problem of degradation of the possible speed, however, in a case where it has a redundancy architecture. That is, an access time is extended by a time required for redundancy determination to determine whether or not an input address is an address to be replaced with a redundant cell in an address comparing circuit.

As for a solution for the problem, it is considered, for example, to perform a simultaneous parallel access to a normal memory cell and a spare memory cell in data reading. In MRAM, however, a value of a read current is small since a resistance value of a memory cell is as high as tens of kΩ. For example, in MRAM, a voltage as low as on the order of 0.5 V is applied to a memory cell in reading of memory cell data to detect a change of several μA in read current of the order of 20 μA according to data stored in the memory cell with a current detection type sense amplifier.

In this situation, the following two points are problematic. First, access performance becomes deteriorated in case of a large resistance value of a current path through which a read current of a selected memory cell flows, especially a large electric resistance of a source line of the memory cell. Second, since in parallel access, simultaneous read operations are performed on a plurality of memory cells, a problem of an electric resistance of the source line becomes more conspicuous.

SUMMARY OF THE INVENTION

The present invention has been made in order to solve such problems. It is an object of the present invention to provide a memory device with a redundancy architecture capable of a high, stable speed operation.

The present invention is, to summarize, directed to a memory device including: a plurality of normal memory cells; a plurality of spare memory cells; a plurality of bit lines; a read amplifying circuit; a plurality of data lines; and a connecting circuit.

The plurality of spare memory cells are used instead of a defective memory cell when the defective memory exists in the plurality of normal memory cells. The plurality of bit lines are used for reading data from the plurality of normal memory cells. The read amplifying circuit reads data from the plurality of normal memory cells and the plurality of spare memory cells. The plurality of data lines are used for connecting the plurality of bit lines to the read amplifying circuit. The connecting circuit forms parts of paths connecting the plurality of data lines to the plurality of normal memory cells and the plurality of spare memory cells so as to substantially equalize load capacitance of the plurality of data lines. The connecting circuit not only connects a first selected bit line among the plurality of bit lines to be selected according to a first input address to a first data line among the plurality of data lines, but also forms parts of paths that connect a part of the plurality of spare memory cells to be selected according to the first input address to a second data line different from the first data line among the plurality of data lines; and not only connects a second selected bit line among the plurality of bit lines to be selected according to a second input address to the second data line, but also forms parts of paths that connect a part of the plurality of spare memory cells to be selected according to the second input address to the first data line.

According to another aspect of the present invention, the present invention is directed to a memory device including: a plurality of memory cells; a read amplifying circuit; and a current path forming section.

The plurality of memory cells store information by a change in electric resistance value. The read amplifying circuit performs parallel data reading on a plurality of selected memory cells selected simultaneously among the plurality of memory cells. The current path forming section forms a plurality of read current paths corresponding to the plurality of selected memory cells respectively between the read amplifying circuit to a supply source of a power supply potential. The plurality of read current paths are equal to each other substantially in physical length.

According to still another aspect of the present invention, the present invention is directed to a memory device including: a memory cell array; and a read amplifying circuit. The memory cell array includes: a plurality of normal memory cells storing information by a change in electrical resistance; spare memory cells arranged in an array of rows and columns together with the plurality of normal memory cells, placed in a central portion in the memory cell array, and each used instead of a defective memory cell when the defective memory cell exists among the plurality of normal memory cells; a plurality of bit lines, placed along the column direction of the memory cell array, and for causing data read currents to the plurality of normal memory cells; a spare bit line, placed along the column direction, and for causing a data read current into the spare memory cells; a plurality of data lines transmitting data read currents flowing in a part of the plurality of bit lines and a data read current flowing in the spare bit line; and a connecting gate circuit, not only connecting a selected bit line among the plurality of bit lines to be selected according to a data read command to one of the plurality of data lines, but also connecting the spare bit line to another one of the plurality of data lines. The read amplifying circuit receives data read currents transmitted by the plurality of data lines to read data in the plurality of normal memory cells and the spare memory cell.

According to yet another aspect of the present invention, the present invention is directed to a memory device including: a memory cell array; and a read amplifying circuit.

The memory cell array includes: a plurality of memory cells storing information by a change in electric resistance value; a plurality of source lines provided on paths through which read currents for reading data from the plurality of memory cells; dummy cells, arranged in a array of rows and columns together with the plurality of memory cells, placed in a central portion of the memory cell array, and holding reference values for discriminating data in the plurality of memory cells; dummy source lines provided on paths through which reference currents for reading the reference values in dummy cells flow; and a plurality of data lines transmitting the read currents and the reference currents. The read amplifying circuit receives read currents and reference currents transmitted by the plurality of data lines to read data in the plurality of memory cells.

According to yet another aspect of the present invention, the present invention is directed to a memory device including: a plurality of memory cells; a read amplifying circuit; and a current path forming section.

The plurality of memory cells storing information by a change in respective electric resistance; and the read amplifying circuit performs parallel data reading from a plurality of selected memory cells selected simultaneously among the plurality of memory cells. The current path forming section forms a plurality of read current paths respectively corresponding to the plurality of selected memory cells between the read amplifying circuit and a supply source of a power supply potential. The plurality of read current paths are separated from each other at least in the memory cell array.

According to yet another aspect of the present invention, the present invention is directed to a memory device including: a plurality of normal memory cells; a plurality of normal bit lines; a plurality of first reference memory cells; a plurality of spare memory cells; a plurality of spare bit lines; a plurality of second reference memory cell; and a read circuit. The plurality of normal memory cells include electrically conductive magnetic elements, respectively. The plurality of normal bit lines are provided correspondingly to columns of the plurality of normal memory cells. The plurality of first reference memory cells are connected to the plurality of normal bit lines with one-to-one correspondence. Each of the plurality of spare memory cells is used instead of a defective memory cell when the defective memory cell exists in the plurality of normal memory cells. The plurality of spare bit lines are provided correspondingly to the plurality of columns of the spare memory cells. The plurality of second reference memory cells are connected to the plurality of spare bit lines with one-to-one correspondence. The read circuit is connected to four bit lines including a first bit line to which a memory cell to be read is connected, a second bit line selected from the plurality of normal bit lines other than the first bit line, a third bit line to which a spare memory cell corresponding to the memory cell to be read is connected and a fourth bit line selected from the plurality of spare bit lines other than the third bit line according to the address signal and to generate a reference value for data reading through synthesis from first and second reference memory cells connected to the second and fourth bit lines, respectively.

According to yet another aspect of the present invention, the present invention is directed to a memory device including: a plurality of normal memory cells; a plurality of normal bit lines; a plurality of first reference memory cells; a first reference bit line; a plurality of spare memory cells; a plurality of spare bit lines; and a read circuit. The plurality of normal memory cells includes respective electrically conductive magnetic elements. The plurality of normal bit lines are provided correspondingly to the plurality of columns of the plurality of normal memory cells. The plurality of first reference memory cells are provided on a column placed in parallel with the plurality of columns of the plurality of normal memory cells. The first reference bit line is provided correspondingly to the columns of the plurality of first reference memory cells. Each of the plurality of spare memory cells is used instead of a defective memory cell when the defective memory cell exists in the plurality of normal memory cells. The plurality of spare bit lines are provided correspondingly to the plurality of columns of the plurality of spare memory cells. The read circuit is connected to at least three bit lines including a first bit line of the plurality of normal bit lines to which a memory cell to be read is connected, a second bit line to which a spare memory cell corresponding to the memory cell to be read is connected and the first reference bit line according to the address signal to read data from one of the memory cell to be read and the spare memory cell corresponding to the memory cell to be read.

According to yet another aspect of the present invention, the present invention is directed to a memory device including: an electrically conductive magnetic element in each memory cell thereof provided with a plurality of word lines; a plurality of bit line pairs; a plurality of memory cells; a first reference memory cell; a first data line pair; and a read circuit. The plurality of bit line pairs are provided so as to intersect with the plurality of word lines and each include a first and second bit lines. The plurality of memory cells are provided correspondingly to only one of the first and second bit lines at each of a plurality of intersections between the plurality of word lines and the plurality of bit line pairs. The first reference memory cell holds a reference value used when data in the plurality of memory cells is read. The first data line pair includes first and second data lines for transmitting data read onto the plurality of bit line pairs When the read circuit reads data in the plurality of memory cells through one of the first and second data lines from one of first and second bit lines by activation of one of the plurality of word lines, the read circuit reads a hold value in the first reference memory cell from the other of the first and second data lines.

Therefore, a main advantage of the present invention is to minimize imbalances in parasitic capacitance between a plurality of read data buses to improve a read margin and an access time.

Another advantage of the present invention is to minimize fluctuations in electric resistance of read current paths in a case where data of a plurality of bits is simultaneously read, thereby enabling a read margin and an access time to be improved.

Still another advantage of the present invention is to enable a difference in electric resistance between a read current path for a normal memory cell and a read current path for a spare memory cell to be restricted to a small value, thereby enabling a read margin and an access time to be improved.

Yet another advantage of the present invention is to enable a difference in electric resistance between a read current path for a normal memory cell and a reference current path for a dummy memory cell to be restricted to a small value, thereby enabling a read margin and an access time to be improved.

Yet another advantage of the present invention is to enable an influence of electric resistance of a read current path to be reduced when simultaneous reading of a plurality of data because of separation of a plurality of read current paths from each others in a memory cell array.

Yet another advantage of the present invention is not only to realize a high speed access but also to generate a correct reference level by a simple and convenient dummy memory cells.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a table for describing control signals of a memory cell array 10 and a read/write circuit 9 shown in FIG. 2;

FIG. 14 is a table showing a decoding relationship of control signals of the configuration shown in FIG. 13;

DESCRIPTION OF THE PREFERRED EMBODIMENTS

Detailed description will be given of embodiments of the present invention below with reference to the accompanying drawings. Note that the same symbols indicate the same or corresponding constituents.

First Embodiment

Figure 1:
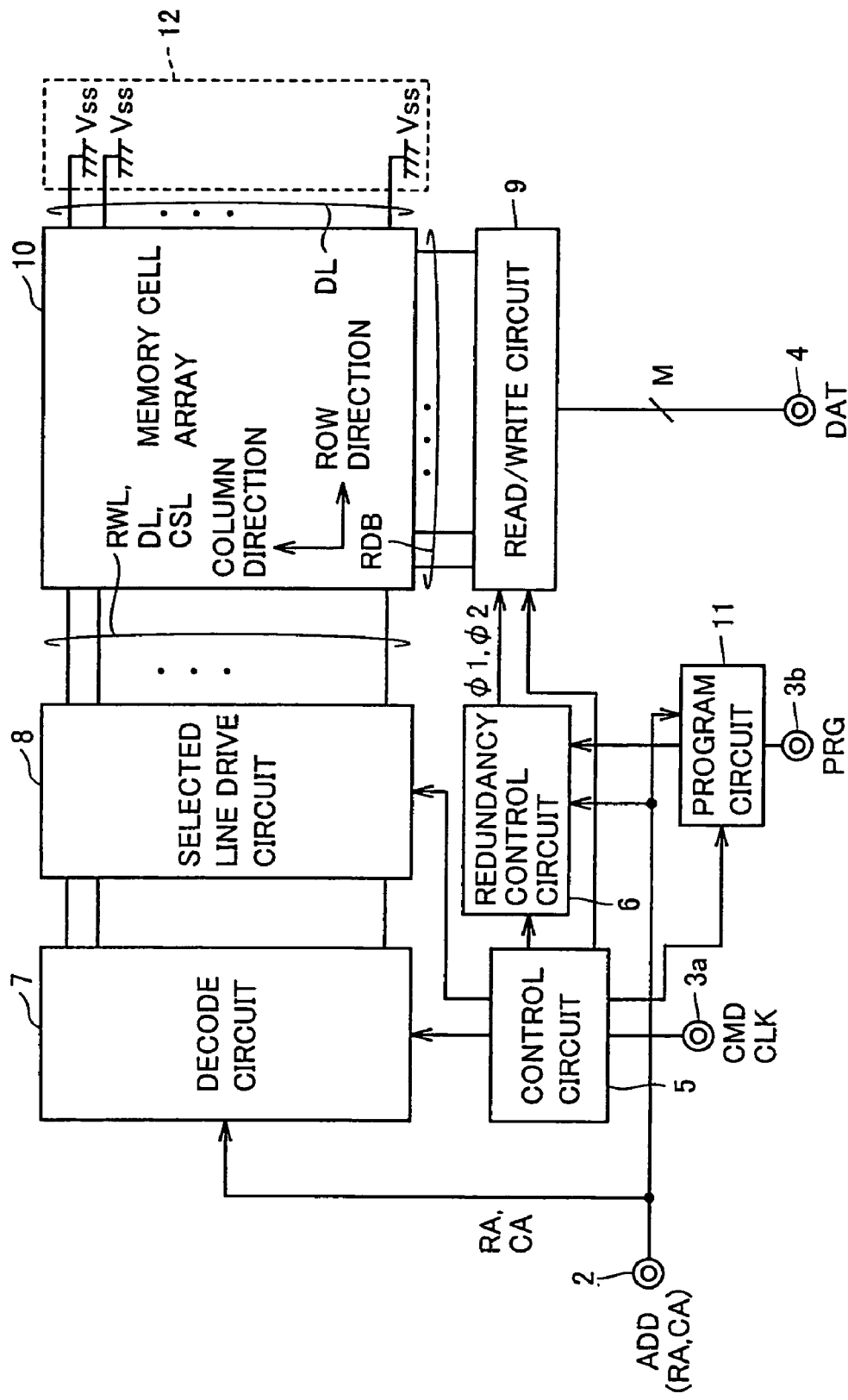
FIG. 1 is a schematic block diagram showing an overall architecture of an MRAM device 1 of a first embodiment of the present invention.

FIG. 1 is a schematic block diagram showing an overall architecture of an MRAM device 1 of a first embodiment of the present invention.

Referring to FIG. 1, MRAM device 1 performs supply/reception of a data signal DAT of M bits (wherein M is a natural number) according to a control signal CMD and an address signal ADD from outside. A data read operation and a data write operation in MRAM device 1 are performed at timings in synchronization with, for example, a clock signal CLK from outside. Alternatively, operation timings may be internally determined without receiving dock signal CLK from outside.

MRAM device 1 includes: an address terminal 2 receiving an input of address signal ADD; a signal terminal 3a receiving inputs of control signal CAD and dock signal CLK; a signal terminal 3b receiving an input of a program signal PRG activated in a program operation; and a data terminal 4 performing supply/reception of data signal DAT of M bits.

MRAM device 1 further includes: a control circuit 5 for controlling all the operations of MRAM device 1 in response to control signal CMD and dock signal CLK; and a memory cell array 10 having therein a plurality of MTJ memory cells arranged in an array of rows and columns.

Memory cell 10, of which detailed description will be given later, includes: a plurality of normal MTJ memory cells, each selectable by address signal ADD, and arranged in rows and columns (hereinafter also referred to as a normal cell each); and a spare memory cell for repairing a normal cell in which a defect occurs (hereinafter also referred to as a defective memory cell).

A plurality of digit line DL for performing row selection in writing and a plurality of read word line RWL for performing row selection in reading are provided correspondingly to respective rows of MTJ memory cells (hereinafter also referred to simply as a memory cell row each). Furthermore, column select lines CSL for performing column selection is provided in memory cell array 10. Data reading from memory cell array 10 is performed through read data buses RDB.

MRAM device 1 further includes: a decode circuit 7, a selected line drive circuit 8; a read/write circuit 9; a redundancy control circuit 6; and a program circuit 11.

Decode circuit 7 performs row selection and column selection based on a row address RA and a column address CA, respectively, designated by address signal ADD. Selected line drive circuit 8 controls activation of read word line RWL, digit line DL, column select line CSL and other select lines according to results of row selection and column selection in decode circuit 7. Digit lines DL are coupled to ground potential Vss in a region 12 on the opposite side of memory cell array 10 as viewed from the side on which selected drive circuit 8 is placed.

Program circuit 11 stores a defect address indicating a defective memory cell as program information in a non-volatile manner. A defect address is inputted through, for example, address terminal 2 from outside in program data writing in which program signal PRG is activated. Reading of a defect address from program circuit 11 is performed according to a command from control circuit 5.

Redundancy control circuit 6 compares an address designated by address signal ADD and a defect address held in program circuit 11 with each other in an ordinary operation to detect whether or not the addresses coincide with each other. Redundancy control circuit 6 performs redundancy determination showing whether or not the defective cell has been selected as a data read object or a data write object, based on a result of the comparison. Redundancy control circuit 6 generates a redundancy control signals φ1 and φ2 reflecting a redundancy determination result.

In decode circuit 7 and selected line drive circuit 8, row selection and column selection according to address signal ADD are performed without awaiting the redundancy determination result. That is, a high speed operation can be realized in a MRAM device having a redundancy architecture by starting address select operations in data reading and data writing in parallel on a normal memory cell and a spare memory cell.

Read/write circuit 9 performs repair of a defective memory cell by selecting a proper read data bus of a plurality of read data buses RDB according to redundancy control signals φ1 and φ2.

Figure 2:
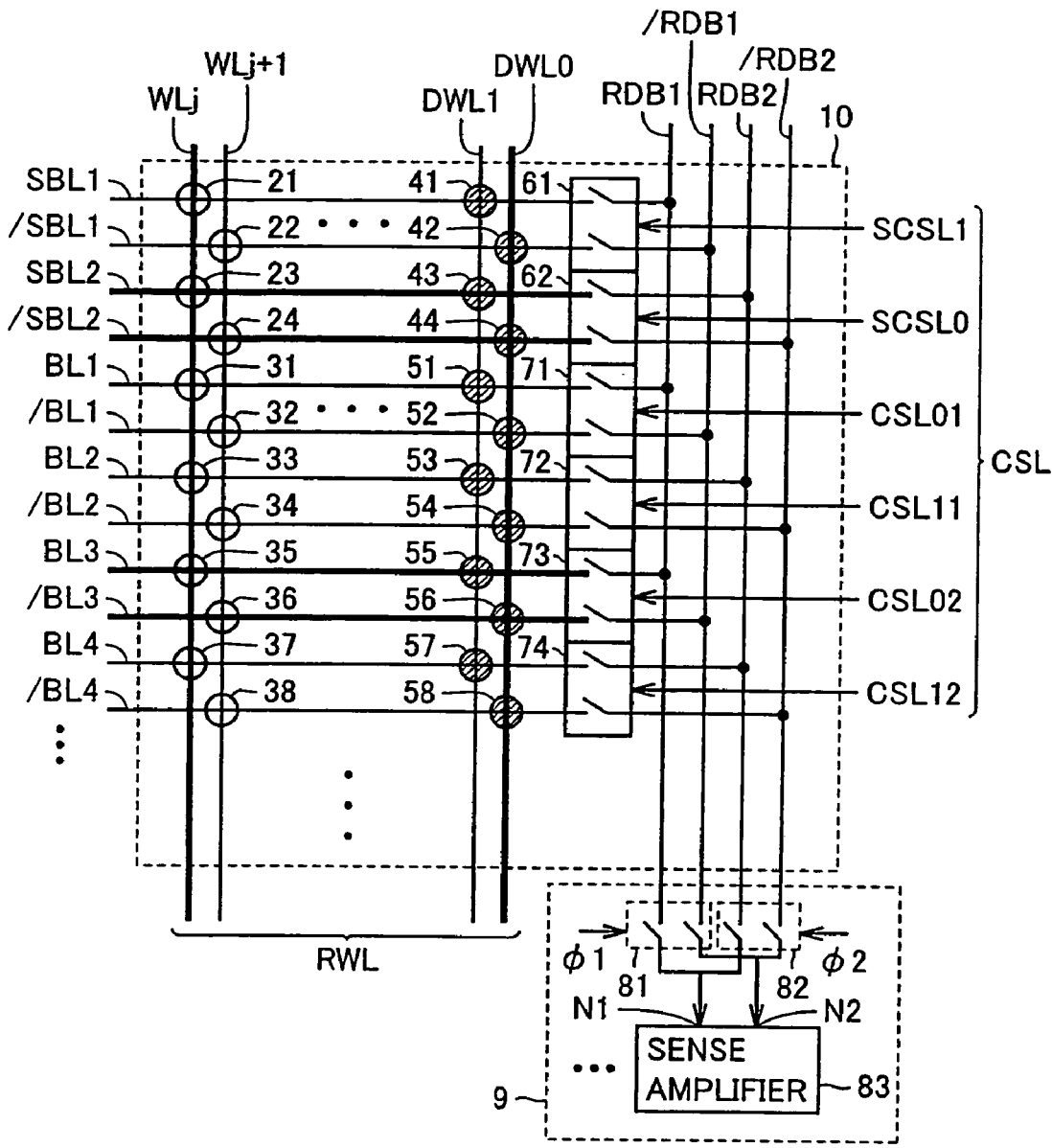
FIG. 2 is a circuit diagram showing a configuration of a memory cell array 10 and a configuration concerning reading of a read/write circuit 9 in FIG. 1.

FIG. 2 is a circuit diagram showing a configuration of memory cell array 10 and a configuration concerning reading of read/write circuit 9 in FIG. 1.

Referring to FIG. 2, memory cell array 10 includes: read word lines RWL; spare bit lines SBL1, /SBL1, SBL2, /SBL2 provided while intersecting word lines RWL; and bit lines BL1 to BL4 and /BL1 to /BL4 provided while intersecting word lines RWL and in parallel with spare bit lines SBL1 and SBL2. Word lines RWL includes: word lines WLj, WLj+1, ... and dummy word lines DWL1 and DWL0. Word lines WLj and WLj+1, ... are word lines selecting memory cells for data holding, while dummy word lines DWL1 and DWL0 are word lines selecting dummy memory cells holding reference values for performing data discrimination in reading data held in a memory cell for data holding.

Memory cell array 10 further includes: spare memory cells 21 to 24, normal cells 31 to 38; spare dummy memory cells 41 to 44 and dummy memory cells 51 to 58.

Spare memory cells 21 and 23 and normal memory cells 31, 33, 35 and 37 are connected commonly to word line WLj and further connected to spare bit lines SBL1 and SBL2 and bit lines BL1, BL2, BL3 and BL4, respectively.

Spare memory cells 22 and 24 and normal memory cells 32, 34, 36 and 38 are connected to common word line WLj+1 and further connected to spare bit lines /SBL1, /SBL2, and bit lines /BL1, /BL2, /BL3 and /BL4, respectively.

Spare dummy memory cells 41 and 43 and dummy memory cells 51, 53, 55 and 57 are connected to a common dummy word line DWL1 and further connected to spare bit lines SBL1 and SBL2 and bit lines BL1, BL2, BL3 and BL4, respectively.

Spare dummy memory cells 42 and 44 and dummy memory cells 52, 54, 56 and 58 are connected to a common dummy word line DWL1 and further connected to spare bit lines /SBL1 and /SBL2 and bit lines /BL1, /BL2, /BL3 and /BL4, respectively.

Memory cell array 10 further includes: read data buses RDB1, /RDB1, RDB2 and /RDB2 and column select gates 61 to 62 and 71 to 74.

Column select gate 61 connects spare bit lines SBL1 and /SBL1 to respective read data buses RDB1 and /RDB1 according to select signal SCSL1. Column select gate 62 connects spare bit lines SBL2 and /SBL2 to respective read data buses RDB2 and /RDB2 according to select signal SCSL0.

Column select gate 71 connects bit lines BL1 and /BL1 to respective read data buses RDB1 and /RDB1 according to select signal CSL01. Column select gate 72 connects bit lines BL2 and /BL2 to respective read data buses RDB2 and /RDB2 according to select signal CSL11. Column select gate 73 connects bit lines BL3 and /BL3 to respective read data buses RDB1 and /RDB1 according to select signal CSL02. Column select gate 74 connects bit lines BL4 and /BL4 to respective read data buses RDB2 and /RDB2 according to select signal CSL12.

Read/write circuit 9 includes connecting gates 81 and 82; and a sense amplifier 83. Connecting gate 81 connects read data bus RDB1 to an input node N1 of sense amplifier 83 and read data bus /RDB1 to an input node N2 thereof according to redundancy control signal φ1. Connecting gate 82 connects read data bus RDB2 to an input node N1 of sense amplifier 83 and read data bus /RDB12 to an input node N2 thereof according to redundancy control signal φ2.

Note that digit lines DLj and DLj+1 activated in data writing, though not shown in order to avoid complexity of FIG. 2, are placed in parallel and adjacent to respective word line WLj and WLJ+1.

Figure 3:
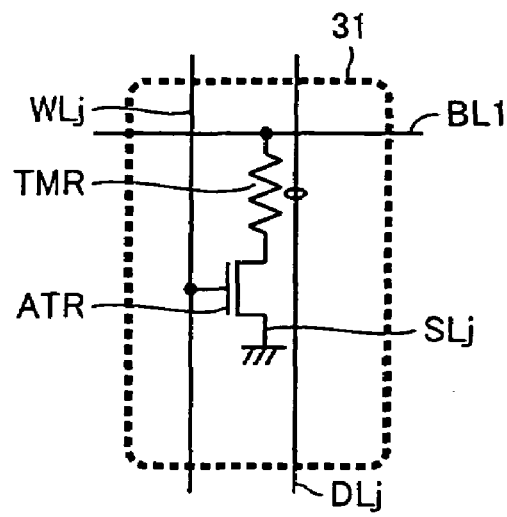
FIG. 3 is a circuit diagram showing a configuration of a memory cell 31 in FIG. 2.

FIG. 3 is a circuit diagram showing a configuration of memory cell 31 in FIG. 2.

Referring to FIG. 3, memory cell 31 includes: a tunneling magneto-resistance element TMR one end of which is connected to bit line BL1; and an access transistor ATR, provided between the other end of tunnel magneto-resistance TMR and a source line SLj, and the gate of which is connected to word line WLj. Digit line DLj activated for select memory cell 31 in data writing, though not shown in FIG. 2, is placed adjacent to tunnel magneto-resistance TMR and in parallel to word line WLj.

Note that spare memory cells 21 to 24 and normal memory cells 32 to 38 of FIG. 2 each have the same configuration; therefore, none of descriptions thereof is repeated.

Figure 4:
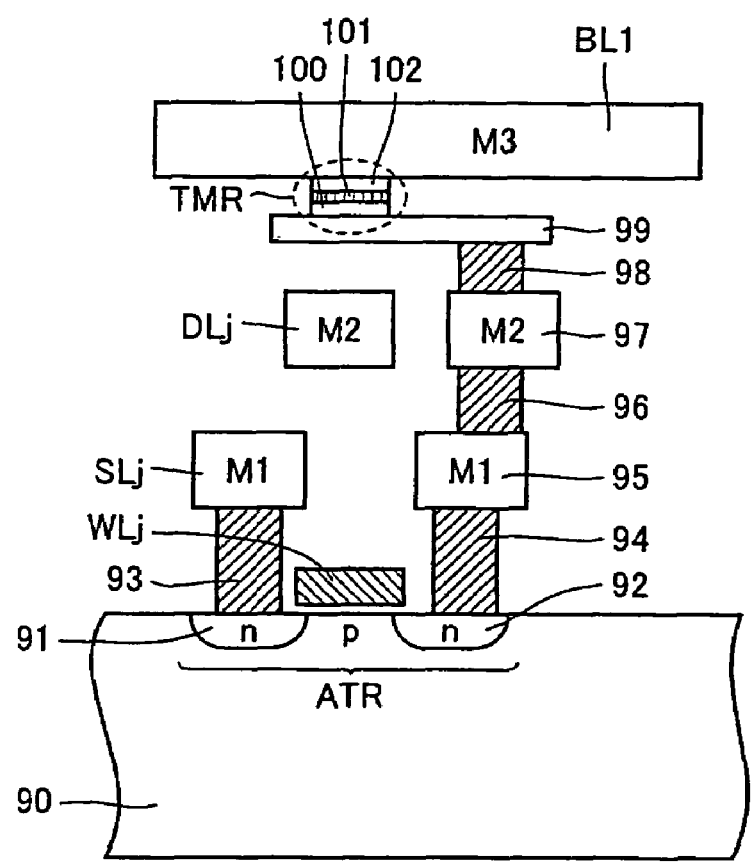
FIG. 4 is a sectional view showing a first example of a structure of the memory cell in FIG. 3.

FIG. 4 is a sectional view showing a first example of a structure of the memory cell in FIG. 3.

Referring to FIG. 4, n-type impurity regions 91 and 92 are formed on a semiconductor substrate 90 and word line WLj is formed on a region between n-type impurity regions 91 and 92. N-type impurity regions 91 and 92 serve as source/drains and word line WLj serves a gate electrode, thereby, forming access transistor ATR.

Source line SLj is formed above n-type impurity region 91 using a metal interconnection layer as a first layer and source line SLj and n-type impurity region 91 are connected to each other by a plug 93 formed in a contact hole.

A conductive layer 95 is formed using the metal interconnection layer as the first layer above n-type impurity region 92 and conductive layer 95 and n-type impurity region 92 are connected to each other by a plug 94 formed in a contact hole.

Digit line DLj and conductive layer 97 are formed using a metal interconnection layer as a second layer. Conductive layer 97 is connected to conductive layer 95 by a plug 96 formed in a contact hole. A conductive layer 99 is formed above digit line DLj and conductive layer 97, and conductive layer 99 is connected to conductive layer 97 by a plug 98 formed in a contact hole. Tunneling magneto-resistance element TMR is formed above conductive layer 99 at a closest location to digit line DL1 and bit line BL1 is formed using a third metal interconnection layer so as to sandwich tunneling magneto-resistance element TMR between conductive layer 99 and bit line BL1.

Tunneling magneto-resistance element TMR includes: a ferromagnetic layer 100 having a fixed prescribed magnetic direction; a tunneling barrier 101 made of a dielectric film; and a ferromagnetic layer (free magnetic layer) 102 magnetized in a direction corresponding to an externally applied magnetic field.

Figure 5:
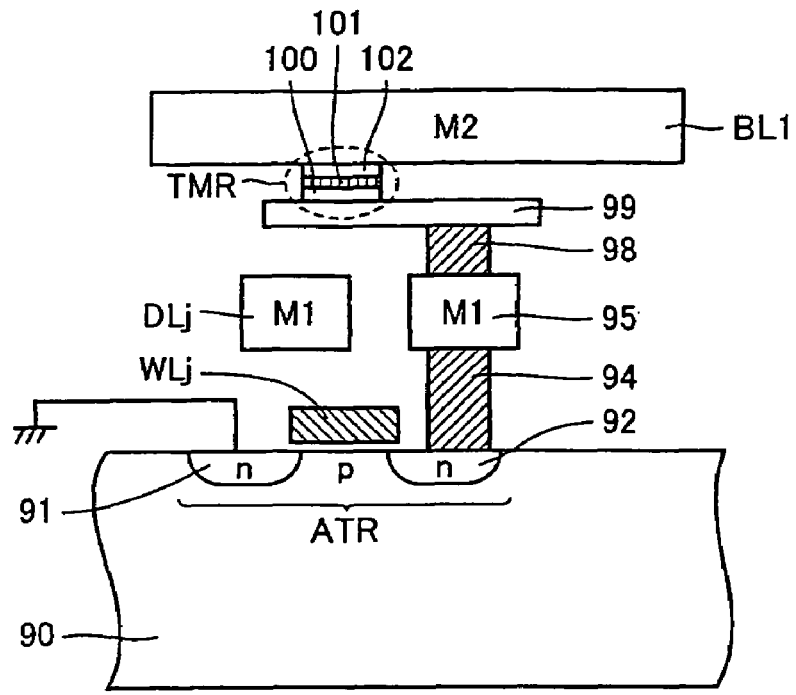
FIG. 5 is a sectional view showing a second example of a structure of the memory cell in FIG. 3.

FIG. 5 is a sectional view showing a second example of a structure of the memory cell in FIG. 3.

A structure shown in FIG. 5 is different from the structure in FIG. 4 in that n-type impurity region 91 in the structure shown in FIG. 4 serves as a source line transmitting the ground potential and digit line DLj made of the second metal interconnection layer in FIG. 4 is made of the first metal interconnection layer. Hence, bit line BL1 made of the third metal interconnection layer in FIG. 4 is made of the second metal interconnection layer in FIG. 5. With such a structure adopted, though a resistance value of the source line increases, only 2 metal interconnection layers are required, resulting in a merit that a fabrication process can be shortened than the first example.

Figure 6:
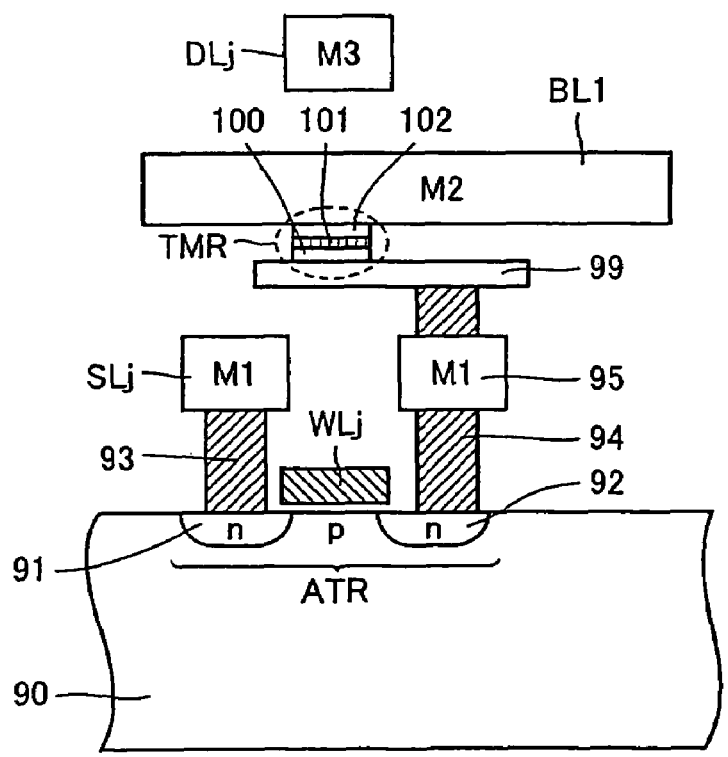
FIG. 6 is a sectional view showing a third example of a structure of the memory cell in FIG. 3.

FIG. 6 is a sectional view showing a third example of a structure of the memory cell in FIG. 3.

A structure shown in FIG. 6 is different from the structure in FIG. 4 in that a digit line made of the second interconnection layer in the structure shown in FIG. 4 is made of the third interconnection layer. Hence, conductive layer 99 is formed above the first metal interconnection layer and bit line BL1 is provided thereabove with the second interconnection layer so as to sandwich TMR between conductive layer 99 and bit line BL1.

Figure 7:
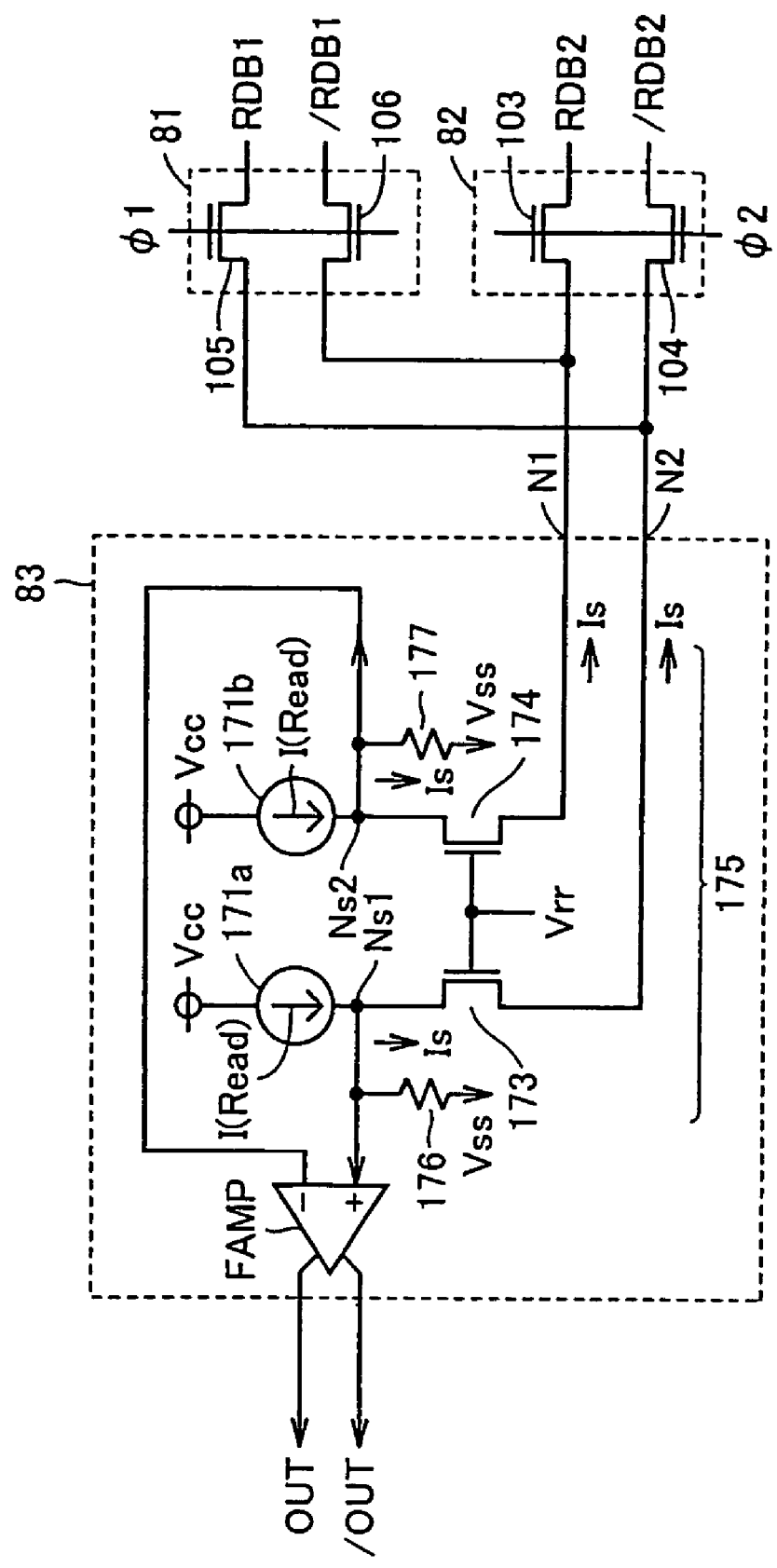
FIG. 7 is a circuit diagram showing example configurations of a sense amplifier 83, and connecting gates 81 and 82 in FIG. 2.

FIG. 7 is a circuit diagram showing example configurations of sense amplifier 83, and connecting gates 81 and 82 in FIG. 2.

Referring to FIG. 7, sense amplifier 83 includes: a sensing current supply section 175 and a read amplifier FAMP.

Sensing current supply section 175 includes: constant current supply circuits 171a and 171b receiving a power supply voltage Vcc to supply a constant current I (Read) to respective nodes Ns1 and Ns2; an N-channel MOS transistor 173 connected between nodes Ns1 and Ns2; an N-channel MOS transistor 174 connected between nodes Ns2 and N1; and resistors 176 and 177 pulling down nodes Ns1 and Ns2 to ground potential Vss. A reference potential Vrr is given to the gates of respective MOS transistors 173 and 174. Potentials at nodes N1 and N2 are kept at prescribed constant potential by giving reference potential Vrr thereto.

Connecting gates 81 includes: an N-channel MOS transistor 105 connected between read data bus RDB1 and node N2, and receiving redundancy control signal φ1 at the gate thereof; and an N-channel MOS transistor 106 connected between read data bus /RDB1 and node N1, and receiving redundancy control signal φ1 at the gate thereof.

Connecting gates 82 includes: an N-channel MOS transistor 103 connected between read data bus RDB2 and node N1, and receiving redundancy control signal φ2 at the gate thereof; and an N-channel MOS transistor 104 connected between read data bus /RDB2 and node N2, and receiving redundancy control signal φ2 at the gate thereof.

Read amplifier FAMP amplifies a potential difference arising between nodes Ns1 and Ns2 to output signals OUT and /OUT.

FIG. 8 is a table for describing control signals of a memory cell array 10 and a read/write circuit 9 shown in FIG. 2.

Referring FIGS. 2 and 8, bit lines form a pair, for example, as in BL1 and /BL1. If a bit line connected to a memory cell to be read from is defined as a read bit line, a bit line forming a pair with the read bit line is a reference bit line (a dummy bit line). A reference bit line is connected to a corresponding dummy memory cell.

In memory cell data reading, a memory cell row-selected by activation of word line WLj is connected to a bit line precharged to the ground potential. In company with word line WLj, dummy word line DWL0 is activated. Thereby, dummy cells are connected to reference lines forming pairs with read bit lines to which memory cells 21, 23, 31, 33, 35 and 37 are connected. Note that when a word line WLj+1 is activated, dummy word line DWL1 is activated. In this case, bit lines to which memory cells 22, 24, 32, 34, 36 and 38 are connected are read bit lines and bit lines forming pairs therewith are reference bit lines.

In company with activation of a word line and a dummy word line, a read bit line column-selected by a column select line CSL2 and a reference bit line are connected to respective read data bus pairs RDB1 and /RDB1 or RDB2 and /RDB2 and data is detected by sense amplifier 83 to output.

As shown in FIG. 8, not only is a bit line pair of a selected column connected to one of data line pairs, but one pair corresponding to a selected column of two pairs of spare bits is selected to connected to the other data line pair.

To be concrete, as shown in the upper cell row of FIG. 8, when control signals CSL01 or CSL02 are activated, data buses used by a selected column are RDB1 and /RDB1. At this time, column signal SCSL0 is activated, column select gate 62 becomes conductive and a spare bit line pair SBL2 and /SBL2 as a selected spare column are selected. The selected spare column at this time uses data buses RDB2 and /RDB2. In read/write circuit 9, data line selection is performed in the input section of sense amplifier 83 by redundancy control signals φ1 and φ2 reflecting a redundancy determination result. When control signal SCSL0 is activated, normal selection is performed by redundancy control signal φ1, while spare selection is performed by redundancy control signal φ2.

In FIG. 2, word line WLj and dummy word line DWL0 are activated, control signals CSL02 and control signal SCSL0 are activated and there is shown a state in which a selected column and a selected spare column have been selected, the selected word line and selected bit line are shown with thick lines.

On the other hand, as shown in the lower cell row of FIG. 8, when a selected column has been selected by control signals CSL11 or CSL12, a data bus used by the selected column is read data buses RDB2 and /RDB2. At this time, to designate a selected spare column, column signal SCSL1 is activated. Data buses used by the selected spare column is read data buses RDB1 and /RDB1. In this case, spare selection is performed by redundancy control signal φ1, while normal selection is performed by redundancy control signal φ2. Redundancy control circuit 60 in FIG. 1 determines whether redundancy control signal φ1 indicates normal selection or spare selection with a inputted address and compares the inputted address and an address held in program circuit 11 with each other to activate one of redundancy control signals φ1 and φ2.

With such an architecture adopted, parallel selection operations are performed on a spare column and a normal column and data of one column is eventually read by sense amplifier 83. With parallel selection performed, a higher access speed can be realized.

Furthermore, since column select gates are uniformly provided to respective read data buses, parasitic capacitance due to column gates can be equalized between read data buses. Therefore, no imbalance arises in parasitic capacitance between read current paths each constituted of a bit line pair and a read data bus pair, thereby enabling correct reading to be performed.

Figure 9:
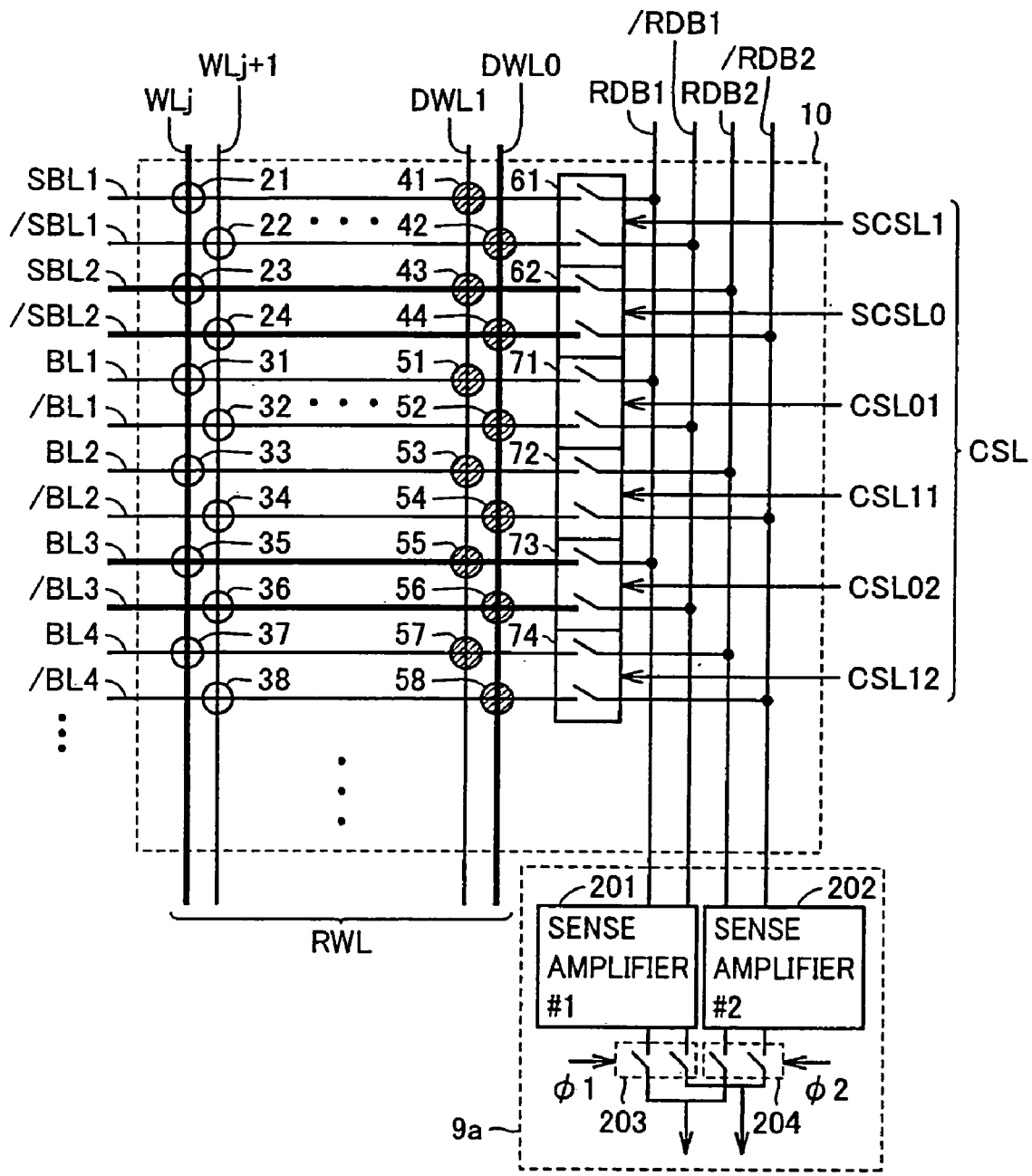
FIG. 9 is an example modification of memory cell array 10 to which a read/write circuit 9a, which is an example modification of read/write circuit 9 shown in FIG. 2 is applied.

FIG. 9 is an example modification of memory cell array 10 to which a read/write circuit 9a, an example modification of read/write circuit 9 shown in FIG. 2, is applied.

Referring to FIG. 9, read/write circuit 9a includes: sense amplifiers 201 and 202; and connecting gates 203 and 204.

Sense amplifier 201 detects a difference between currents flowing in a memory cell and a dummy memory cell connected to respective read data buses RDB1 and /RDB1. Sense amplifier 202 detects a difference between currents flowing in a memory cell and a dummy memory cell connected to respective read data buses RDB2 and /RDB2.

Since configurations of sense amplifiers 201 and 202 are similar to that of sense amplifier 83 shown in FIG. 7, neither of descriptions thereof is repeated.

Connecting gate 203 selects an output of sense amplifier 202 in response to activation of redundancy control signal φ1. Connecting gate 204 selects an output of sense amplifier 202 in response to activation of redundancy control signal φ2. Read/write circuit 9a outputs an output of sense amplifier selected by one of redundancy control signals φ1 and φ2 as a read result.

In the configuration shown in FIG. 9, data of a normal memory cell and data of a spare memory cell are read in parallel by sense amplifiers 201 and 202. After sensing operations in the sense amplifiers, selection of read data is performed by redundancy select signals φ1 and φ2 reflecting a redundancy determination result to select data corresponding to normal data or spare data to be selected and to transmit the selected data to the next stage.

In the configuration shown in FIG. 9 as well, there is an advantage of no imbalance in load capacitance between read data buses connected to sense amplifiers.

Figure 10:
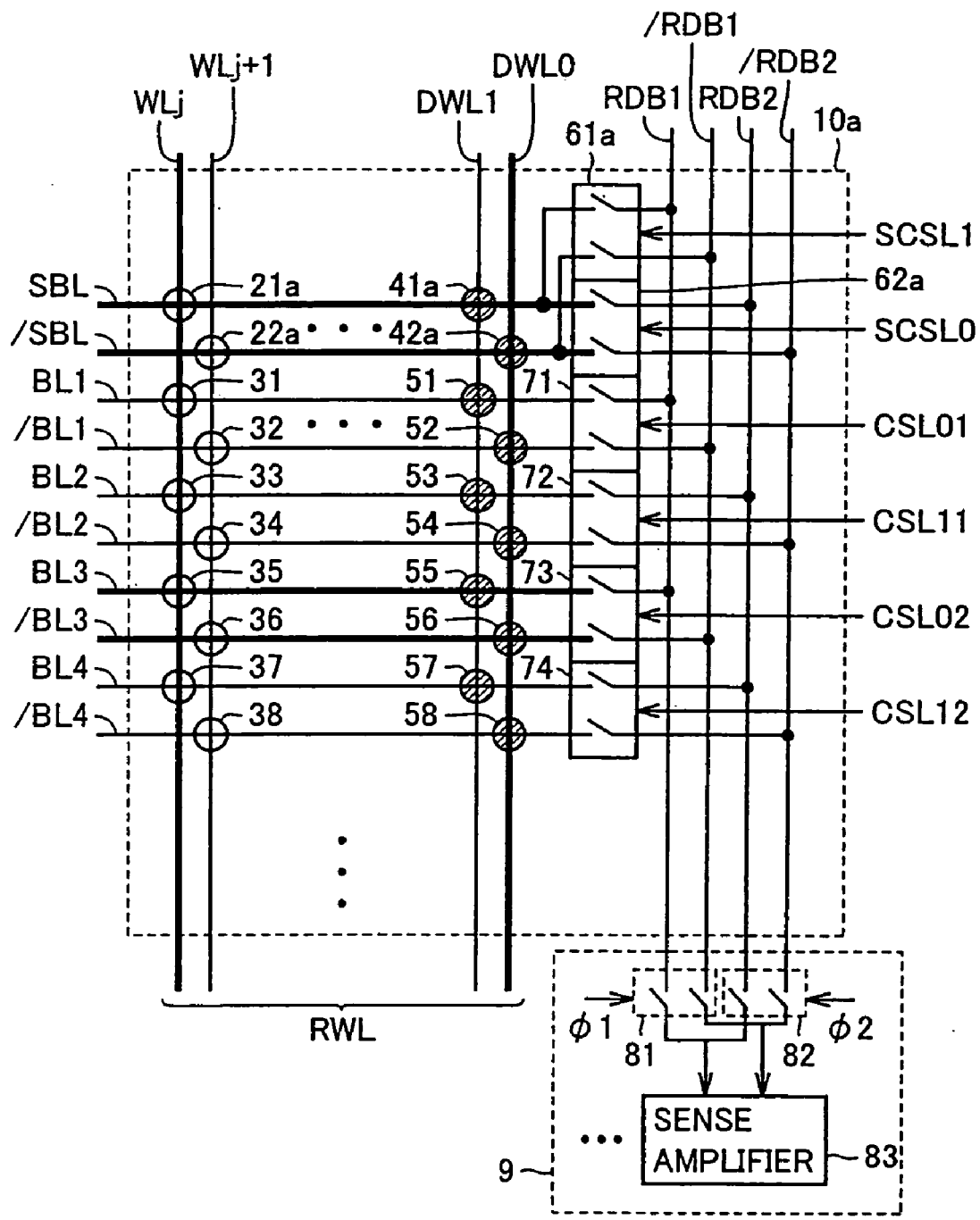
FIG. 10 is a circuit diagram showing a configuration of a memory cell array 10a, which is a first example modification of memory cell array 10.

FIG. 10 is a circuit diagram showing a configuration of a memory cell array 10a, which is a first example modification of memory cell array 10.

Referring to FIG. 10, in the configuration of memory cell array 10 described in FIG. 2, spare bit lines SBL and /SBL are incorporated instead of spare bit lines SBL1, /SBL1, SBL2 and /SBL2 in FIG. 2. Furthermore, spare memory cells 21a and 22a are incorporated instead of spare memory cells 21 to 24 in FIG. 2 and further, spare dummy memory cells 41a and 42a are incorporated instead of spare dummy memory cells 41 to 44 in FIG. 2. Moreover, column select gates 61a and 62a is incorporated instead of column gates 61 and 62 in FIG. 2.

The other parts of the configuration of memory cell array 10a are similar to corresponding parts of the configuration of memory cell array 10 shown in FIG. 2, therefore, none of descriptions thereof is repeated.

Spare memory cell 21a is connected to word line WLj and spare bit line SBL. Spare memory cell 22a is connected to word line WLj+1 and spare bit line /SBL. Spare dummy memory cell 41a is connected to dummy word line DWL1 and spare bit line SBL. Spare dummy memory cell 42a is connected to dummy word line DWL0 and spare bit line /SBL.

Column select gate 61a connects spare bit lines SBL and /SBL to respective read data buses RDB1 and /RDB1 in response to activation of control signal SCSL1. Column select gate 62a connects spare bit lines SBL and /SBL to respective read data buses RDB2 and /RDB2 in response to activation of control signal SCSL0.

By doing so, even with decrease in number of spare bit lines, there can be realized a memory cell with a reduced imbalance in parasitic capacitance between read data buses.

Note that while in FIG. 10, there is shown read/write circuit 9 performing a data reading with a sense amplifier through a selected read data bus, read/write circuit 9a shown in FIG. 9 may be used instead.

Figure 11:
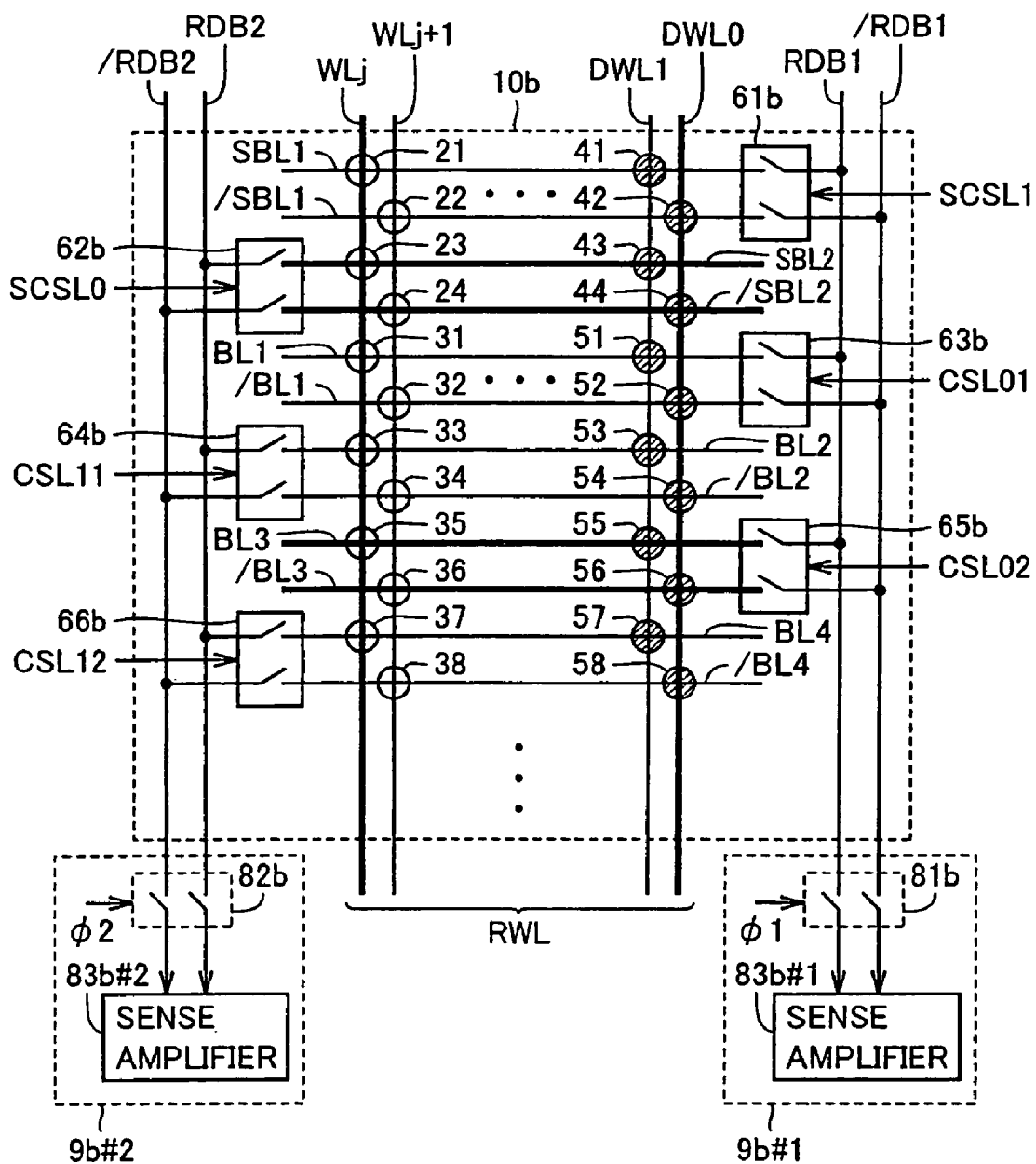
FIG. 11 is a circuit diagram showing a configuration of a memory cell array 10b, which is a second example modification of memory cell array 10.

FIG. 11 is a circuit diagram showing a configuration of a memory cell array 10b, which is a second example modification of memory cell array 10.

Referring to FIG. 11, memory cell array 10b is different from memory cell array 10 described in FIG. 2 in that read data buses RDB2 and /RDB2 are arranged in a different way in FIG. 11. That is, in FIG. 11, read data bus RDB2 and /RDB2 are placed at opposite positions to respective read data buses RDB1 and /RDB1 so as to sandwich a memory cell and a dummy memory cell therebetween. According to a change in arrangement of read data buses, column select gates 61b, 63b and 65b are placed near read data buses RDB1 and /RDB1 between corresponding bit line pair and read data buses. On the other hand, column select gates 62b, 64b and 66b are placed near read data buses RDB2 and /RDB2 between corresponding bit line pair and read data buses RDB2 and /RDB2.

A read/write circuit 9b#1 is provided correspondingly to read data buses RDB1 and /RDB1. Read/write circuit 9b#1 includes: a connecting gate 81b and a sense amplifier 83b#1. Connecting gate 81b becomes conductive according to redundancy control signal φ1 to connect read data buses RDB1 and /RDB1 to input nodes of sense amplifier 83b#1.

A read/write circuit 9b#2 is provided correspondingly to read data buses RDB2 and /RDB2. Read/write circuit 9b#2 includes: a connecting gate 82b and a sense amplifier 83b#2. Connecting gate 82b becomes conductive according to redundancy control signal φ2 to connect read data buses RDB2 and /RDB2 to input nodes of sense amplifier 83b#2.

Since configurations of sense amplifiers 83b#1 and 83b#2 are similar to the configuration of sense amplifier 83 shown in FIG. 7, neither of descriptions thereof is repeated.

By placing read data buses on both sides of a bit line pair and column select gates alternately on the left and right sides of bit line pairs in such a way, a layout pitch of column gates is doubled. Thereby, an advantage is enjoyed that a restraint on pitches of a memory cell array is alleviated.

Figure 12:
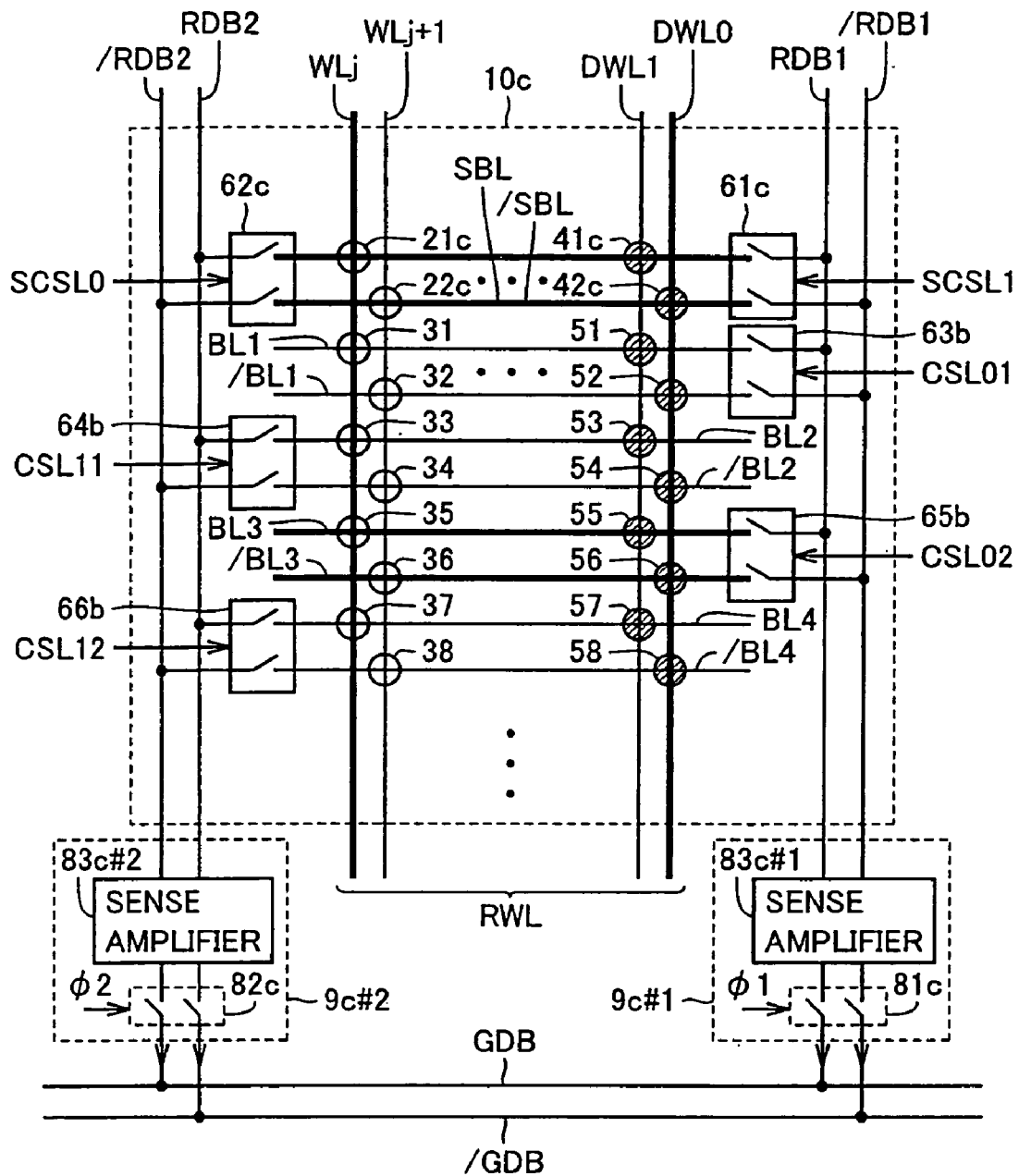
FIG. 12 is a circuit diagram showing a configuration of a memory cell array 10c, which is a third example modification of memory cell array 10.

FIG. 12 is a circuit diagram showing a configuration of a memory cell array 10c, which is a third example modification of memory cell array 10.

Referring to FIG. 12, memory cell array 10c is configured so that in the configuration of memory cell array shown in FIG. 11, spare bit lines SBL and /SBL are incorporated instead of spare bit lines SBL1, SBL2, /SBL1 and /SBL2. Furthermore, spare memory cells 21c and 22c are incorporated instead of spare memory cells 21 to 24 and spare dummy memory cells 41c and 42c are incorporated instead of spare dummy memory cells 41 to 44. Moreover, column select gates 61c and 62c are provided at both ends of spare bit lines SBL and /SBL. Column select gate 61c connect bit lines SBL and /SBL to respective read data buses RDB1 and /RDB1 in response to activation of select signal SCSL1. Column select gate 62c connect spare bit lines SBL and /SBL to respective read data buses RDB2 and /RDB2 in response to activation of select signal SCSL0. With such a configuration adopted, parallel reading on a spare memory cell and a normal memory cell is enabled even in a case where there is one pair of spare bit lines.

Read/write circuits 9c#1 and 9c#2 are provided corresponding to memory cell array 10c.

Read/write circuit 9c#1 includes: a sense amplifier 83c#1 detecting a difference in current between a memory cell and a dummy memory cell connected to read data buses RDB1 and /RDB1 to perform data reading; and connecting gate 81c becoming conductive in response to redundancy control signal φ1 to transmit outputs of sense amplifier 83c#1 to global data buses GDB and /GDB.

Read/write circuit 9c#2 includes: a sense amplifier 83c#2 detecting a difference in current between a memory cell and a dummy memory cell connected to read data buses RDB2 and /RDB2 to perform data reading; and connecting gate 81c becoming conductive in response to redundancy control signal φ2 to transmit outputs of sense amplifier 83c#2 to global data buses GDB and /GDB.

Since configurations of sense amplifiers 83c#1 and 83c#2 is similar to the configuration of sense amplifier 83 shown in FIG. 7, neither of descriptions thereof is repeated.

Figure 13:
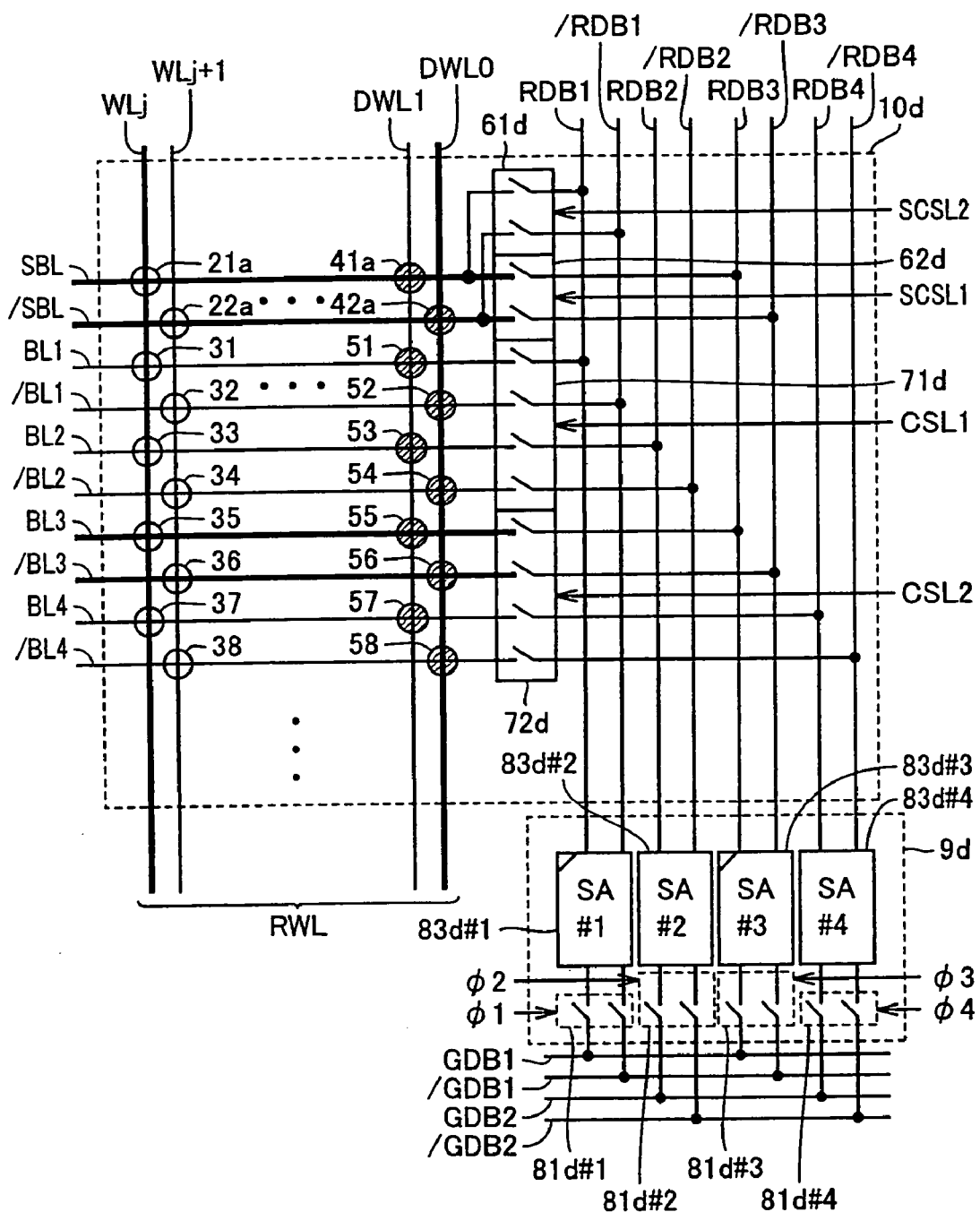
FIG. 13 is a circuit diagram showing configurations of a memory cell array 10d, which is an example modification of a memory cell array and a read/write circuit 9d corresponding thereto.

FIG. 13 is a circuit diagram showing configurations of a memory cell array 10d, which is an example modification of a memory cell array and a read/write circuit 9d corresponding thereto.

Referring to FIG. 13, memory cell array 10d is configured so that in the configuration of memory cell array 10a described in FIG. 10, column select gates 61d and 62d are incorporated instead of column select gates 61a and 62a. Furthermore, column select gates 71d and 72d are incorporated instead of column select gates 71 to 74. Moreover, read data buses RDB3, /RDB3, RDB4 and /RDB4 are placed in parallel to read data buses RDB1 and RDB2. Since the other parts of the configuration is similar to corresponding parts of the configuration of memory cell array 10a, none of descriptions thereof is repeated.

Column select gate 61d connects spare bit lines SBL and /SBL to respective read data buses RDB1 and /RDB1 in response to activation of select signal SCSL2. Column select gate 62d connects spare bit lines SBL and /SBL to respective read data buses RDB3 and /RDB3 in response to activation of select signal SCSL1.

Column select gate 71d connects bit lines BL1, /BL1, BL2 and /BL2 to respective read data buses RDB1, /RDB1, RDB2 and /RDB2 in response to activation of select signal CSL1.

Column select gate 72d connects bit lines BL3, /BL3, BL4 and /BL4 to respective read data buses RDB3, /RDB3, RDB4 and /RDB4 in response to activation of select signal CSL2.

Read/write circuit 9d includes: sense amplifiers 83d#1 to 83d#4; and connecting gates 81d#1 to 81d#4. Sense amplifier 83d#1 detects a difference between currents flowing in a memory cell and a dummy memory cell connected to read data buses RDB1 and /RDB1 to read data. Sense amplifier 83d#2 detects a difference between currents flowing in a memory cell and a dummy memory cell connected to read data buses RDB2 and /RDB2 to read data. Sense amplifier 83d#3 detects a difference between currents flowing in a memory cell and a dummy memory cell connected to read data buses RDB3 and /RDB3 to read data. Sense amplifier 83d#4 detects a difference between currents flowing in a memory cell and a dummy memory cell connected to read data buses RDB4 and /RDB4 to read data.

Since the configurations of sense amplifiers 83d#1 to 83d#4 are similar to the configuration of sense amplifier 83 shown in FIG. 7, none of descriptions thereof is repeated.

Connecting gate 81d#1 connects outputs of sense amplifier 83d#1 to global data buses GDB1 and /GDB1 in response to activation of redundancy control signal φ1. Connecting gate 81d#2 connects outputs of sense amplifier 83d#2 to global data buses GDB2 and /GDB2 in response to activation of redundancy control signal φ2. Connecting gate 81d#3 connects outputs of sense amplifier 83d#3 to global data buses GDB1 and /GDB1 in response to activation of redundancy control signal φ3. Connecting gate 81d#4 connects outputs of sense amplifier 83d#4 to global data buses GDB2 and /GDB2 in response to activation of redundancy control signal φ4.

In the configuration shown in FIG. 13, there is shown a case of a ratio of one spare memory cell to multiple normal memory cells. In this case, column select gates are provided to respective read data buses as uniformly as possible in order to cause capacitance values connected to respective read data buses to be in balance. Furthermore, a design is made so as to obtain a connection relationship and a decoding relationship in which no read data collision occurs between read data from normal memory cells and read data from a spare memory cell, selected simultaneously.

FIG. 14 is a table showing a decoding relationship of control signals of the configuration shown in FIG. 13.

Referring to the upper cell row of FIG. 14, when column selection is performed by select signal CSL1, data buses that normal cells use are read data buses RDB1, /RDB1, RDB2 and /RDB2. In this case, control signal SCSL1 is activated to select a spare column. Spare column uses read data buses RDB3 and /RDB3. As for selection of spare/normal by redundancy control signals φ1, φ2, φ3 and φ4, normal memory cell is selected when redundancy control signals φ1 and φ2 are activated, while a spare memory cell is selected when redundancy control signal φ3 and φ2 are activated.

Referring to the lower cell row of FIG. 14, when column selection is performed by select signal CSL2, data buses that normal cells use are read data buses RDB3, /RDB3, RDB4 and /RDB4. In this case, control signal SCSL2 is activated to select a spare column. Spare column uses read data bus RDB1 and /RDB1. As for selection of spare/normal by redundancy control signals φ1, φ2, φ3 and φ4, normal memory cell is selected when redundancy control signals φ3 and φ4 are activated, while a spare memory cell is selected when redundancy control signal φ1 and φ4 are activated.

Figure 15:
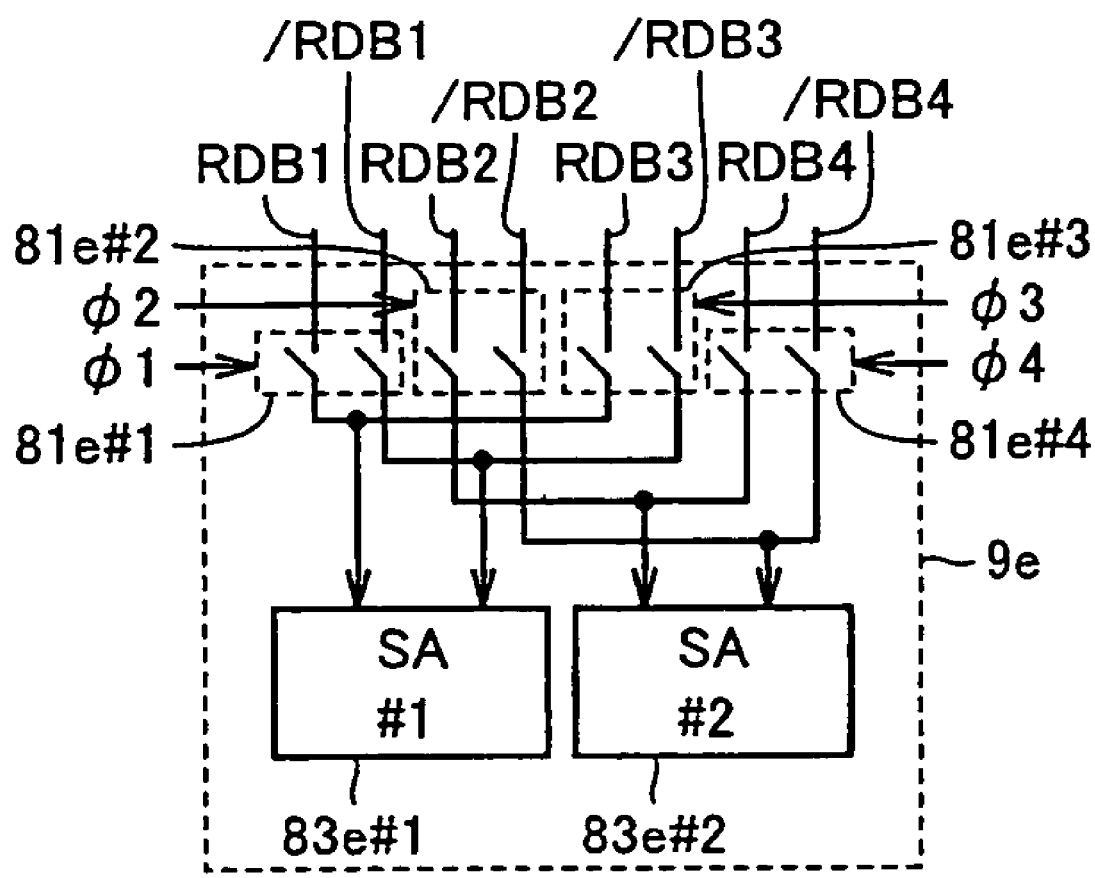
FIG. 15 is a circuit diagram showing a configuration of a read/write circuit 9e, which is an example modification of read/write circuit 9d in FIG. 13.

FIG. 15 is a circuit diagram showing a configuration of a read/write circuit 9e, which is an example modification of read/write circuit 9d in FIG. 13.

Referring to FIG. 15, a read/write circuit 9e includes: connection gates 81e#1 to 81e#4; and sense amplifying circuits 83e#1 and 83e#2. Connection gate 81e#1 connects read data buses RDB1 and /RDB1 to respective 2 inputs of sense amplifier 83e#1 in response to activation of redundancy control signal φ1. Connection gate 81e#2 connects read data buses RDB2 and /RDB2 to respective 2 inputs of sense amplifier 83e#2 in response to activation of redundancy control signal φ2. Connection gate 81e#3 connects read data buses RDB3 and /RDB3 to respective 2 inputs of sense amplifier 83e#1 in response to activation of redundancy control signal φ3. Connection gate 81e#4 connects read data buses RDB4 and /RDB4 to respective 2 inputs of sense amplifier 83e#2 in response to activation of redundancy control signal φ4.

According to various kinds of example configurations shown in the first embodiment, in a case where simultaneous reading on a normal cell and a spare memory cell in MRAM, an imbalance in parasitic capacitance between read data buses are minimized, thereby enabling improvement on a read margin and an access time.

Second Embodiment

Description has been given of a case where simultaneous parallel access operations on a normal memory cell and a spare memory cell in the first embodiment. In this case, an imbalance occurs in read speed between memory cells if lengths of current paths along which read currents flow are different from each other according to locations of memory cells on which parallel accesses are made. If an imbalance in read speed occurs, an access time is limited by a memory cell with the slowest read speed; therefore, an access time is eventually deteriorated.

Figure 16:
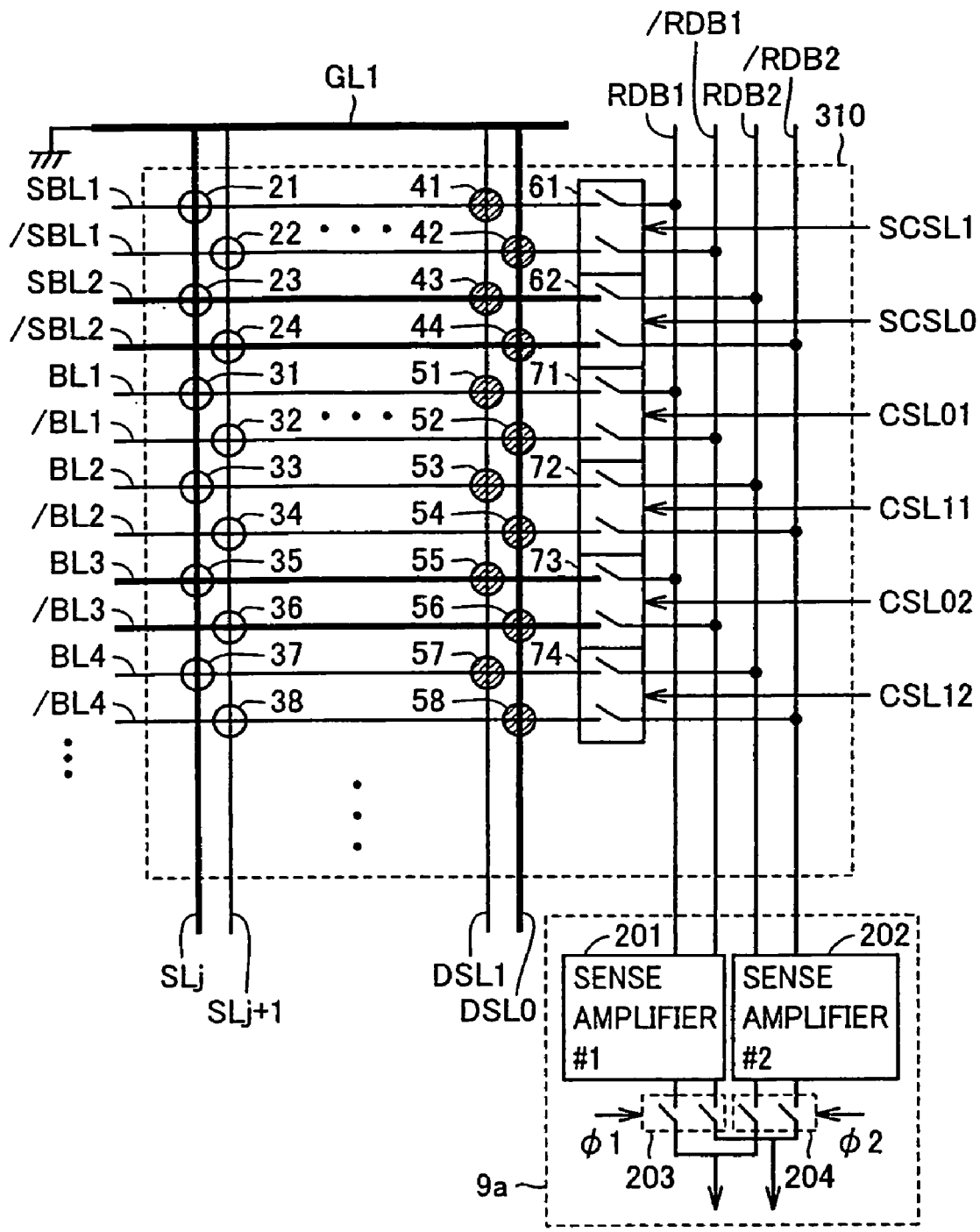
FIG. 16 is a circuit diagram showing a configuration of a memory cell array 310 used in a second embodiment.

FIG. 16 is a circuit diagram showing a configuration of a memory cell array 310 used in a second embodiment. Note that the configuration shown in FIG. 16 is provided with a plurality of stages of sense amplifiers corresponding to the respective read data bus pairs as shown in FIG. 9 and effective in a case where read currents flow simultaneously through a plurality of read data buses.

While in FIG. 9, word lines and dummy word lines are shown correspondingly to respective memory cell rows, in FIG. 16, source lines SLj, SLj+1 and dummy source lines DSL1 and DSL0 are shown instead of word lines and dummy word lines in order to describe paths on which read currents flow.

Note that source line SLj and dummy source line DSL0 are indicated with thick lines, which expresses that both source lines are in selected state as current paths by activation of corresponding read word lines, while not indicating a larger physical thickness of the interconnections.

In memory cell array 310, spare memory cells 21 and 23 and normal memory cells 31, 33, 35 and 37 are connected to source line SLj. Spare memory cells 22 and 24 and normal memory cells 32, 34, 36 and 38 are connected to source line SLj+1.

Spare dummy memory cells 41 and 43 and dummy memory cells 51, 53, 55 and 57 are connected to dummy source line DSL1. Spare dummy memory cells 42 and 44 and dummy memory cells 52, 54, 56 and 58 are connected to dummy source line DSL0. Spare bit lines, bit lines, memory cells and column select gates are similar to the configuration shown in FIG. 9, none of description thereof is repeated.

A grounded line GL1 connected to a power supply at he ground potential is provided outside of memory cell array 310. Grounded line GL1 is placed on the outside of memory cell array 310 in parallel to spare bit line SBL1. The grounded line giving the ground potential is generally made of a thick interconnection lower in resistance relative to interconnection inside the memory cell array and grounded line GL1 here is an interconnection having an electric resistance value corresponding to the order of a resistance value of 2 bit lines per a unit length inside the memory cell arrays.

Figure 17:
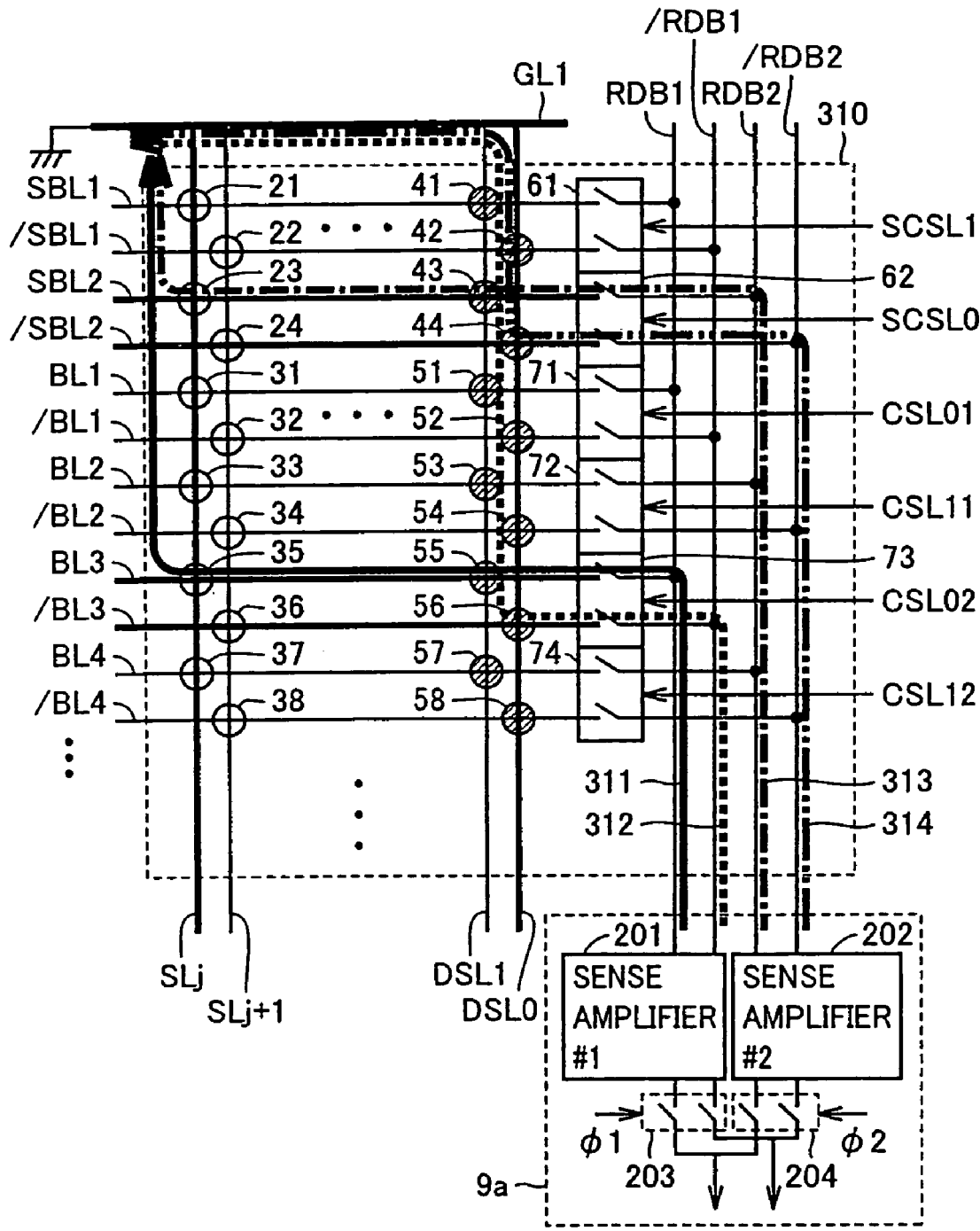
FIG. 17 is a diagram for describing paths on which read currents flow when parallel reading is performed in the configuration shown in FIG. 16.

FIG. 17 is a diagram for describing paths on which read currents flow when parallel reading is performed in the configuration shown in FIG. 16.

Referring to FIG. 17, an arrow mark 311 is an arrow mark indicating a path of a read current flowing in a normal memory cell 35. An arrow mark 312 is an arrow mark indicating a path of a reference current flowing in a dummy memory cell 56. An arrow mark 313 is an arrow mark indicating a path of a read current flowing in a spare memory cell 23. An arrow mark 314 is an arrow mark indicating a path of a reference current flowing in a spare dummy memory cell 44.

Grounded line GL1 in the neighborhood of the memory cell array is formed so as to be of a resistance value of that of 2 bit lines per a unit length. Furthermore, a read data bus is also formed so as to of the same resistance value of that of a single source line per a unit length. With such a configuration, the same value can be secured of electric resistance values of read current paths indicated by the arrow marks 311, 312, 313 and 314.

Figure 18:
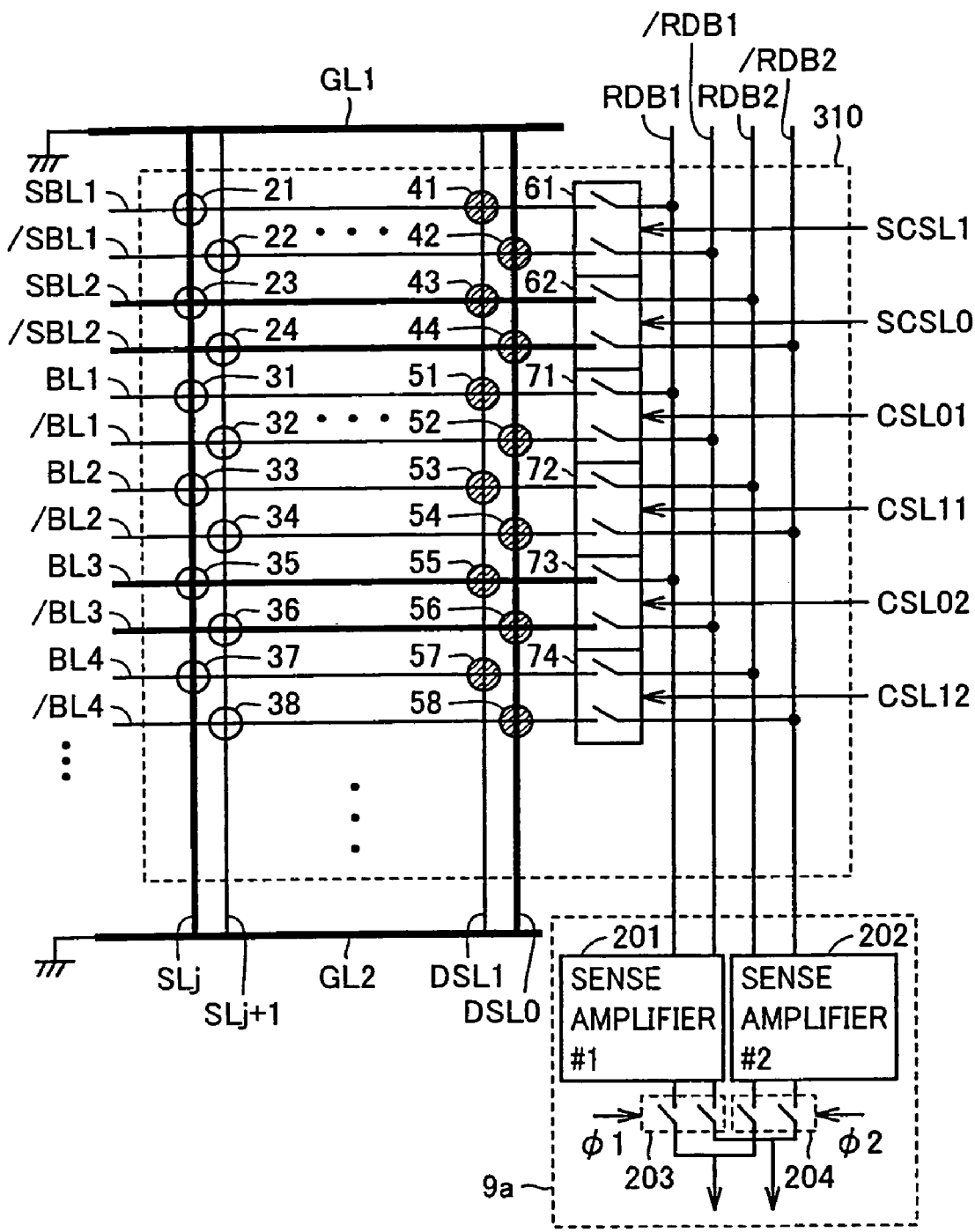
FIG. 18 is a diagram showing a first example modification of a power supply line shown in FIG. 16.

FIG. 18 is a diagram showing a first example modification of a power supply line shown in FIG. 16.

In FIG. 18, a grounded line GL2 opposite to grounded line GL1 is provided so as to sandwich memory cell array 310 therebetween in addition to the configuration described in FIG. 16. One end of grounded line GL2 is connected to a supply source of the ground potential.

Figure 19:
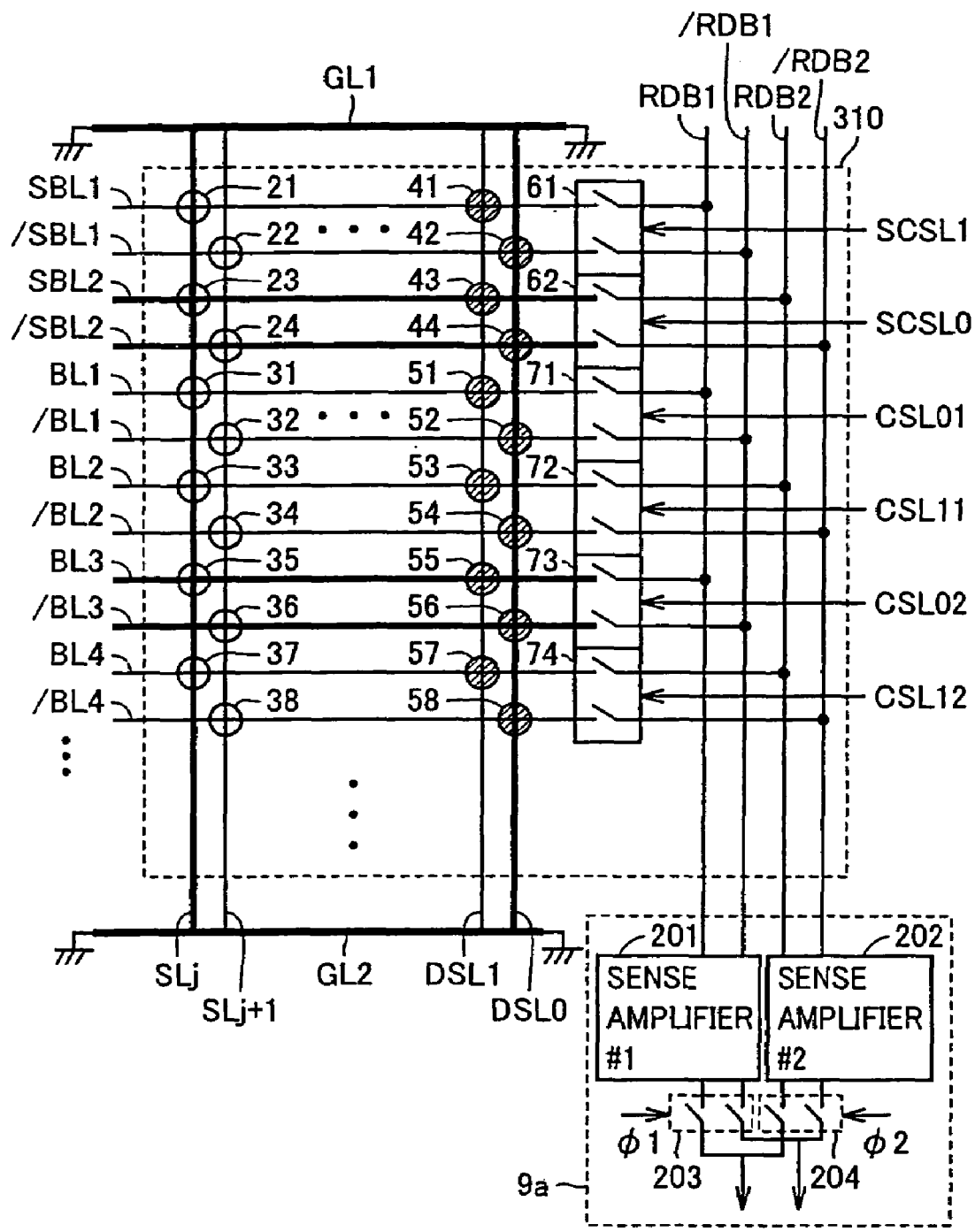
FIG. 19 is a diagram showing a second example modification of a power supply line shown in FIG. 16.

FIG. 19 is a diagram showing a second example modification of a power supply line shown in FIG. 16.

Referring to FIG. 19, the configuration is configured so that in the configuration described in FIG. 18, both ends of grounded line GL1 are connected to supply sources of the ground potential. Moreover, both ends of grounded line GL2 are also connected to e supply sources of the ground potential in a similar manner.

In the example configurations shown in FIGS. 18 and 19 as well, electric resistance values of two read current paths and two reference current paths are kept to be equal to each other.

Figure 20:
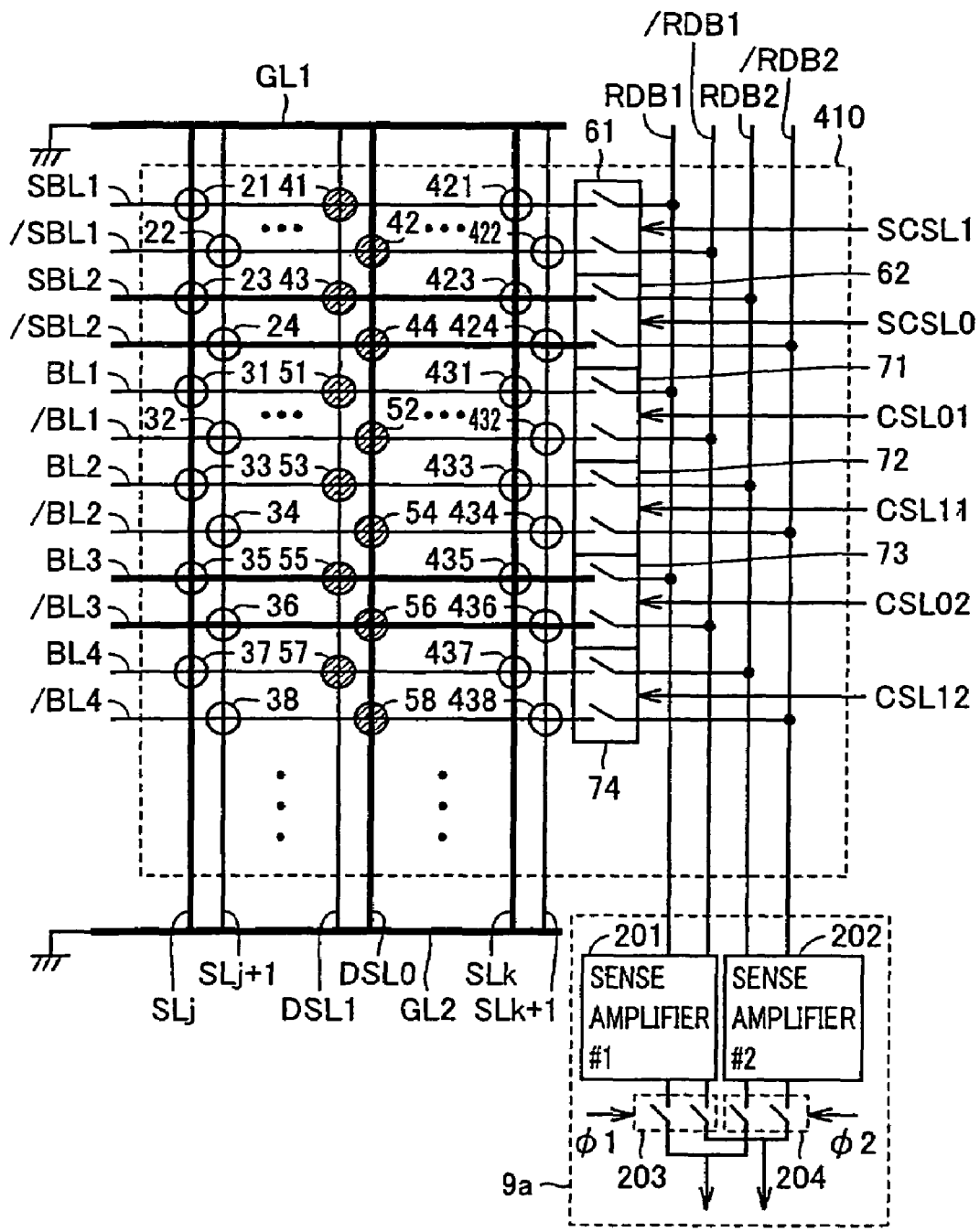
FIG. 20 is an example modification obtained by further modifying the memory cell array in the configuration shown in FIG. 18.

FIG. 20 is an example modification obtained by further modifying the memory cell array in the configuration shown in FIG. 18.

Referring to FIG. 20, a memory cell array 410 is configured so that in the configuration of memory cell array 310 shown in FIG. 18, dummy source lines DSL0 and DSL1 are placed in a central portion of source lines SLj to SLk+1. Accordingly, dummy memory cells are not connected to source line SLk+1 adjacent to column select gates 61, 62, and 71 to 74 and to source line SLk adjacent to source line SLk+1. That is, connected to source line SLk are spare memory cells 421, 423 and normal memory cells 431, 433, 435 and 437. Connected to source line SLk+1 are spare memory cells 422 and 424 and normal memory cells 432, 434, 436 and 438. Since a relationship of spare bit lines with bit lines and column select gates is similar to a case of FIG. 18, none of descriptions thereof is repeated.

By placing a dummy row in the neighborhood of a central portion of the array in this way, an imbalance between original resistance values of current paths can be reduced. In the configuration shown in FIG. 18, resistance values of a read current path and a reference current path becomes largely different from each other according to whether it is a case where a selected normal memory cell is located closer to a dummy memory cell or a case where a selected normal memory cell is located farther away from a dummy memory cell if resistance values of a bit line and grounded line GL1 and GL2 are different from each other. Therefore, a resistance value of a grounded line has been designed to be on the same order of that of a bit line.

When a dummy row is placed in a central portion of the array as shown in FIG. 20, the maximum difference in resistance value between a path on which a current in a dummy memory cell flows and a path on which a read current in a normal memory cell flows can be reduced to the order of a value half that in the case of FIG. 18 even if a bit line and grounded line GL1 and GL2 is different from each other in electric resistance.

Figure 21:
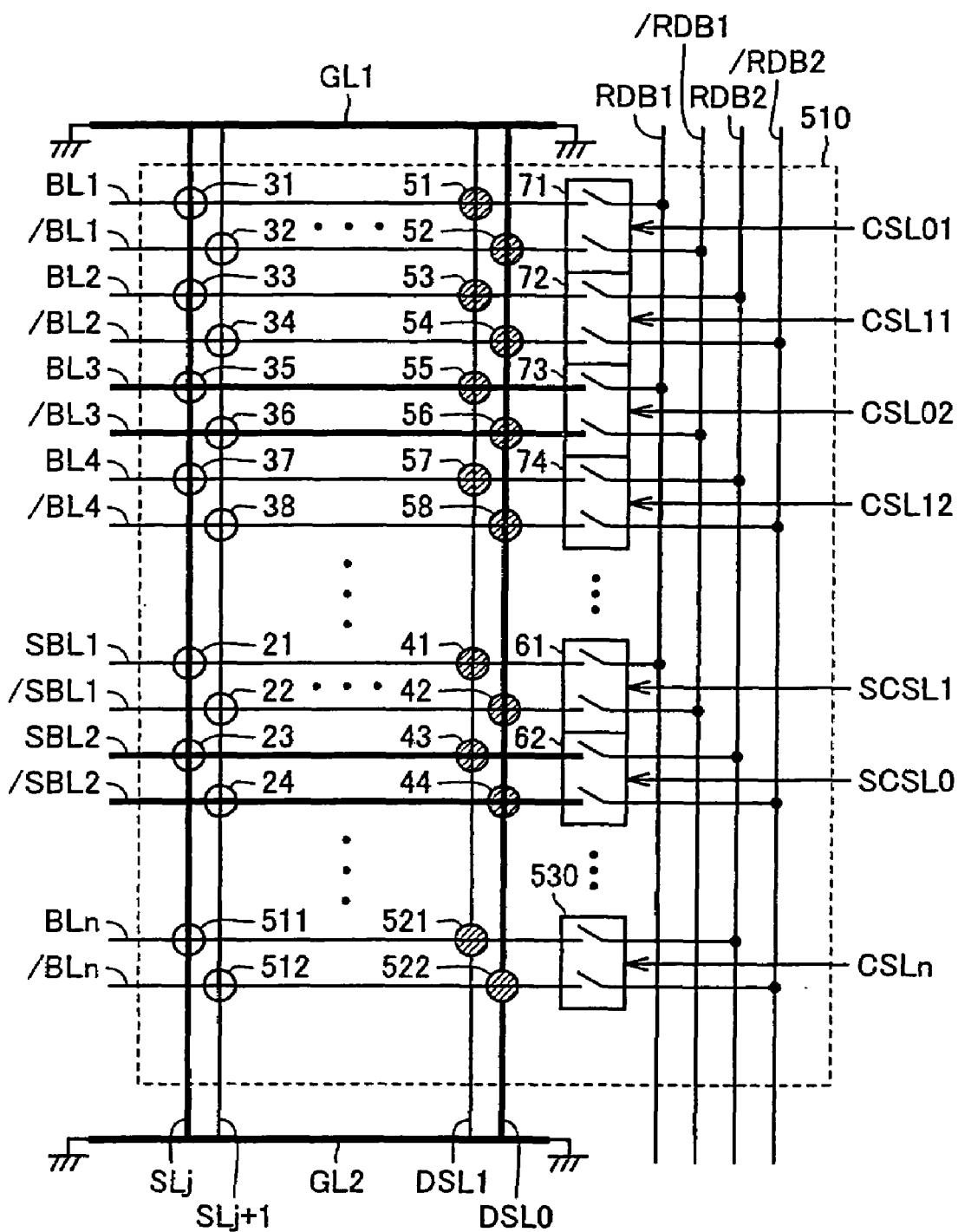
FIG. 21 is a diagram for describing a memory cell array 510, which is another example modification.

FIG. 21 is a diagram for describing a memory cell array 510, which is another example modification.

Referring to FIG. 21, memory cell array 510 is configured so that in the configuration of memory cell array 310 shown in FIG. 19, spare columns selected by select signals SCSL1 and SCSL0 are shifted by modification so as to locate in a central portion of the memory cell array. That is, bit line BL1 is placed in the proximity of grounded line GL1 and bit line /BLn is placed in the proximity of ground line GL2. Spare bit lines SBL1, /SBL1, SBL2 and /SBL2 are placed in the neighborhood of just the central portion between bit lines BL1 and bit line /BLn in parallel to the normal bit lines. With such a configuration adopted, an imbalance in resistance value between current paths can be reduced compared with the configuration shown in FIG. 19 even if there is a different between a unit length resistance value of source lines SLj and SLj+1 and dummy source lines DSL0 and DSL1 and a unit length resistance value of read data buses RDB1, /RDB1, RDB2 and /RDB2. As described above, with the configurations of power supply interconnection and the memory cell array shown in the second embodiment applied, fluctuations in electric resistance of read current paths are minimized to thereby improve a read margin and an access time in a case of simultaneous reading data in a normal memory cell and data in a spare memory cell and in a case where data of a plurality of bits is simultaneously read from one memory cell array.

Third Embodiment

In the first embodiment, description has been given of a case where simultaneous accesses are made to a normal memory cell and a spare memory cell. At this time, there arises a problem that an accesses time is deteriorated by electric resistance of a superimposed portion, especially a common source line, of a plurality of read current paths accessed in parallel.

That is, when 2 currents flowing in a normal memory cell and a spare memory cell flow through the same source line, a float of a source potential is doubled to thereby delay a access time to be longer. In this case, it is only required to arrange source lines and word lines so as to separate a path of a current flowing in a normal memory cell and a path of a current flowing in a spare memory cell from each other at all times.

Figure 22:
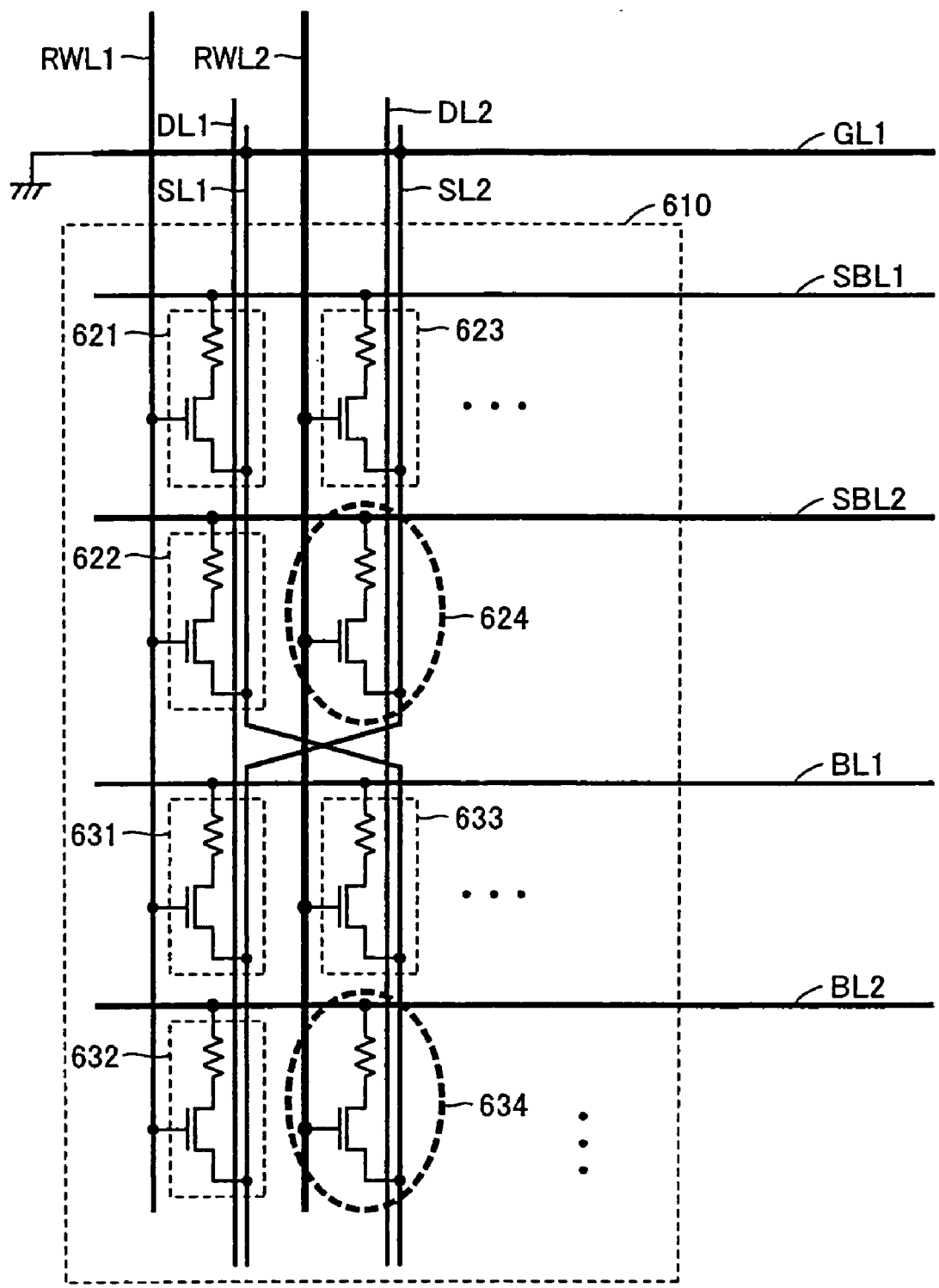
FIG. 22 is a circuit diagram showing a configuration of a memory cell array 610 used in a third embodiment in which a read current path is separated.

FIG. 22 is a circuit diagram showing a configuration of a memory cell array 610 used in a third embodiment in which a read current path is separated.

Referring to FIG. 22, memory cell array 610 includes: spare memory cells 621 to 624; and normal memory cells 631 to 634.

Spare memory cells 621 and 622 and normal memory cells 631 and 632 are placed on the same row and there are provided word line RWL1 for performing selection in reading correspondingly to this row and digit line DL1 for performing selection in writing.

Spare memory cells 623 and 624 and normal memory cells 633 and 634 are placed on the same row and there are provided word line RWL2 for performing selection in reading correspondingly to this row and digit line DL2 for performing selection in writing.

Since organizations of spare memory cells 621 to 624 and normal memory cells 631 to 634 are similar to the organization of memory cells 31 shown in FIG. 3, neither of descriptions thereof is repeated.

Memory cell array 610 includes: a spare bit line SBL1 connected to spare memory cells 621 and 623; spare bit line SBL2 connected to spare memory cells 622 and 624; bit line BL1 connected to normal memory cells 631 and 633; and bit line BL2 connected to normal memory cells 632 and 634.

Memory cell array 610 further includes: source lines SL1 and SL2. Source lines SL1 and SL2 are interchanged in arrangement at boundary portion between a region in which normal memory cells 631 to 634 are arranged and a region in which spare memory cells 621 to 624 are arranged.

That is, source line SL1 is connected to spare memory cells 621 and 622 in the region in which spare memory cells are arranged. However, source line SL1 is connected to normal memory cells 633 and 634 on the adjacent row in the region in which normal cells are arranged. Furthermore, source line SL2 is connected to spare memory cells 623 and 624 in the region in which spare memory cells are arranged. However, source line SL2 is connected to normal memory cells 631 and 632 on the adjacent row in the region in which normal cells are arranged.

Description will here be given of a case where in data reading, word line RWL2 is activated, and bit line BL2 and spare bit line SBL2 are simultaneously selected to perform parallel reading. In the figure, word line RWL2 and spare bit line SBL2 and bit line BL2 are depicted with thick lines for visual distinction of the selection.

In a case where selection is performed in this way, currents flow in spare memory cell 624 and normal memory cell 634. In this situation, a read current flowing in normal memory cell 634 is caused to flow into source line SL1 from bit line BL2 through memory cell 634. On the other hand, a current flowing in spare memory cell 624 is caused to flow into source line SL2 from spare bit line SBL2 through spare memory cell 624.

By interchanging source lines therebetween at a boundary portion between a region in which spare memory cells are arranged and a region in which normal memory cells are arranged, a path on which a read current flows can be separated in the memory cell array. Therefore, reduction can be realized in an influence of electric resistance of a source line when a plurality of data is simultaneously read.

Figure 23:
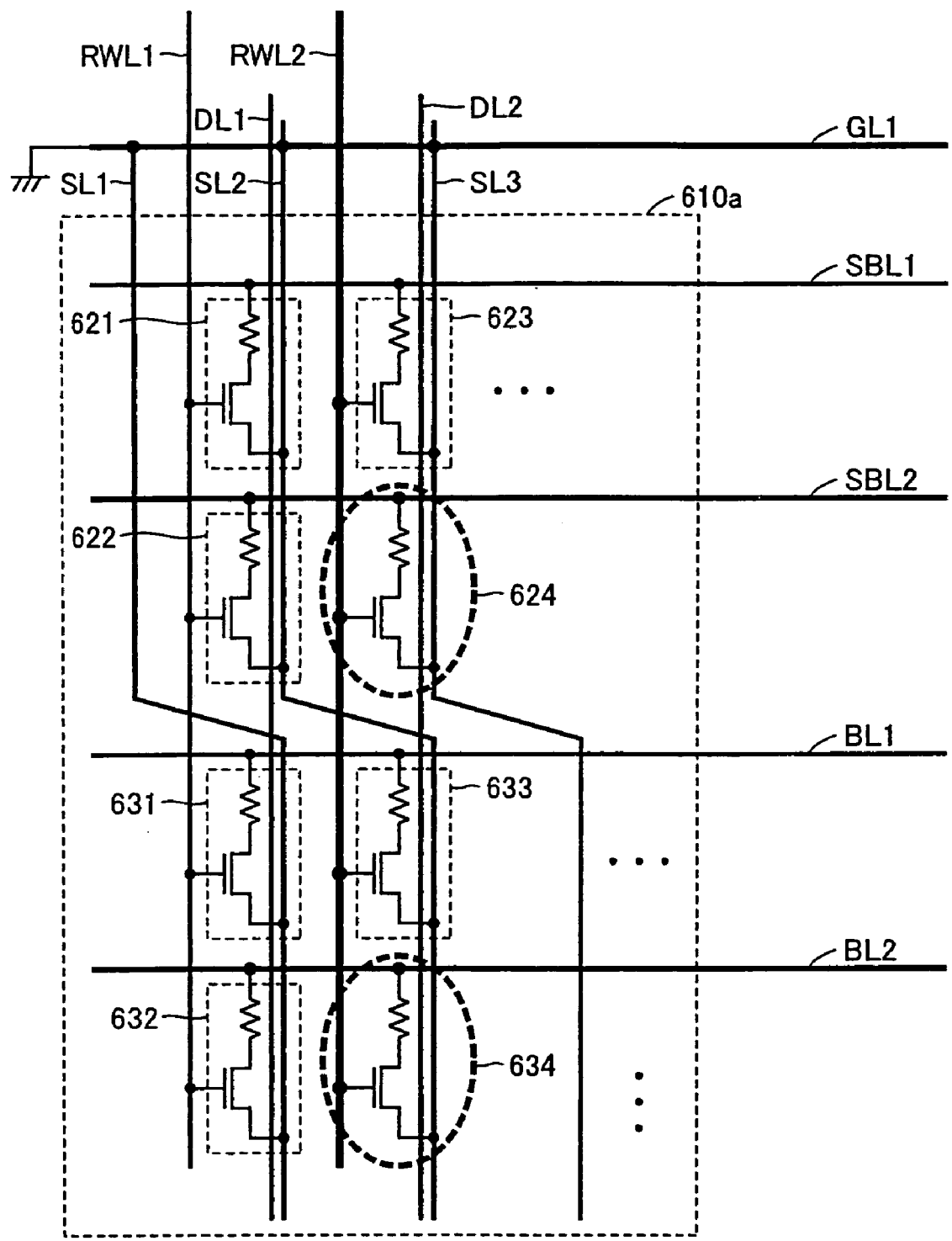
FIG. 23 is a diagram showing a first example modification of the configuration in which a read current path is separated.

FIG. 23 is a diagram showing a first example modification of the configuration in which a read current path is separated.

Referring to FIG. 23, memory cell array 610*a* includes: spare memory cells 621 to 624; and normal memory cells 631 to 634.

Spare memory cells 621 and 622 and normal memory cells 631 and 632 are placed on the same row and there are provided word line RWL1 for performing selection in reading correspondingly to the row and digit line DL1 for performing a row selection in writing.

Spare memory cells 623 and 624 and normal memory cells 633 and 634 are placed on the same row and there are provided word line RWL2 for performing selection in reading correspondingly to the row and digit line DL2 for performing a row selection in writing.

Memory cell array 610*a* includes: spare bit line SBL1 connected to spare memory cells 621 and 623; spare bit line SBL2 connected to spare memory cells 622 and 624; bit line BL1 connected to normal memory cells 631 and 633; and bit line BL2 connected to normal memory cells 632 and 634.

The arrangements of memory cells, word lines, digit lines, and bit lines are similar to the case of FIG. 22. The placement of source lines described below is different from FIG. 22.

Memory cell array 610*a* further includes: source lines SL1 to SL3. Each of source lines SL1 to SL3 is shifted onto imaginary extension of an adjacent source line at a boundary portion between a region where spare memory cells 631 to 634 are arranged and a region where normal memory cells 631 to 634 are arranged.

That is, source line SL1 is placed on imaginary extension of a portion of source line SL2 residing in a region where a spare memory cell array is arranged, shifting by one row and source line SL1 is connected to normal memory cells 631 and 632.

Source line SL2 is connected to spare memory cells 621 and 622 in a region where spare memory cells are arranged. In a region where normal memory cells are arranged region, source line SL2 is placed, shifting by one row, on imaginary extension of a portion of source line SL3 residing in a region where spare memory cell array is arranged. Source line SL2 is connected to normal memory cells 633 and 634.

Source line SL3 is connected to spare memory cells 623 and 624 in a region where spare memory cells are arranged. In a region where normal memory cells are arranged region, source line SL3 is placed, shifting by one row, on imaginary extension of a portion of source line SL4 not shown residing in a region where spare memory cell array.

By shifting a source line to displace in this way, intersection portions between source lines can be removed as compared with the case shown in FIG. 22, thereby enabling formation of source lines in one interconnection layer.

With such a configuration, a current flowing a selected memory cell 634 is caused to flow into source line SL2 from bit line BL2 through memory cell 634 and further reaches grounded line GL1. Furthermore, a current flowing in selected spare memory cell 624 reaches grounded line GL1 from spare bit line SBL2 through spare memory cell 624 and through source line SL3. Therefore, since source lines can be separately used, a read current path from a read data bus to a source line through a bit line can be separated in the memory cell array; thereby enabling reduction in an influence of an electric resistance of a source line when a plurality of data is simultaneously read.

Figure 24:
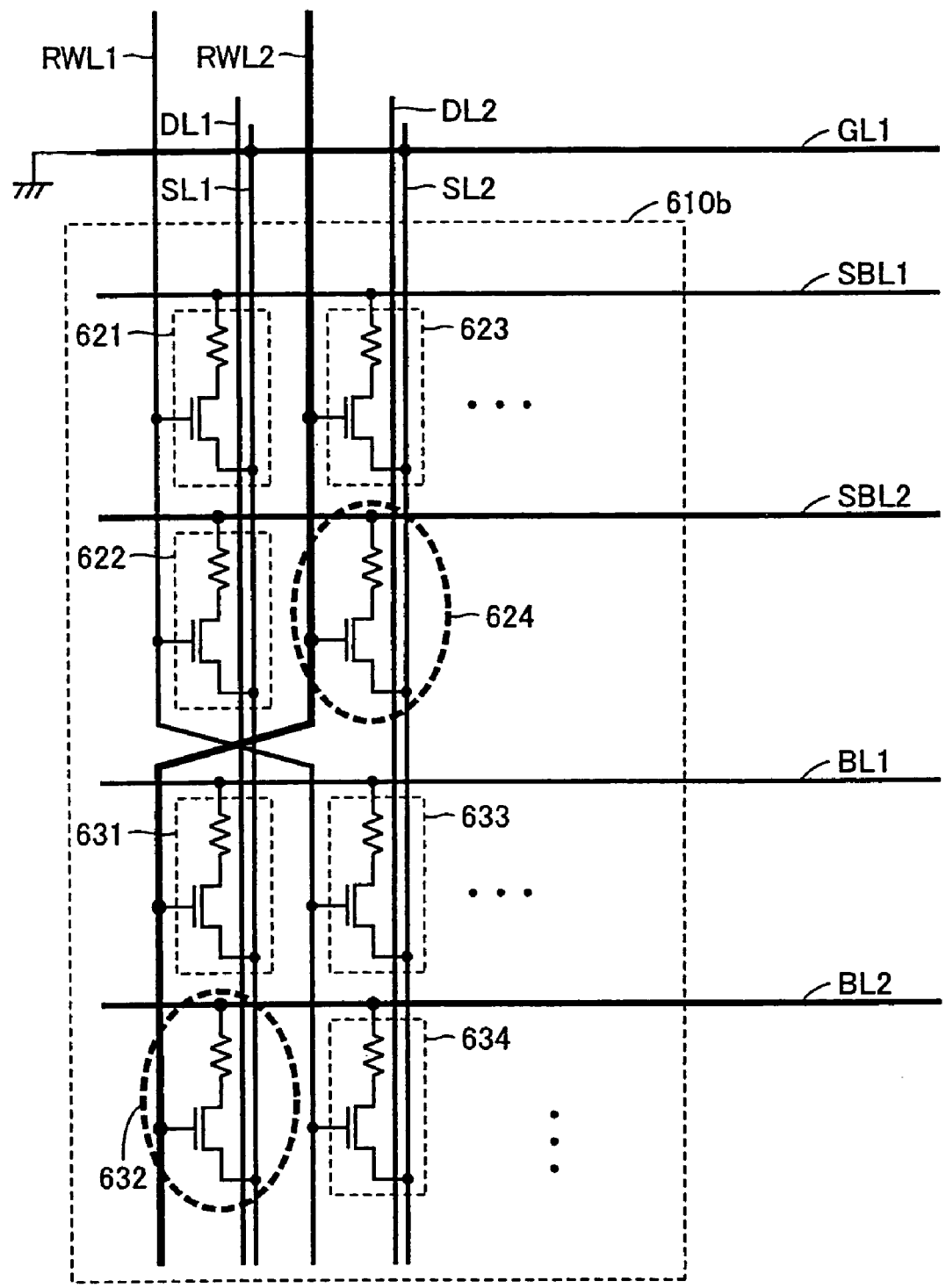
FIG. 24 is a diagram showing a second example modification of the configuration in which a read current path is separated.

FIG. 24 is a diagram showing a second example modification of the configuration in which a read current path is separated.

Referring to FIG. 24, a memory cell array 610*b* is configured so that in the configuration of memory cell array 610 shown in FIG. 22, word lines RWL1 and RWL2 are interchanged therebetween at some midpoint on the lines instead of interchange between source lines SL1 and SL2. The interchange is performed at a boundary portion between a region where spare memory cells 621 to 624 are arranged and a region where normal memory cells 631 and 634 are arranged.

That is, word line RWL1 is connected to spare memory cells 621 and 622 in a region where spare memory cells are arranged Furthermore, word line RWL2 is connected to normal memory cells 633 and 634 in a region where normal memory cells are arranged.

Moreover, word line RWL2 is connected to spare memory cells 623 and 624 in a region where spare memory cells are arranged. Furthermore, word line RWL2 is connected to normal memory cells 631 and 632 in a region where normal memory cells are arranged.

It is considered here a case where word line RWL2 is activated, and bit line BL2 and spare bit line SBL2 are selected to thereby perform reading. In this case, spare memory cell 624 and normal memory cell 632 are selected. The selected cells are on respective different rows. Since source lines are provided correspondingly to respective memory cell rows, paths through which read currents flow are separated from each other in source line portions.

Since read current paths from read data buses to source lines through bit lines can be separated between a spare memory cell and a normal cell, an influence of electric resistance of a source line can be reduced when a plurality of data is simultaneously read.

Figure 25:
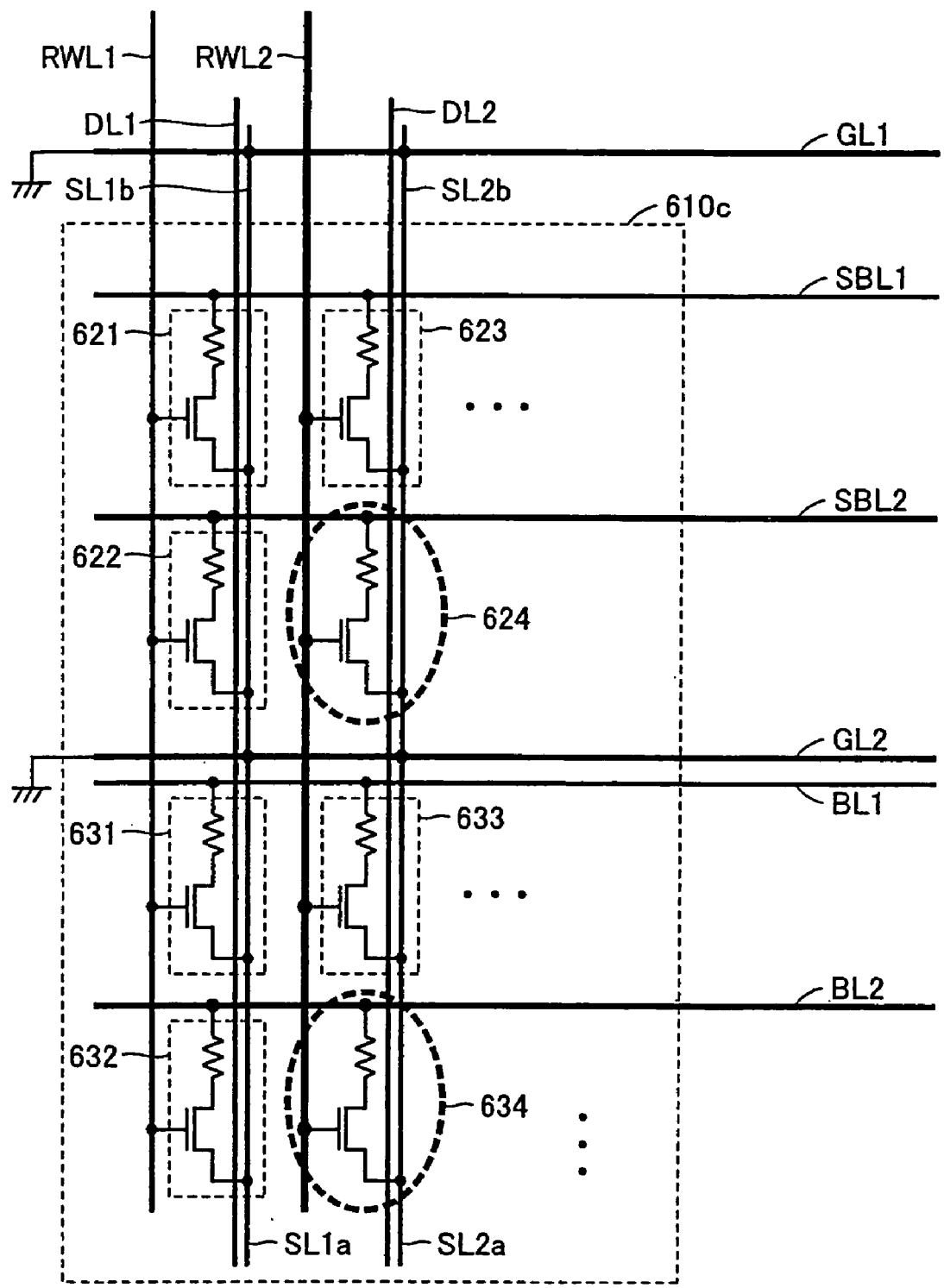
FIG. 25 is a diagram showing a third example modification of the configuration in which a read current path is separated.

FIG. 25 is a diagram showing a third example modification of the configuration in which a read current path is separated.

Referring to FIG. 25, memory cell array 610c includes: spare memory cells 621 to 624; and normal memory cells 631 to 634.

Spare memory cells 621 and 622, and normal memory cells 631 and 632 are placed on the same row and there are provided word line RWL1 for performing selection in reading correspondingly to the row and digit line DL1 for performing a row selection in writing.

Spare memory cells 623 and 624, and normal memory cells 633 and 634 are placed on the same row and there are provided word line RWL2 for performing selection in reading correspondingly to the row and digit line DL2 for performing a row selection in writing.

Memory cell array 610c includes: a spare bit line SBL1 connected to spare memory cells 621 and 623; a spare bit line SBL2 connected to spare memory cells 622 and 624; bit line BL1 connected to normal memory cells 631 and 633; and bit line BL2 connected to normal memory cells 632 and 634.

The above configuration of memory cells, word lines, digit lines and bit lines are similar to the case of FIG. 22. Arrangement of source lines described below in FIG. 25 is different from FIG. 22.

Memory cell array 610c further includes: a grounded line GL2 provided at a boundary portion between a region where spare memory cells 621 to 624 are arranged and a region where normal memory cells 631 to 634 are arranged. With this configuration, a source line corresponding to the first row of memory cells is divided into source lines SL1a and SL1b. Likewise, a source line corresponding to the second row of memory cells is divided into source lines SL2a and SL2b.

A case is considered where data in spare memory cell 624 and normal memory cell 634 is simultaneously read using word line RWL2 and bit lines SBL and BL2. Since a current flowing in normal memory cell 634 flows into grounded line GL2 through source line SL2a, reduction can be attained in an influence thereof on source line SL2b through which a read current in spare memory cell 624 flows.

Since in such a way, a read current path from a read data bus to a source line through a bit line can be separated by clamping a potential on the source line at a boundary portion between a region where spare memory cells are arranged and a region where normal memory cells are arranged, reduction can be attained in an influence of electric resistance of a source line when a plurality of data is simultaneously read.

Figure 26:
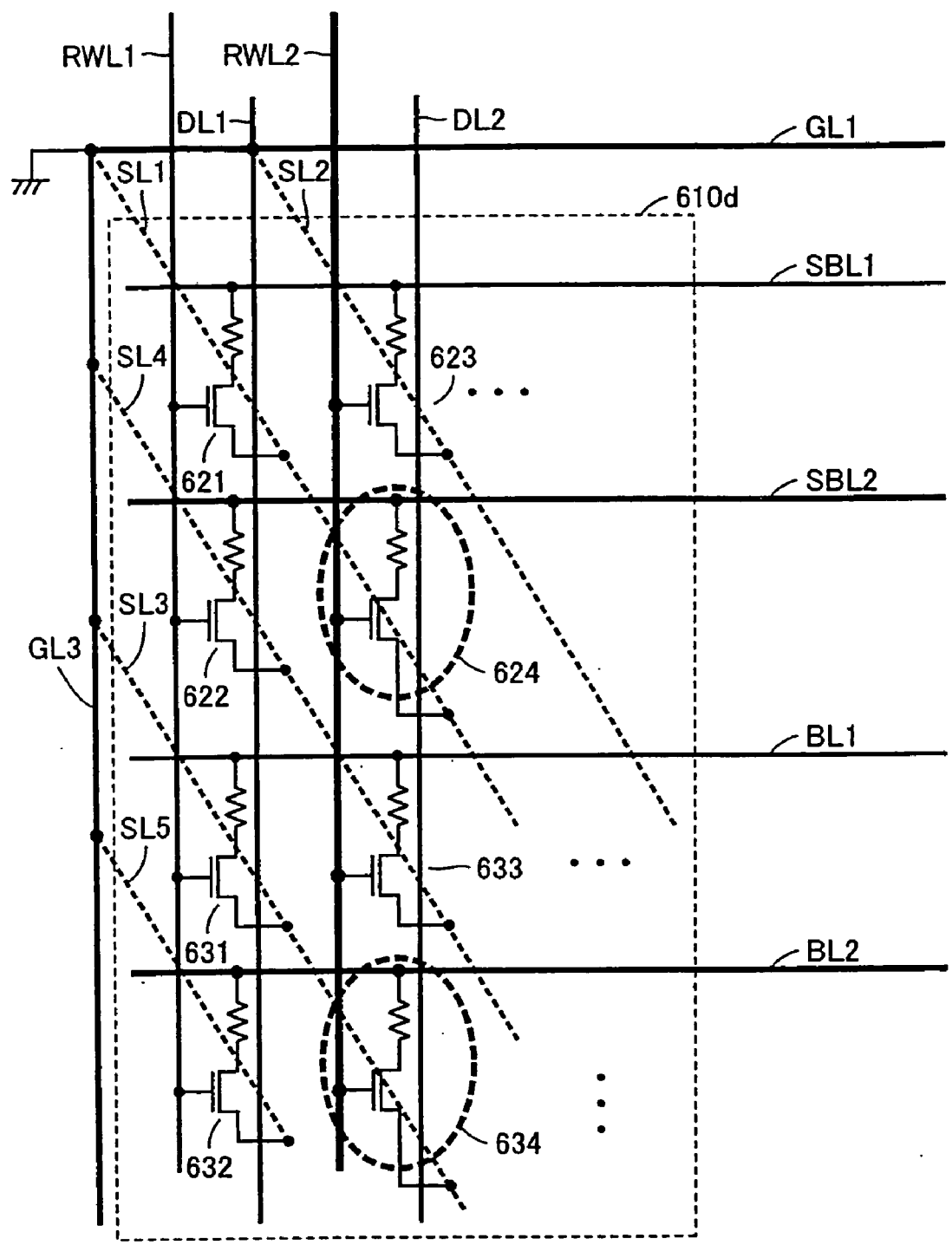
FIG. 26 is a diagram showing a fourth example modification of the configuration in which a read current path is separated.

FIG. 26 is a diagram showing a fourth example modification of the configuration in which a read current path is separated.

Referring to FIG. 26, a memory cell array 610d includes: spare memory cells 621 to 624; and normal memory cells 631 to 634.

Spare memory cells 621 and 622 and normal memory cells 631 and 632 are placed on the same row and there are provided word line RWL1 for performing selection in reading correspondingly to the row and digit line DL1 for performing row selection in writing.

Spare memory cells 623 and 624 and normal memory cells 633 and 634 are placed on the same row and there are provided word line RWL2 for performing selection in reading correspondingly to the row and digit line DL2 for performing row selection in writing.

Memory cell array 610d includes: spare bit line SBL1 connected to spare memory cells 621 and 623; spare bit lines SBL2 connected to spare memory cells 622 and 624; bit line BL1 connected to normal memory cells 631 and 633; and bit line BL2 connected to normal cells 632 and 634.

The above configuration of memory cells, word lines, digit lines and bit lines is similar to the case of FIG. 22. Placement of grounded lines and source lines described below in FIG. 26 is different from FIG. 22.

Outside memory cell array 610d, grounded line GL1 is placed in the proximity of spare bit line SBL1 in parallel thereto and grounded line GL3 is placed in the proximity of read word line RWL1 in parallel thereto 1. Grounded lines GL1 and GL3 are connected to a supply source of the ground potential.

Memory cell array 610d further includes: source lines SL1 to SL5 placed along directions, oblique to memory cell rows, and in parallel to each other. Source line SL2 is connected to memory cell 623. Source line SL1 is connected to memory cells 621 and 624. Source line SL4 is connected to memory cells 622 and 633. Source line SL3 is connected to memory cells 631 and 634. Source line SL5 is connected to memory cell 632.

In such a way, source lines are placed in oblique directions in both regions where spare memory cells are arranged and where normal memory cells are arranged, crossing the border therebetween. With such source lines placed, even in a case where selected normal memory cell 634 and selected spare memory cells 624 are present on the same row, source lines to be used by the selected cells are respective source lines SL3 and SL1, which are not the same. Accordingly, read current paths each from a read data bus to a source line through a bit line can be separated from each other, thereby enabling decrease in an influence of electric resistance of a source line on the others in simultaneous reading of a plurality of data.

Figure 27:
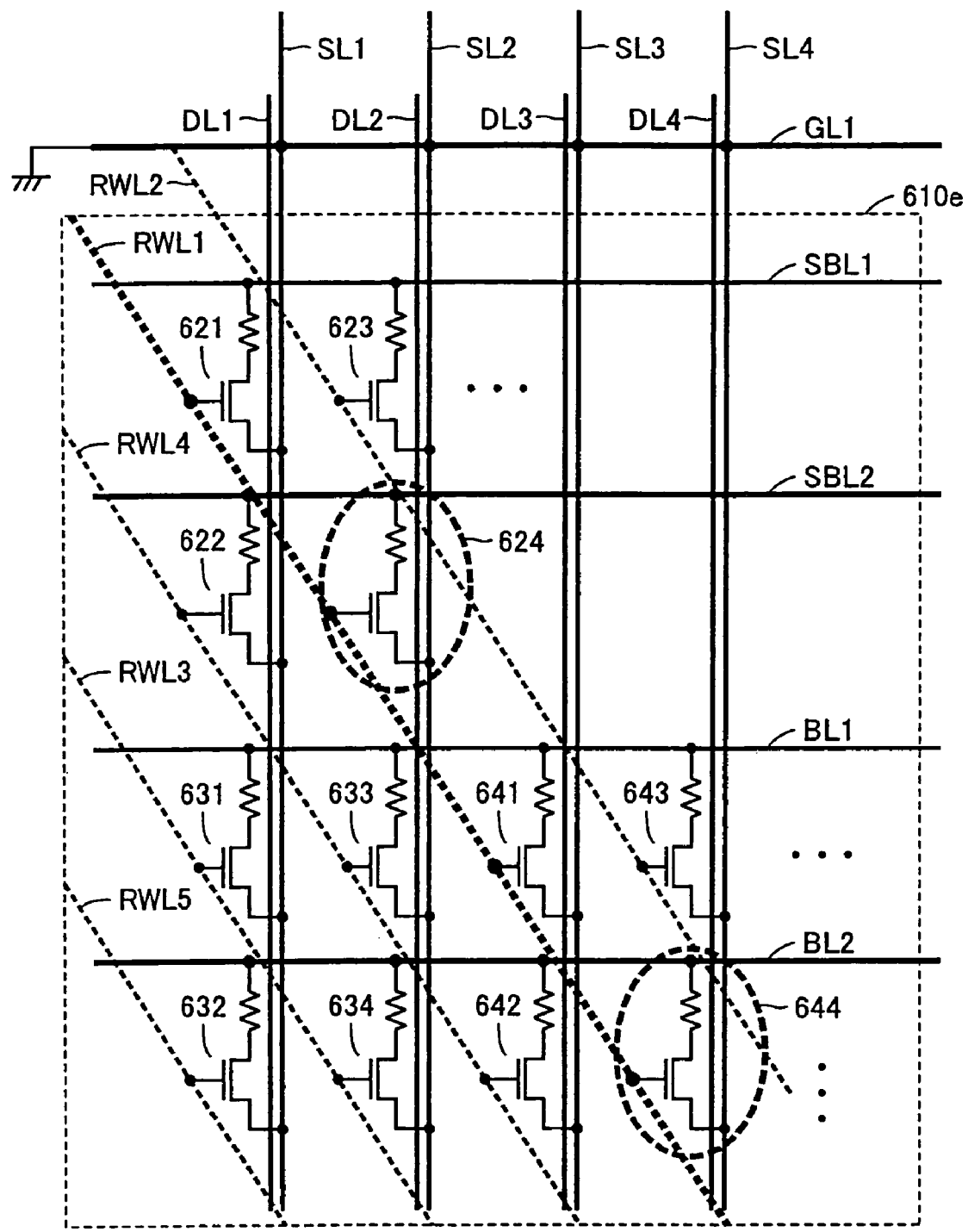
FIG. 27 is a diagram showing a fifth example modification of the configuration in which a read current path is separated.

FIG. 27 is a diagram showing a fifth example modification of the configuration in which a read current path is separated.

Referring to FIG. 27, memory cell array 610e includes spare memory cells 621 to 624; and normal memory cells 631 to 634 and 641 to 644.

Spare memory cells 621 and 622 and normal memory cells 631 and 632 are placed on the same row and there are provided source line SL1 and digit line DL1 for row selection in writing, correspondingly to the row.

Spare memory cells 623 and 624 and normal memory cells 633 and 634 are placed on the same row and there are provided source line SL2 and digit line DL2 for row selection in writing, correspondingly to the row.

Normal memory cells 641 and 642 are placed on the same row and there are provided source line SL3 and digit line DL3 for performing row selection in writing, correspondingly to the row. Normal memory cells 643 and 644 are placed on the same row and there are provided source line SL4 and digit line DL4 for performing row selection in writing, correspondingly to the row.

Memory cell array 610e includes: a spare bit line SBL1 connected to spare memory cells 621 and 623; a spare bit line SBL2 connected to spare memory cells 622 and 624; bit line BL1 connected to normal memory cells 631, 633, 641 and 643; and bit line BL2 connected to normal memory cells 632, 634, 642 and 644.

In FIG. 27, dissimilar to FIG. 26, word lines are placed obliquely to memory cell rows instead of source lines. That is, memory cell array 610e further includes: word lines RWL1 to RWL5 placed in directions oblique to rows of memory cells.

Word lines RWL1 is connected to spare memory cells 621 and 624 and normal memory cells 641 and 644. Word lines RWL2 is connected to spare memory cell 623 and normal memory cell 643. Word lines RWL3 is connected to normal memory cells 631 and 634. Word lines RWL4 is connected to spare memory cell 622 and normal memory cells 633 and 642. Word lines RWL5 is connected to normal memory cell 632.

In a case where word line RWL1 is activated, and selection of columns are performed by bit line BL2 and spare bit line SBL2, normal memory cell 644 is selected and at the same time, spare memory cell 624 is selected. A read current flowing in normal memory cell 644 flows into grounded line GL1 through source line SL4. A read current flowing in spare memory cell 624 flows into grounded line GL1 through source line SL2. With such a configuration adopted, a source line in a memory cell array is not shared by read current paths and each read current paths from a read data bus to a source line through a bit line are separated from the others, thereby enabling decrease in influence of electric resistance of a source line on the other paths in simultaneous reading of a plurality of data.

As described above, according to the third embodiment, in a case where simultaneous parallel data reading is performed of data in a normal memory cell and a spare memory cell, since a plurality of read current paths to which parallel accesses are performed are separated from each other, no increase occurs in access time associated with electric resistance of a source line.

Note that while in the above embodiments, descriptions have been given mainly of cases where simultaneous accesses are performed to a spare memory cell and a normal memory cell, the above embodiments can be applied as they are even in a case where a plurality of normal memory cells are simultaneously accessed. To be concrete, even in a case where a plurality of normal bit line pairs are selected by one select signal as shown in FIG. 13, the configurations of the second and third embodiments can be applied.

Fourth Embodiment

In an MRAM using a conventional tunneling magneto-resistance elements (TMR) or the like, there has been a problem that it was impossible to simply construct a reference memory cell (hereinafter, also referred to as a dummy cell) used for generating a reference value for data reading when memory cell data is read. In a fourth embodiment, description will be given of a solution of this problem.

Figure 28:
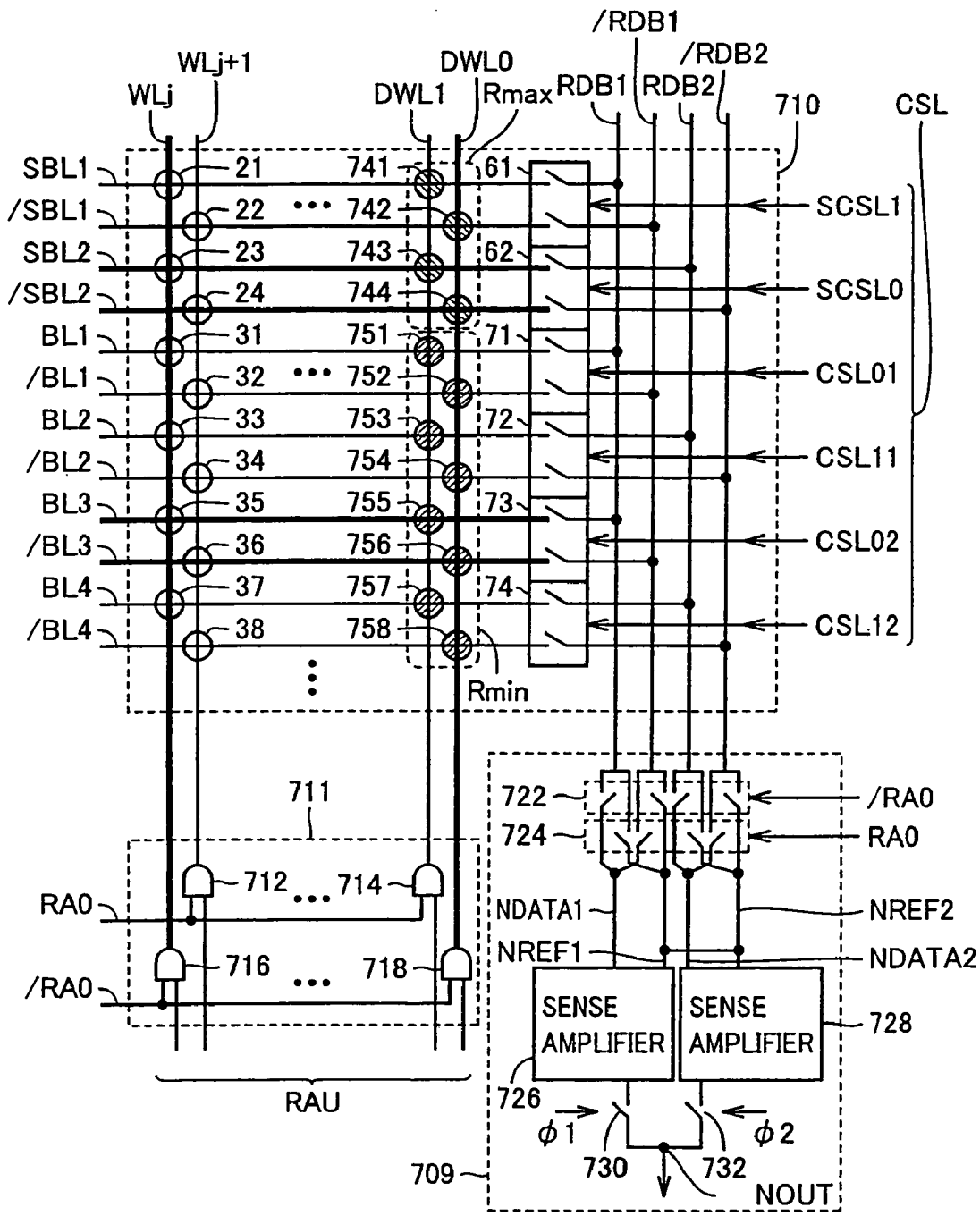
FIG. 28 is a circuit diagram showing a configuration of a memory cell array used in a memory device of a fourth embodiment and a configuration concerning reading from the memory cell array.

FIG. 28 is a circuit diagram showing a configuration of a memory cell array used in a memory device of a fourth embodiment and a configuration concerning reading from the memory cell array.

Referring to FIG. 28, as compared with the configuration of memory cell array 10 shown in FIG. 2, a memory cell array 710 includes: spare dummy memory cells 741 to 744 instead of spare dummy memory cells 41 to 44; and dummy memory cells 751 to 758 instead of dummy memory cells 51 to 58. Since the configuration of the other constituents of memory cell array 710 is to that of memory cell array 10 shown in FIG. 2, none of descriptions thereof will be repeated.

Dummy memory cells 741 to 744 and 751 to 758 each includes a magneto-resistance element. In dummy memory cells 741 to 744, data writing is performed so that a resistance value of each of the dummy memory cells 741 to 744 takes Rmax. On the other hand, in dummy memory cells 751 to 758, data is written to the magneto-resistance element so that a resistance value of each of the dummy memory cells 751 to 758 takes Rmin.

The memory device according to the fourth embodiment further includes: a word line drive circuit 711 driving word lines WLj, WLj+1, . . . , and dummy word lines DWL1 and DWL0; and a read circuit 709 performing reading of data from memory cell array 710. Word line drive circuit 711 includes: an AND circuit 716 receiving a prescribed bit of an upper row address RAU and signal /RA0 to drive word line WLj; an AND circuit 712 receiving a corresponding bit of address signal RAU and signal RA0 to drive word line WLj+1; an AND circuit 714 driving dummy word line DWL1 according to a corresponding bit of address signal RAU and signal RA0; and an AND circuit 718 driving dummy word line DWL0 according to a prescribed bit of signal RAU and signal /RA0. In FIG. 28, a case is shown where signal /RA0 is activated at H level to activate word line WLj and dummy word line DWL0. Each of two bit lines included in each bit line pair corresponds with each of the activated two word lines.

To be concrete, a case is considered where signal CSL02, which is a column select signal, is activated to select bit lines BL3 and /BL3. Since no memory cell is placed at intersection between word line WLj and bit line /BL3, bit line /BL3 can be used in reading of a reference value from reference memory cell 756. Accordingly, dummy word line DWL0 among dummy word lines DWL0 and DWL1 is selected for activation when word line WLj is activated.

To the contrary, in a case where word line WLj+1 is activated, a reference value cannot be transmitted since bit line /BL3 is used in data reading on memory cell 36. Therefore, the reference value is required to be transmitted with bit line BL3. Hence, dummy word line DWL1 is selected instead of dummy word line DWL0. On this occasion, a reference value in dummy memory cell 755 is transmitted onto a read data bus through bit line BL3.

Read circuit 709 includes: a connecting circuit 722 connecting data buses RDB1, /RDB1, RDB2 and /RDB2 to nodes NDATA1, NREF1, NDATA2 and NREF2, respectively, when signal /RA0 is activated; a connecting circuit 724 connecting data buses RDB1, /RDB1, RDB2 and /RDB2 to nodes NREF1, NDATA1, NREF2 and NDATA2, respectively, when signal RA0 is activated; a sense amplifier 726 inputs of which are connected to nodes NDATA1 and NREF1; a sense amplifier 728 inputs of which are connected to nodes NDATA2 and NREF2; a switch 730 transmitting an output of sense amplifier 726 to a node NOUT in response to a signal φ1; and a switch 732 transmitting an output of sense amplifier 728 to node NOUT in response to a signal φ2.

A data bus, connected to a memory cell to be read corresponding to an address among data bases RDB1 and /RDB1, is connected to node NDATA1 by connecting circuits 722 and 744, and a data bus connected a dummy cell is connected to node NREF1. Similar to this, a data bus, connected to a memory cell to be read among data bases RDB2 and /RDB2, is connected to node NDATA2, and a data bus connected to a dummy cell is connected to node NREF2. Nodes NREF1 and NREF2 are connected electrically to each other.

Figure 29:
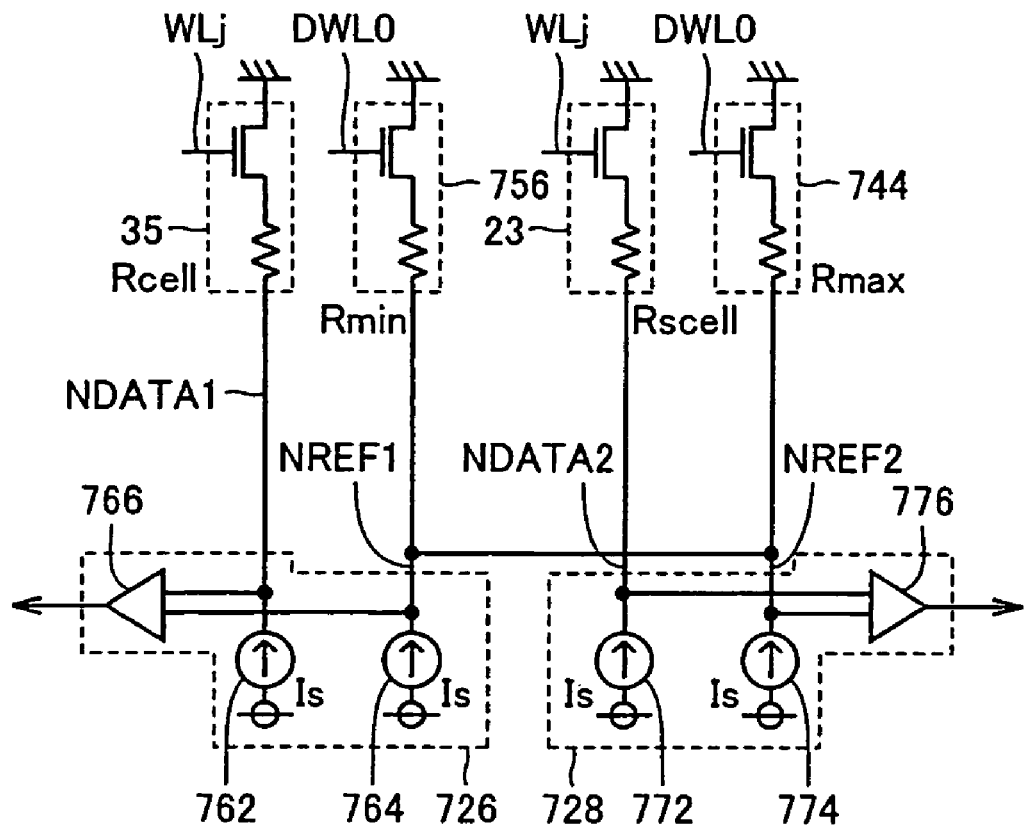
FIG. 29 is a diagram for describing paths on which currents flow from sense amplifiers to memory cells.

FIG. 29 is a diagram for describing paths on which currents flow from sense amplifiers to memory cells.

Referring to FIG. 29, description will be given of currents flowing in a state where spare memory cell 23, memory cell 35, spare dummy memory cell 744 and dummy memory cell 756 in FIG. 28 are selected and connected to sense amplifiers 726 and 728. Sense amplifier 726 includes: a current source 762 causing a current Is to flow from a power supply node to node NDATA1; a current source 764 causing current Is from the power supply node to node NREF1; and a comparison circuit 766 inputs of which are connected to nodes NDATA1 and NREEF1.

Sense amplifier 728 includes: a current source 772 causing current Is to flow from the power supply node to node NDATA2; a current source 774 causing current Is from the power supply node to node NREF2; and a comparison circuit 776 inputs of which are connected to nodes NDATA2 and NREEF2.

Herein, since in the side where dummy cells are connected, nodes NREF1 and NREF2 are connected electrically to each other, a resistance value Rmin of dummy cell 756 and a resistance value of Rmax of dummy cell 744 are combined through synthesis to, as a result, generate a reference level. In comparison circuit 766, comparison is performed between the reference level generated through synthesis and a level based on a value of current flowing in a resistance value Rcell of normal memory cell 35. Likewise, in comparison circuit 776, comparison is performed between a level corresponding to a current flowing in a resistance value Rscell of spare memory cell 23 and a reference level. Determination of data is performed by the comparison operations.

Referring again to FIG. 28, after data determination is performed in sense amplifiers 726 and 728, an output of one of sense amplifiers 726 and 728 is selected. For example, the selection corresponds to selection of normal cell data or spare cell data.

Signal φ1 is activated when data selected by a pair of buses RDB1 and /RDB1 are finally selected. On the other hand, signal φ2 is activated when data transmitted through data buses RDB2 and /RDB2 are finally selected.

In FIG. 28, data corresponding to a resistance value Rmax is written into spare dummy memory cells 741 to 744, and data corresponding to a resistance value Rmin is written into dummy memory cells 751 to 758. Description will be given of data writing.

When a wafer process is completed, a treatment is performed according to a magnetization process to orient a fixed magnetic layer of a TMR element to a prescribed direction. Since together with orientation of the fixed magnetic layer, the free magnetic layer is also magnetized in the same direction, all the memory cells (including dummy memory cells and spare memory cells) each have taken a state where data corresponding to a resistance value Rmin is written thereinto.

Then, a prescribed test mode is set to write data corresponding to a resistance value Rmax into dummy cells on a spare column, that is spare dummy memory cells 741 to 744. After an operation in which dummy memory cells as part of a memory cell array are rewritten in such a manner, an operation test on an MRAM set in an ordinary mode is performed.

An operation in which data corresponding to a resistance value Rmax is written into spare dummy memory cells 741 to 744 may be sufficiently performed once basically. In order to increase reliability, however, a rewriting operation may be performed when power is turned on in an MRAM. In the example of FIG. 28, there is shown a case where data corresponding to a resistance value Rmax is written into spare dummy memory cells 741 to 744 while data corresponding to resistance value Rmin is held in dummy memory cells 751 to 758 as are in an initial state thereof. An operation may also be naturally implemented that the spare dummy memory cell side are set at resistance value Rmin, while the ordinary dummy memory cell side corresponds to resistance value Rmax. Since the example shown in FIG. 28 has a smaller number of dummy memory cells corresponding to resistance value Rmax, an advantage can be obtained of a smaller number of test cycles for writing into dummy memory cells counting from an initial state.

In FIG. 28, description has been given of the case where by rewriting data from the initial state on part of dummy memory cells, a reference level is generated with two dummy memory cells holding data different from each other. Such a write operation of dummy cell data can be made unnecessary by altering a configuration of a dummy cell.

Figure 30:
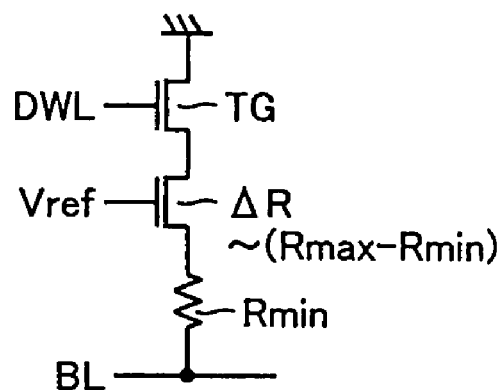
FIG. 30 is a circuit diagram for describing a configuration of an example modification of a dummy cell with which writing of dummy cell data becomes unnecessary.

FIG. 30 is a circuit diagram for describing a configuration of an example modification of a dummy cell with which writing of dummy cell data becomes unnecessary.

Referring to FIG. 30, a memory cell usually has a configuration in which a transmission gate TG and a TMR element holding resistance value Rmin are in series connected to each other. In addition thereto, it is only required that a resistance element having a resistance value $\Delta R$ is in series connected between the transmission gate TG and the TMR element. Resistance value $\Delta R$ is set so as to be equal to Rmax−Rmin.

To be concrete, an N-channel MOS transistor to the gate of which a prescribed potential Vref is applied can be used as a resistance element having a resistance value of $\Delta R$. With such a resistance value adopted, only spare dummy memory cells on a spare column each have a resistance value Rmax in an initial state thereof. As a result, a dummy cell connected to a resistance value Rmin in an initial state thereof and a spare dummy memory cell are combined through synthesis to generate a reference level corresponding to resistance value Rmin+$\Delta R$/2.

With dummy memory cells on a spare column each having a different configuration, no necessity exists for writing data corresponding to resistance value Rmax into part of dummy cells after the wafer process is over. As a result, the number of fabrication process steps can be reduced by one, thereby enabling cost-down to a corresponding lower level.

Fifth Embodiment

Figure 31:
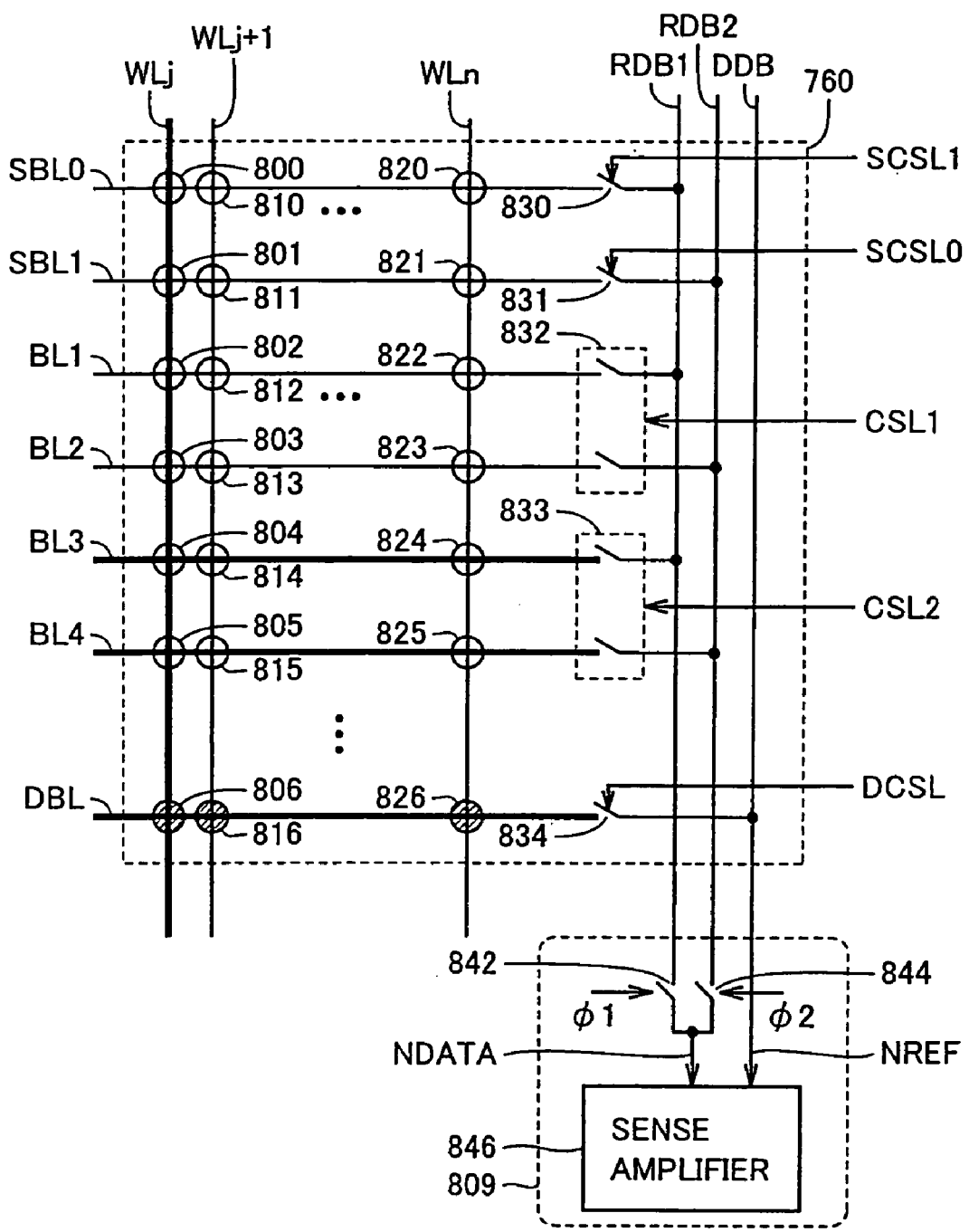
FIG. 31 is a circuit diagram for describing a memory cell array and a read circuit used in a fifth embodiment.

FIG. 31 is a circuit diagram for describing a memory cell array and a read circuit used in a fifth embodiment.

Referring to FIG. 31, a memory cell array 760 is of a configuration in which a plurality of memory cells are simultaneously selected to perform reading. Furthermore, memory cell array 760 is also of a dummy column configuration in which dummy memory cells are placed along the column direction.

Memory cell array 760 includes: memory cells 802 to 805, 812 to 815 and 822 to 825; spare memory cells 800, 801, 810, 811, 820 and 821; and dummy memory cells 806, 816 and 826.

Memory cells 800 to 806 are placed at respective intersections of word line WLj with bit lines SBL0, SBL1, BL1, BL2, BL3, BL4 and DBL. Memory cells 810 to 816 are placed at respective intersections of word line WLj+1 with bit lines SBL0, SBL1, BL1, BL2, BL3, BL4 and DBL. Memory cells 820 to 826 are placed at respective intersections of word line WLn with bit lines SBL0, SBL1, BL1, BL2, BL3, BL4 and DBL.

Memory cell array 760 further includes: a switch circuit 830 connecting spare bit line SBL0 and data bus RDB1 to each other in response to signal SCSL1; a switch circuit 831 connecting spare bit line SBL1 and data bus RDB2 to each other in response to signal SCSL0; a switch circuit 832 connecting bit lines BL1 and BL2 to respective data buses RDB1 and RDB2 in response to activation of signal SCL1; a switch circuit 833 connecting bit lines BL3 and BL4 to respective data buses RDB1 and RDB2 in response to activation of signal SCL2; and a switch circuit 834 connecting dummy bit line DBL to data bus DDB in response to activation of signal DCSL.

Read circuit 809 includes: a switch circuit 842 connecting data bus RDB1 to node NDATA in response to signal $\phi 1$; a switch circuit 844 connecting data bus RDB2 to node NDATA in response to signal $\phi 2$; and a sense amplifier 846 inputs of which are connected to nodes NDATA and NREF. Data bus DDB is connected to node NREF.

Resistance elements for generating a reference level are used in dummy memory cells 806, 816 and 826. A resistance value of each of the resistance elements is desirably set to a value of Rmin+$\Delta$R/2. Herein, $\Delta$R=Rmax−Rmin.

In the configuration shown in FIG. 31, two columns corresponding to bit lines BL3 and BL4 are simultaneously selected and one of the two columns are selected based on another bit of a column address immediately before inputting is performed to sense amplifier 846.

With the above operations and the dummy column configuration adopted, a high speed access can be realized.

Figure 32:
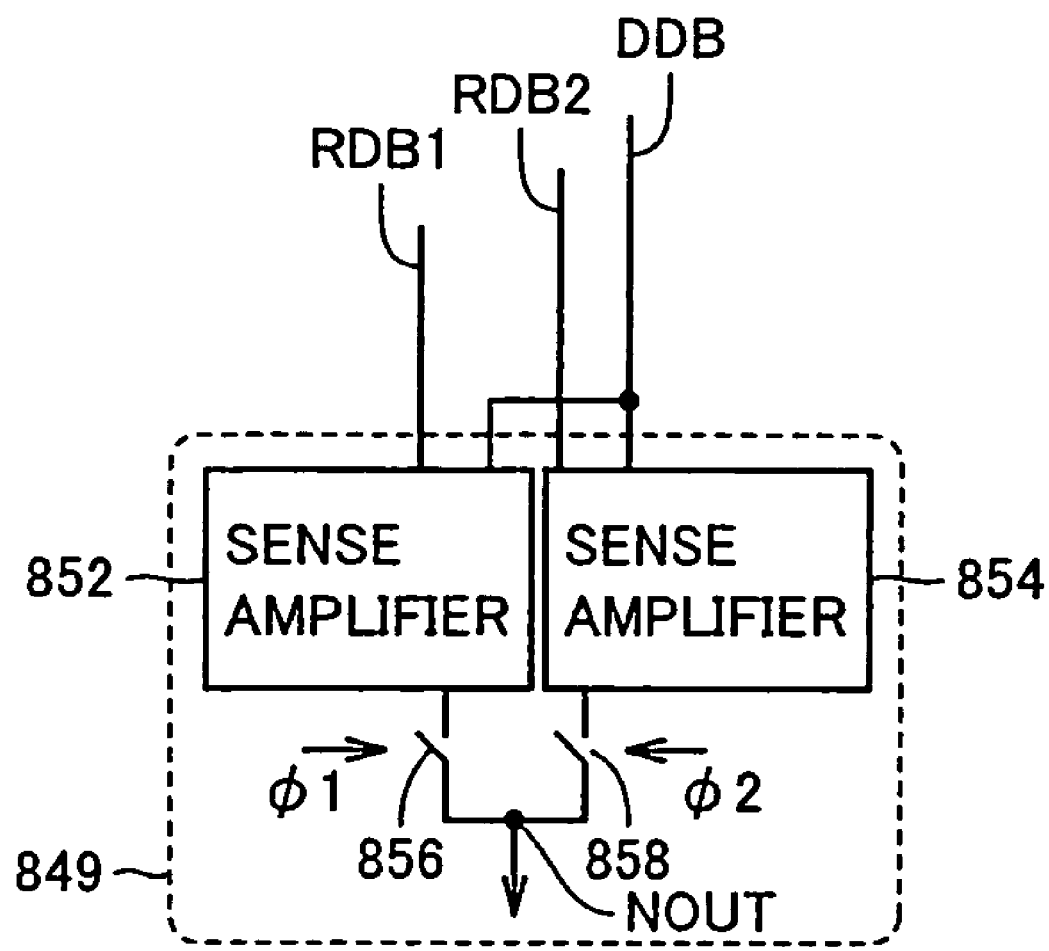
FIG. 32 is a diagram showing an example modification of the read circuit.

FIG. 32 is a diagram showing an example modification of the read circuit.

Referring to FIG. 32, in this example modification, a read circuit 849 is provided instead of read circuit 809 in FIG. 31. Read circuit 849 includes: a sense amplifier 852, one of inputs of which is connected to data bus RDB1, and the other of the inputs of which is connected to data bus DDB; a sense amplifier 854, one of inputs of which is connected to data bus RDB2, and the other of the inputs of which is connected to data bus DDB; a switch circuit 856 transmitting an output of sense amplifier 852 to node NOUT in response to activation of signal $\phi 1$; and a switch circuit 858 transmitting an output of sense amplifier 854 to node NOUT in response to activation of signal $\phi 2$.

As shown in FIG. 32, a memory cell on which reading is performed may be finally specified on the output side of sense amplifiers.

Figure 33:
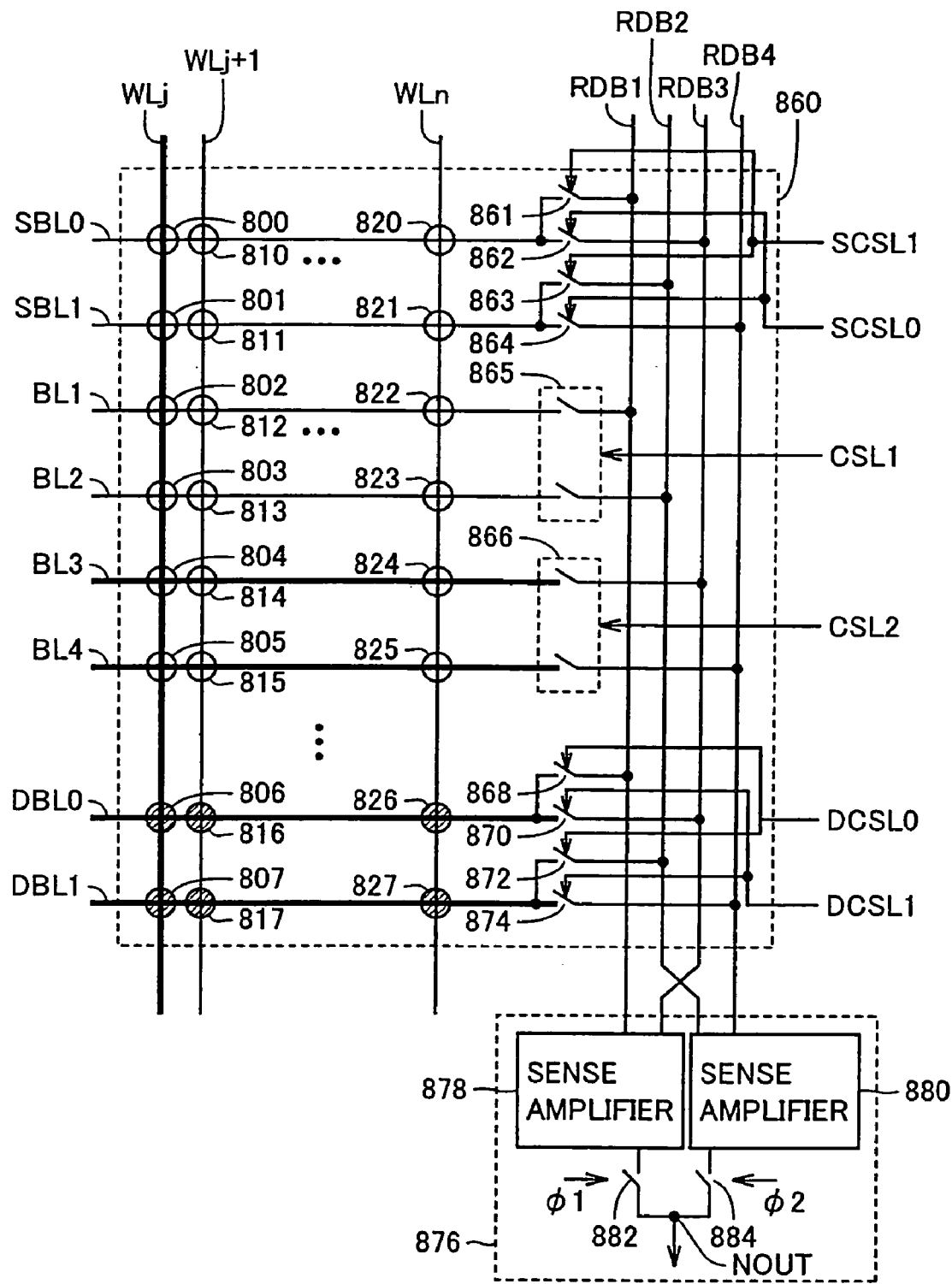
FIG. 33 is a circuit diagram showing another example of a dummy column configuration in which dummy memory cells are placed along the column direction similarly to FIG. 31.

FIG. 33 is a circuit diagram showing another example of a dummy column configuration in which dummy memory cells are placed along the column direction similarly to FIG. 31.

Referring to FIG. 33, memory cell array 860 includes: dummy memory cells 807, 817 and 827 in addition to the configuration of memory cell array 760 shown in FIG. 31; and switch circuits 861 to 874 instead of switch circuits 830 to 834. Note that dummy memory cells 806, 816 and 826 are connected to dummy bit line DBL in FIG. 31, while being connected to dummy bit line DBL0 in FIG. 33. Dummy memory cells 807, 817 and 827 are connected to dummy bit line DBL1 adjacent to dummy bit line DBL0.

Switch circuit 861 connects bit line SBL0 to data bus RDB1 in response to activation of signal SCSL1. Switch circuit 862 connects bit line SBL0 to data bus RDB3 in response to activation of signal SCSL0. Switch circuit 863 connects bit line SBL1 to data bus RDB2 in response to activation of signal SCSL1. Switch circuit 864 connects bit line SBL1 to data bus RDB4 in response to activation of signal SCSL0.

Switch circuit 865 connects bit lines BL1 and BL2 to respective data buses RDB1 and RDB2 in response to activation of signal CSL1. Switch circuit 866 connects bit lines BL3 and BL4 to respective data buses RDB3 and RDB4 in response to activation of signal CSL2.

Switch circuit 868 connects dummy bit line DBL0 to data bus RDB1 in response to activation of signal DCSL0. Switch circuit 870 connects dummy bit line DBL0 to data bus RDB3 in response to activation of signal DCSL1. Switch circuit 872 connects dummy bit line DBL1 to data bus RDB2 in response to activation of signal DCSL0. Switch circuit 874 connects dummy bit line DBL1 to data bus RDB4 in response to activation of signal DCSL1.

Read circuit 876 includes: a sense amplifier 878 two inputs of which are connected to data buses RDB1 and RDB3; a sense amplifier 880 two inputs of which are connected to data buses RDB2 and RDB4; a switch circuit 882 transmitting sense amplifier 878 to node NOUT in response to activation of $\phi 1$; and a switch circuit 884 transmitting sense amplifier 880 to node NOUT in response to activation of $\phi 2$.

Dummy memory cells 806, 816, 826, 807, 817 and 827 each include a resistance element for generating a dummy level. A resistance value of each resistance element is desirably Rmin+$\Delta$R/2. Herein, $\Delta$R=Rmax−Rmin. In the configuration shown in FIG. 33, two normal columns are simultaneously selected in parallel to each other or two spare columns are simultaneously selected in parallel to each other. A determination is performed by the sense amplifiers and, thereafter, one of memory cell columns is finally selected.

When data in memory cells that are to be finally read by data buses RDB1 and RDB3 is transmitted, the final selection is performed by activating signal $\phi 1$. On the other hand, when data in memory cells that are to be finally read by data buses RDB2 and RDB4 is transmitted, the final selection is performed by activating signal $\phi 2$.

A high speed access by parallel selection can also be realized with the dummy column configuration shown in FIG. 33.

Figure 34:
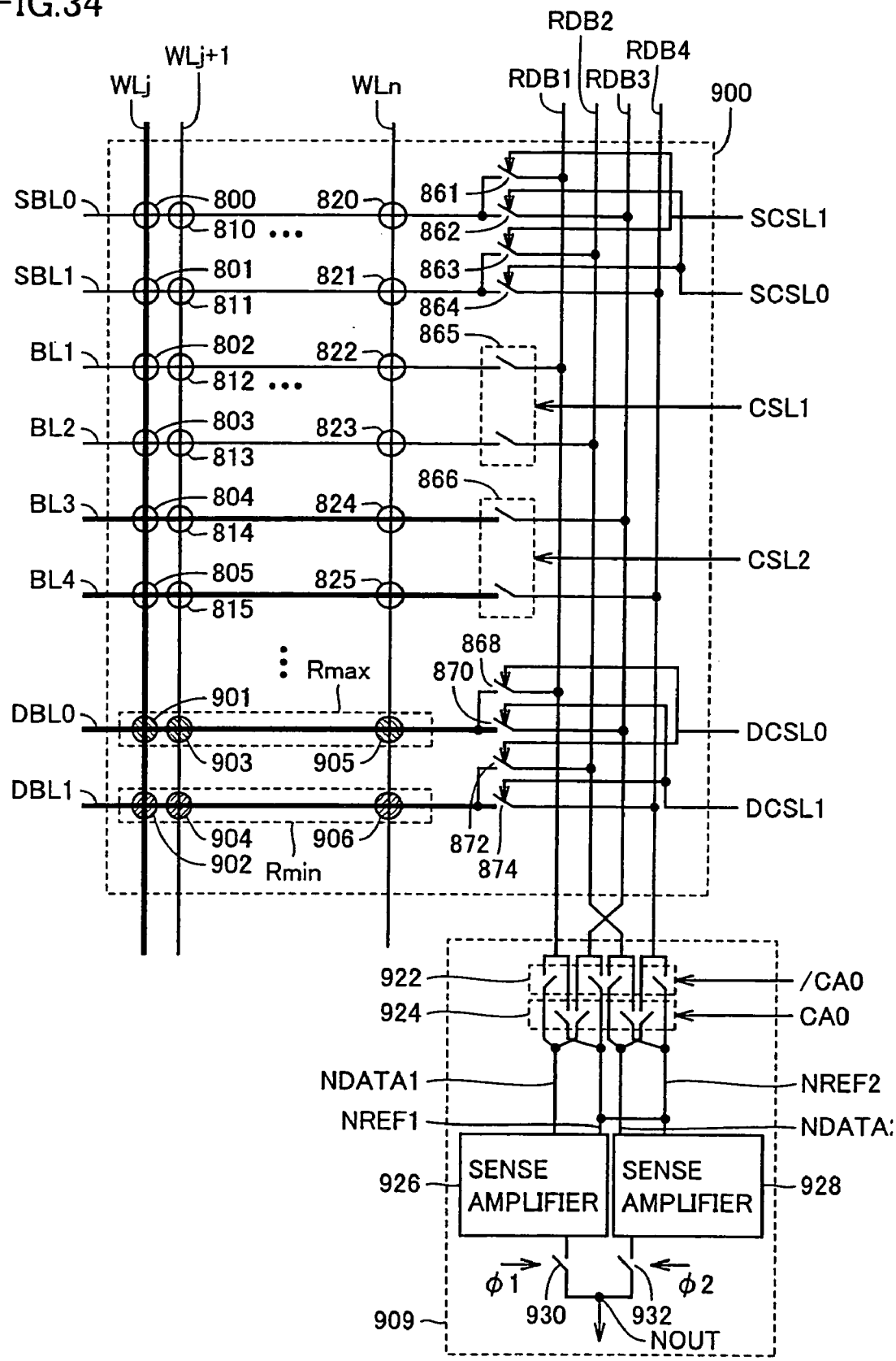
FIG. 34 is a circuit diagram showing an example modification making a dummy cell configuration simple and convenient in a case of a dummy column configuration in which dummy cells are placed along the column direction.

FIG. 34 is a circuit diagram showing an example modification making a dummy column configuration simple and convenient in a case of a dummy column configuration in which dummy cells are placed along the column direction.

Referring to FIG. 34, as compared with the configuration of memory cell array 860 shown in FIG. 33, a memory cell array 900 includes dummy memory cells 901, 903, 905, 902, 904 and 906 instead of dummy cells 806, 816, 826, 807, 817 and 827.

Dummy memory cells 901, 903 and 905 each have a resistance value of Rmax. On the other hand, dummy memory cells 902, 904 and 906 each have a resistance value of Rmin. In the configuration shown in FIG. 34, data of a selected cell or a spare memory cell is transmitted to one of data buses RDB1 and RDB3 and data of a dummy memory cell is transmitted to the other of data buses RDB1 and RDB3.

Likewise data from a memory cell or a spare memory cell is transmitted to one of data buses RDB2 and RDB4 and data from a dummy memory cell is transmitted to the other of data buses RDB2 and RDB4.

Read circuit 909 includes: a connecting circuit 922 connecting data buses RDB1, RDB3, RDB2 and RDB4 to respective nodes NDATA1, NREF1, NDATA2 and NREF2 when signal /CA0 is activated; a connecting circuit 924 connecting data buses RDB1, RDB3, RDB2 and RDB4 to respective nodes NREF1, NDATA1, NREF2 and NDATA2 when signal CA0 is activated; a sense amplifier 926 inputs of which are connected to nodes NDATA1 and NREF1; a sense amplifier 928 inputs of which are connected to nodes NDATA2 and NREF2; a switch 930 transmitting an output of sense amplifier 926 to node NOUT in response to signal $\phi 1$; and a switch 932 transmitting an output of sense amplifier 928 to node NOUT in response to signal $\phi 2$.

By switch circuits 922 and 924, the memory cell connecting side of data buses RDB1 and RDB3 is connected to node NDATA1 and the dummy cell connecting side is connected to node NREF1.

By switch circuits 922 and 924, likewise, a data bus connected to memory cells among data bus RDB2 and RDB4 is connected to node NDATA2, and a data bus connected to dummy cells thereof is connected to node NREF2. Control of connecting circuits 922 and 924 is performed according to a prescribed bit, for example the lowest bit, of a column select address. For example, connecting circuit 922 becomes conductive when the lowest bit CA0 is 0 while connecting circuit 924 becomes conductive when the bit is 1.

Nodes NREF1 and NREF 2 are connected electrically in the interior of read circuit 909. With such a connection, the dummy cell side is placed in a parallel connection state between resistance values Rmax and Rmin and the two resistance values are combined through synthesis to generate a reference level. Data determination is performed in sense amplifiers 926 and 928 by comparing the reference revel with normal cell data or spare cell data. After determination of sense amplifiers ends, selection is performed on one of memory cells on which parallel reading is performed. For example, when an address corresponding to bit line BL3 is inputted, signal $\phi 1$ is activated to select an output from sense amplifier 926. On the other hand, an address corresponding to bit line BL4 is inputted, bit line BL4 is connected to node NDATA2 through data bus RDB4, so signal $\phi 2$ is activated to select an output from sense amplifier 928.

Note that data is written in dummy cells 901 and 902 so that data corresponding to resistance values Rmax and Rmin are paired with each other. Through synthesis therefrom, generation of a reference level is implemented.

It is similar to the case of FIG. 28 to perform a write cycle of data corresponding to resistance value Rmax on a dummy memory cell in a prescribed test mode. Furthermore, with modification of the configuration as shown in FIG. 30 of part of dummy memory cells adopted, it is similar to the case of FIG. 28 to cause the write cycle to be unnecessary.

As described above, in the configuration shown in FIG. 34, a dummy column configuration can also be used to realize a high speed access and to furthermore, facilitate generation of a reference level.

Figure 35:
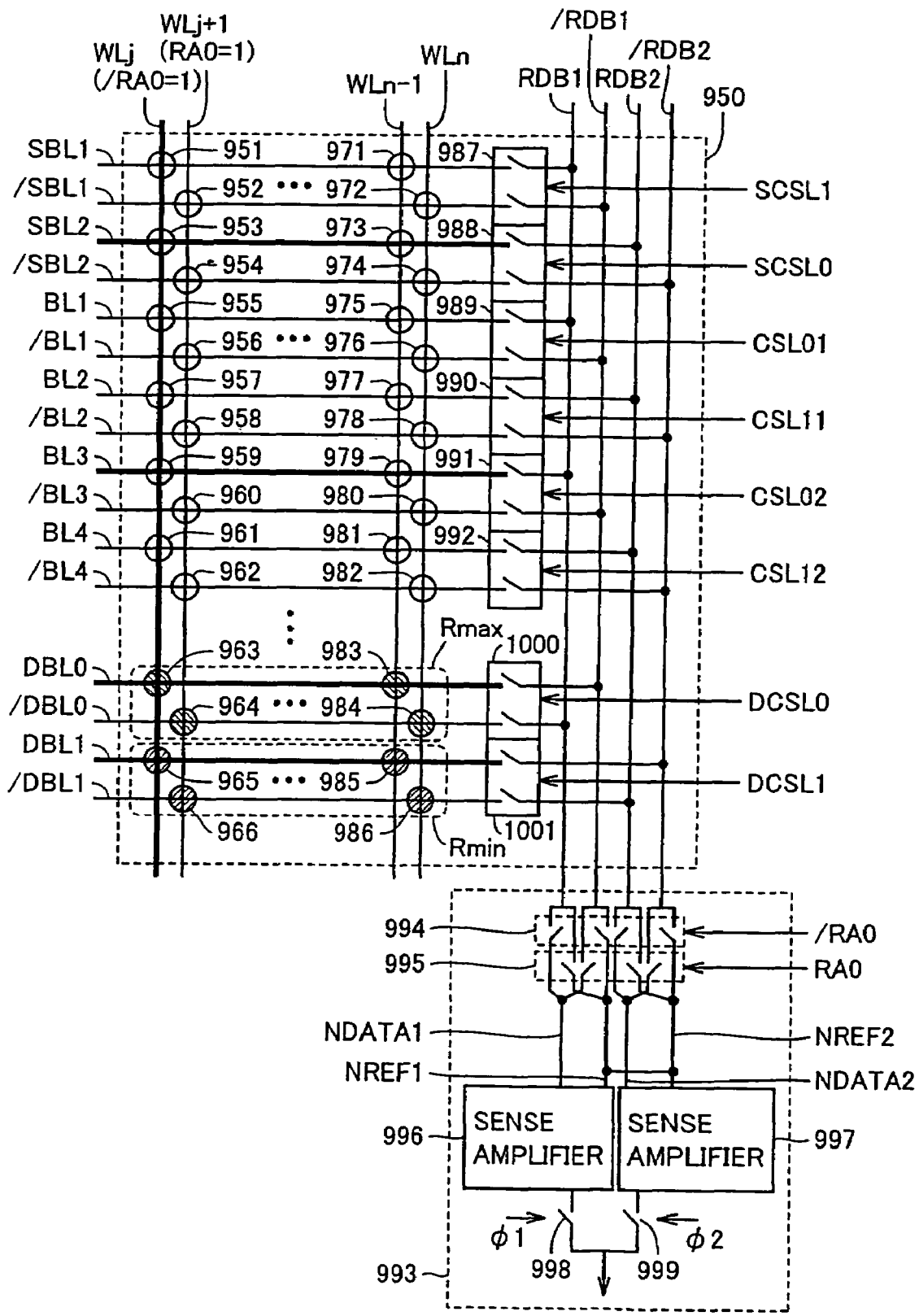
FIG. 35 is a circuit diagram for describing a dummy column configuration in a case where memory cells are placed along a word line at alternate points among a plurality of intersections between bit lines and the word line.
Figure 36:
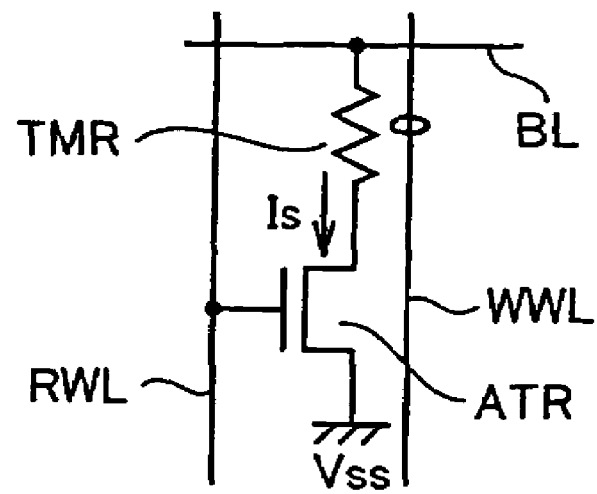
FIG. 36 is a schematic diagram showing a configuration of a memory cell having a prior art magnetic tunnel junction.
Figure 37:
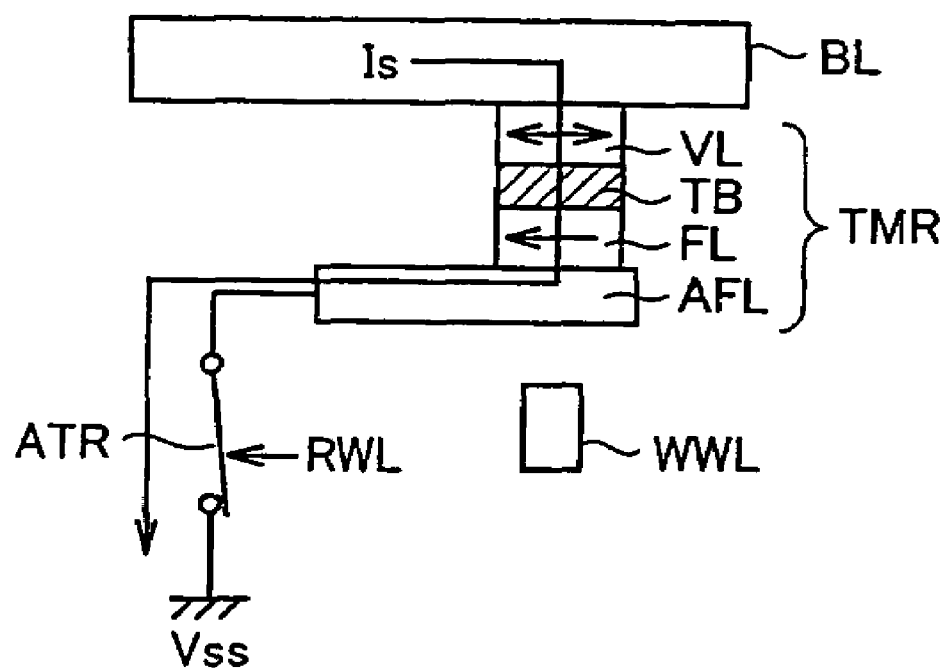
FIG. 37 is a conceptual view describing a data read operation on an MTJ memory cell.
Figure 38:
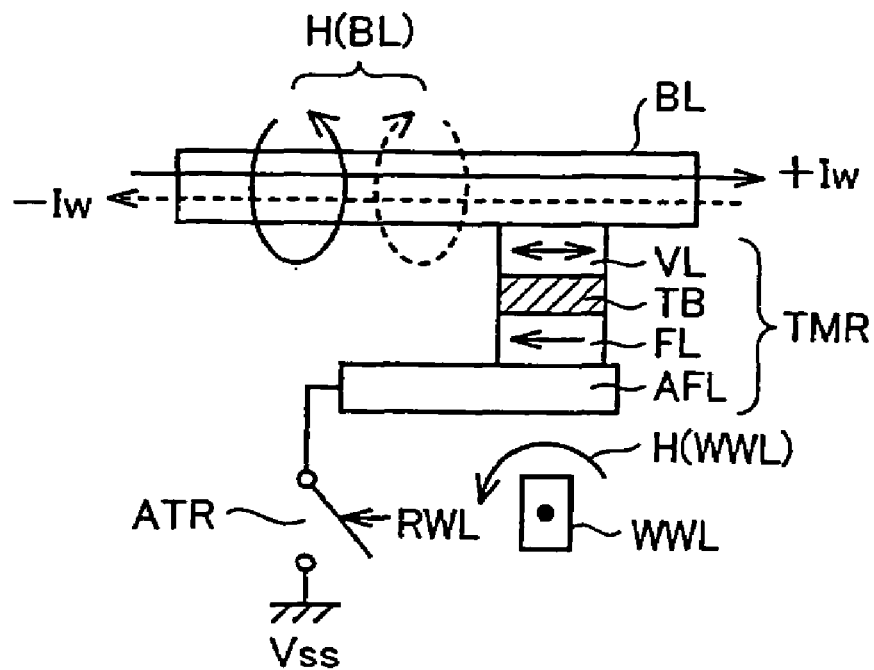
FIG. 38 is a conceptual view describing a data write operation on a MTJ memory cell.
Figure 39:
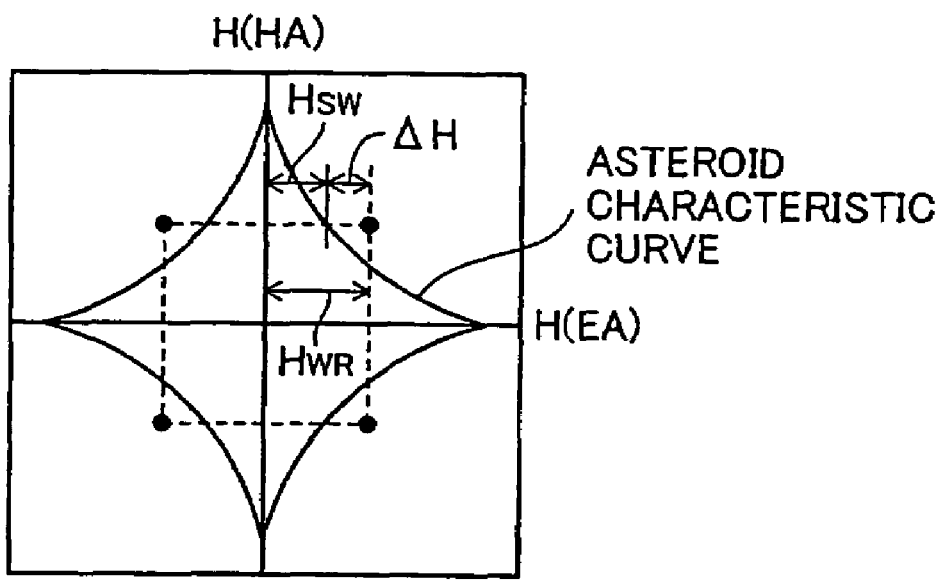
FIG. 39 is a conceptual graph describing a relationship between a data write current in data writing into an MTJ memory cell and a magnetic direction of a tunneling magneto-resistance element.

FIG. 35 is a circuit diagram for describing a dummy column configuration in a case where memory cells are placed along a word line at alternate points among a plurality of intersections between bit lines and the word line.

Referring to FIG. 35, a memory cell array 950 includes: read word lines WLj, WLj+1, ..., WLn−1 and WLn; spare bit lines SBL1, /SBL1, SBL2 and /SBL2 provided intersecting with word lines WLj, WLj+1, ..., WLn−1 and WLn; and bit lines BL1 to BL4 and /BL1 to /BL4, intersecting with word lines WLj, WLj+1, ..., WLn−1 and WLn, and provided in parallel with spare bit lines SBL1 and SBL2.

Memory cell array 950 further includes dummy bit lines DBL0, /DBL0, DBL1 and /DBL1, intersecting with word lines WLj, WLj+1, ..., WLn−1 and WLn, and provided in parallel to bit lines BL1 to BL4 and /BL1 to /BL4.

Memory cell array 950 further includes: spare memory cells 951 to 954 and 971 to 974; normal memory cells 955 to 962 and 975 to 982; and dummy memory cells 963 to 966 and 983 to 986.

Spare memory cells 951 and 953, normal memory cells 955, 957, 959 and 961, and dummy memory cells 963 and 965 are connected to a common word line WLj and further connected to spare bit lines SBL1 and SBL2, bit lines BL1, BL2, BL3 and BL4, and dummy bit lines DBL0 and DBL1, respectively.

Spare memory cells 952 and 954, normal memory cells 956, 958, 960 and 962, and dummy memory cells 964 and 966 are connected to a common word line WLj+1, and further connected to spare bit lines /SBL1 and /SBL2, bit lines /BL1, /BL2, /BL3 and /BL4, and dummy bit lines /DBL0 and /DBL1, respectively.

Spare memory cells 971 and 973, normal memory cells 975, 977, 979 and 971, and dummy memory cells 973 and 975 are connected to a common word line WLn−1, and further connected to spare bit lines SBL1 and SBL2, bit lines BL1, BL2, BL3 and BL4, and dummy bit lines DBL0 and DBL1, respectively.

Spare memory cells 972 and 974, normal memory cells 976, 978, 970 and 972, and dummy memory cells 974 and 976 are connected to a common word line WLn, and further connected to spare bit lines /SBL1 and /SBL2, bit lines /BL1, /BL2, /BL3 and /BL4, and dummy bit lines /DBL0 and /DBL1, respectively.

Dummy memory cells 963 to 966 and 983 to 986 each include magneto-resistance element. In dummy memory cells 963, 964, 983 and 984, data writing is performed on each magneto-resistance element so that a resistance value of a corresponding magneto-resistance element takes Rmax. On the other hand, in dummy memory cells 965. 966, 985 and 986, data writing is performed on each magneto-resistance element so that a resistance value of a corresponding magneto-resistance element takes Rmin.

Memory cell array 950 further includes: read data buses RDB1, /RDB1, RDB2 and /RDB2, and column select gates 987 to 992.

Column select gate 987 connects spare bit lines SBL1 and /SBL1 to respective read data buses RDB1 and /RDB1 in response to select signal SCSL1. Column select gate 988 connects spare bit lines SBL2 and /SBL2 to respective read data buses RDB2 and /RDB2 in response to select signal SCSL0.

Column select gate 989 connects bit lines BL1 and /BL1 to respective read data buses RDB1 and /RDB1 in response to select signal CSL01. Column select gate 990 connects bit lines BL2 and /BL2 to respective read data buses RDB2 and /RDB2 in response to select signal CSL11. Column select gate 991 connects bit lines BL3 and /BL3 to respective read data buses RDB1 and /RDB1 in response to select signal CSL02. Column select gate 992 connects bit lines BL4 and /BL4 to respective read data buses RDB2 and /RDB2 in response to select signal CSL12.

Memory cell array 950 further includes column select gates 1000 and 1001. Column select gate 1000 connects bit lines DBL0 and /DBL0 to respective read data buses /RDB1 and RDB1 in response to select signal DCSL0. Column select gate 1001 connects bit lines DBL1 and /DBL1 to respective read data buses /RDB2 and RDB2 in response to select signal DCSL1.

Read circuit 993 includes: a connecting circuit 994 connecting data buses RDB1, /RDB1, RDB2 and /RDB2 to respective nodes NDATA1, NREF1, NDAT2 and NREF2 when signal /RA0 is activated; a connecting circuit 995 connecting data buses RDB1, /RDB1, RDB2 and /RDB2 to respective nodes NREF1, NDATA1, NREF2 and NDAT2 when signal RA0 is activated; a sense amplifier 996 inputs of which are connected to nodes NDATA1 and NREF1; a sense amplifier 997 inputs of which are connected to nodes NDATA2 and NREF2; a switch 998 transmitting an output of sense amplifier 996 to an output node in response to signal φ1; and a switch 999 transmitting an output of sense amplifier 997 to the output node in response to signal φ2.

By connecting circuits 994 and 995, a data bus, connected to a memory cell which becomes an object for reading corresponding to an address among data bases RDB1 and /RDB1, is connected to node NDATA1, while a data bus connected to a dummy cell is connected to node NREF1. Likewise, a data bus connected to a memory cell which becomes an object for reading among data buses RDB2 and /RDBL2, is connected to node NDATA2, while a data bus connected to a dummy cell is connected to node NREF2. Nodes NREF1 and NREF2 are connected to electrically to each other.

When /RA0=1, word line WLj is activated to select spare memory cells 953 and 959 and simultaneously select dummy memory cells 963 and 965. Data bus RDB1 transmits data in memory cell 959 and data bus /RDB1 transmits data in dummy memory cell 963. Likewise, data bus RDB2 transmits data in spare memory cell 953 and data bus /RDB2 transmits data in dummy memory cell 965. In this case, connecting circuit 994 is placed into a connection state and connection between a data bus and an input node of a sense amplifier is determined.

On the other hand, when RA0=1, word line WLj+1 is activated. When word line WLj+1 is selected, a data bus through which data in a dummy cell is transmitted is interchanged with a data bus used when word line WLj is selected. Accordingly, connecting circuit 995 is placed into a connection state and connection between a data bus and an input node of a sense amplifier is performed. Connection of connecting circuit 994 or 995 is determined according to whether the lowest address bit RA0 is an even number or odd number.

At this time, as described in FIG. 29, resistance values Rmax and Rmin of dummy memory cells are connected in parallel to each other to generate a reference level. There is performed comparison of the reference level with data of memory cell and spare memory cell to thereby perform data determination. After the data determination is over in sense amplifiers 996 and 997, one of signals φ1 and φ2 is activated to thereby finally select data to be outputted.

Signal φ1 is activated when data buses RDB1 and /RDB1 transmit data in a memory cell to be read. Signal φ2 is activated when data buses RDB2 and /RDB2 transmit data in a memory cell to be read.

With the configuration shown in FIG. 35, realization is achieved of a high speed access and a simple, convenient dummy cell configuration in an MRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory device comprising:
   a plurality of normal memory cells including respective electrically conductive magnetic elements;
   a plurality of normal bit lines provided correspondingly to the plurality of columns of said plurality of normal memory cells;
   a plurality of first reference memory cells provided on a column placed in parallel with said plurality of columns of said plurality of normal memory cells;
   a first reference bit line provided correspondingly to said column of said plurality of first reference memory cells;
   a plurality of spare memory cells each used instead of a defective memory cell when said defective memory cell exists in said plurality of normal memory cells;
   a plurality of spare bit lines provided correspondingly to the plurality of columns of said plurality of spare memory cells; and
   a read circuit connected to at least three bit lines including a first bit line of said plurality of normal bit lines to which a memory cell to be read is connected, a second bit line to which a spare memory cell corresponding to said memory cell to be read is connected and said first reference bit line according to said address signal to read data from one of said memory cell to be read and said spare memory cell corresponding to said memory cell to be read.

2. The memory device according to claim 1, further comprising:
   a plurality of second reference memory cells provided on a column placed in parallel to said plurality of columns of said plurality of normal memory cells; and
   a second reference bit line provided correspondingly to said column of said plurality of second reference memory cells, wherein
   each of said plurality of normal memory cells takes a first or second resistance value according to storage data,
   each of said plurality of first reference memory cells takes said first resistance value, and
   each of said plurality of second reference memory cells takes said second resistance value.

3. The memory device according to claim 2, wherein
each of said plurality of normal memory cells takes said first resistance value in an initial state thereof.

4. The memory device according to claim 2, wherein
each of said normal memory cell takes said first resistance value in an initial state thereof, and
each of said plurality of second reference memory cells includes:
an electrically conductive magnetic element taking said first resistance value; and
a fixed resistance taking a resistance value obtained by subtracting said first resistance value from said second resistance value.

5. A memory device which includes an electrically conductive magnetic element in each memory cell thereof, comprising:
a plurality of word lines;
a plurality of bit line pairs intersecting with said plurality of word lines and each including first and second bit lines;
a plurality of memory cells provided correspondingly to only one of said first and second bit lines at each of the plurality of intersections between said plurality of word lines and said plurality of bit line pairs;
a reference bit line pair intersecting with said plurality of word lines and each including first and second reference bit lines;
a plurality of first reference memory cells provided on a column placed in parallel with a plurality of columns of said plurality of memory cells, and provided correspondingly to only one of said first and second reference bit lines at each of the plurality of intersections between said plurality of word lines and said reference bit line pair, each of said first reference memory cells holding a reference value used when data in said plurality of memory cells is read;
a first data line pair including first and second data lines for transmitting data read onto said plurality of bit line pairs; and
a read circuit, when reading data in said plurality of memory cells through one of said first and second data lines from one of first and second bit lines by activation of one of said plurality of word lines, reading a hold value in said first reference memory cell from the other of said first and second data lines.

6. The memory device according to claim 5, further comprising:
a second data line pair, including third and fourth data lines, for reading of data in a second memory cell among said plurality of memory cells, in parallel to reading of data in a first memory cell among said plurality of memory cells performed by said first data line pair when a word line is activated; and
a second reference memory cell for holding a reference value used when data in said plurality of memory cells is read, wherein
said read circuit, when reading data in said second memory cell through one of said third and fourth data lines, reads a hold value in said second reference memory cell from the other of said third and fourth data lines to generate said reference value through synthesis from said hold values in said first and second reference memory.

* * * * *